(12) United States Patent
Matsuzaki

(10) Patent No.: US 9,773,787 B2
(45) Date of Patent: Sep. 26, 2017

(54) SEMICONDUCTOR DEVICE, MEMORY DEVICE, ELECTRONIC DEVICE, OR METHOD FOR DRIVING THE SEMICONDUCTOR DEVICE

(71) Applicant: Semiconductor Energy Laboratory Co., Ltd., Atsugi-shi, Kanagawa-ken (JP)

(72) Inventor: Takanori Matsuzaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/338,610

(22) Filed: Oct. 31, 2016

(65) Prior Publication Data

US 2017/0125420 A1    May 4, 2017

(30) Foreign Application Priority Data

Nov. 3, 2015 (JP) .................................. 2015-216214

(51) Int. Cl.
*G11C 5/06* (2006.01)
*H01L 27/105* (2006.01)
(Continued)

(52) U.S. Cl.
CPC .... *H01L 27/1052* (2013.01); *G06K 19/07749* (2013.01); *G11C 5/063* (2013.01);
(Continued)

(58) Field of Classification Search
CPC . G11C 11/22; G11C 11/5657; G11C 16/0433; G11C 11/403; G11C 11/404;
(Continued)

(56) References Cited

U.S. PATENT DOCUMENTS 4,466,081 A    8/1984 Masuoka
4,902,637 A    2/1990 Kondou et al.
(Continued)

FOREIGN PATENT DOCUMENTS

EP    1737044 A    12/2006
EP    2226847 A    9/2010
(Continued)

OTHER PUBLICATIONS

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

(Continued)

*Primary Examiner* — Thong Q Le
(74) *Attorney, Agent, or Firm* — Fish & Richardson P.C.

(57) ABSTRACT

A semiconductor device with an improved arithmetic processing speed and a decreased circuit size, and its driving method are provided. In the semiconductor device, a first terminal of a first transistor and a gate of a second transistor are electrically connected to a first terminal of a capacitor, and a control circuit is electrically connected to a second terminal of the capacitor. The control circuit supplies a first potential to the second terminal of the capacitor, in other words, adds a value corresponding to the first potential to the value of first data previously retained in the gate of the second transistor in order to obtain second data. In the second transistor, the second data, specifically, a third potential commensurate with the potential of the gate will be output from a second terminal when a second potential is supplied to a first terminal.

22 Claims, 36 Drawing Sheets

(51) Int. Cl.

| | | |
|---|---|---|
| H01L 27/12 | (2006.01) | |
| H01L 29/786 | (2006.01) | |
| H01L 21/78 | (2006.01) | |
| H01L 21/48 | (2006.01) | |
| H01L 23/00 | (2006.01) | |
| H01L 21/56 | (2006.01) | |
| H01L 23/544 | (2006.01) | |
| H01L 21/66 | (2006.01) | |
| H01L 23/495 | (2006.01) | |
| H01L 23/31 | (2006.01) | |
| G11C 5/10 | (2006.01) | |
| G11C 11/419 | (2006.01) | |
| G06K 19/077 | (2006.01) | |

(52) U.S. Cl.
CPC ............. *G11C 5/10* (2013.01); *G11C 11/419* (2013.01); *H01L 21/4825* (2013.01); *H01L 21/565* (2013.01); *H01L 21/78* (2013.01); *H01L 22/14* (2013.01); *H01L 23/3114* (2013.01); *H01L 23/4952* (2013.01); *H01L 23/49555* (2013.01); *H01L 23/544* (2013.01); *H01L 24/45* (2013.01); *H01L 24/48* (2013.01); *H01L 27/124* (2013.01); *H01L 27/127* (2013.01); *H01L 27/1225* (2013.01); *H01L 27/1255* (2013.01); *H01L 29/7869* (2013.01); *H01L 29/78606* (2013.01); *H01L 29/78648* (2013.01); *H01L 29/78651* (2013.01); *H01L 29/78696* (2013.01); *H01L 2223/54486* (2013.01); *H01L 2224/45139* (2013.01); *H01L 2224/45144* (2013.01); *H01L 2224/48245* (2013.01); *H01L 2224/48453* (2013.01); *H01L 2224/48458* (2013.01)

(58) Field of Classification Search
CPC ... G11C 16/0483; G11C 16/26; G11C 11/401; G11C 11/406; G11C 11/4091; G11C 11/4099; G11C 16/344; G11C 5/10; G11C 16/0408; G11C 16/0425; G11C 16/10
USPC ....... 365/149, 145, 185.17, 230.06, 72, 194, 365/200, 208, 210.1, 117, 185.08, 185.18, 365/185.19, 187, 189.05, 189.07, 189.09
See application file for complete search history.

(56) References Cited

U.S. PATENT DOCUMENTS

| | | |
|---|---|---|
| 5,112,765 A | 5/1992 | Cederbaum et al. |
| 5,349,366 A | 9/1994 | Yamazaki et al. |
| 5,366,922 A | 11/1994 | Aoki et al. |
| 5,731,856 A | 3/1998 | Kim et al. |
| 5,744,864 A | 4/1998 | Cillessen et al. |
| 5,796,650 A | 8/1998 | Wik et al. |
| 5,812,231 A | 9/1998 | Kochi et al. |
| 5,851,866 A | 12/1998 | Son |
| 5,936,881 A | 8/1999 | Kawashima et al. |
| 6,127,702 A | 10/2000 | Yamazaki et al. |
| 6,266,269 B1 | 7/2001 | Karp et al. |
| 6,294,274 B1 | 9/2001 | Kawazoe et al. |
| 6,314,017 B1 | 11/2001 | Emori et al. |
| 6,445,026 B1 | 9/2002 | Kubota et al. |
| 6,515,511 B2 | 2/2003 | Sugibayashi et al. |
| 6,563,174 B2 | 5/2003 | Kawasaki et al. |
| 6,625,057 B2 | 9/2003 | Iwata |
| 6,628,551 B2 | 9/2003 | Jain |
| 6,717,180 B2 | 4/2004 | Yamazaki et al. |
| 6,727,522 B1 | 4/2004 | Kawasaki et al. |
| 6,808,971 B2 | 10/2004 | Bhattacharyya |
| 6,933,201 B2 | 8/2005 | Tominari et al. |
| 6,946,354 B2 | 9/2005 | Sakaguchi |
| 6,989,569 B1 | 1/2006 | Hiramoto et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,468,901 B2 | 12/2008 | Kameshiro et al. |
| 7,483,013 B2 | 1/2009 | Osame |
| 7,501,293 B2 | 3/2009 | Ito et al. |
| 7,598,520 B2 | 10/2009 | Hirao et al. |
| 7,601,984 B2 | 10/2009 | Sano et al. |
| 7,674,650 B2 | 3/2010 | Akimoto et al. |
| 7,687,331 B2 | 3/2010 | Kim et al. |
| 7,732,819 B2 | 6/2010 | Akimoto et al. |
| 7,741,644 B2 | 6/2010 | Lyu et al. |
| 7,791,074 B2 | 9/2010 | Iwasaki |
| 7,863,611 B2 | 1/2011 | Abe et al. |
| 7,935,582 B2 | 5/2011 | Iwasaki |
| 7,956,361 B2 | 6/2011 | Iwasaki |
| 7,994,500 B2 | 8/2011 | Kim et al. |
| 8,058,645 B2 | 11/2011 | Jeong et al. |
| 8,084,331 B2 | 12/2011 | Ofuji et al. |
| 8,134,156 B2 | 3/2012 | Akimoto |
| 8,143,115 B2 | 3/2012 | Omura et al. |
| 8,148,779 B2 | 4/2012 | Jeong et al. |
| 8,154,024 B2 | 4/2012 | Iwasaki |
| 8,188,480 B2 | 5/2012 | Itai |
| 8,202,365 B2 | 6/2012 | Umeda et al. |
| 8,203,143 B2 | 6/2012 | Imai |
| 8,212,248 B2 | 7/2012 | Itagaki et al. |
| 8,217,435 B2 | 7/2012 | Chang et al. |
| 8,253,138 B2 | 8/2012 | Yamazaki et al. |
| 8,339,828 B2 | 12/2012 | Yamazaki et al. |
| 8,378,341 B2 | 2/2013 | Hayashi et al. |
| 8,389,417 B2 | 3/2013 | Yamazaki et al. |
| 8,400,817 B2 | 3/2013 | Yamazaki et al. |
| 8,450,783 B2 | 5/2013 | Yamazaki et al. |
| 8,455,868 B2 | 6/2013 | Yamazaki et al. |
| 8,482,001 B2 | 7/2013 | Yamazaki et al. |
| 8,502,217 B2 | 8/2013 | Sato et al. |
| 8,559,220 B2 | 10/2013 | Yamazaki et al. |
| 8,614,916 B2 | 12/2013 | Nagatsuka et al. |
| 8,742,412 B2 | 6/2014 | Goyal et al. |
| 9,240,244 B2 | 1/2016 | Nagatsuka et al. |
| 2001/0015450 A1 | 8/2001 | Sugibayashi et al. |
| 2001/0046027 A1 | 11/2001 | Tai et al. |
| 2002/0056838 A1 | 5/2002 | Ogawa |
| 2002/0096702 A1 | 7/2002 | Ishii et al. |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0237786 A1 | 10/2005 | Atwood et al. |
| 2006/0035452 A1 | 2/2006 | Carcia et al. |
| 2006/0043377 A1 | 3/2006 | Hoffman et al. |
| 2006/0079034 A1 | 4/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |

(56) References Cited

U.S. PATENT DOCUMENTS

| | | |
|---|---|---|
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0262483 A1 | 11/2006 | Osame |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0063287 A1 | 3/2007 | Sano et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0149984 A1 | 6/2008 | Chang et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296567 A1 | 12/2008 | Irving et al. |
| 2008/0296568 A1 | 12/2008 | Ryu et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0114918 A1 | 5/2009 | Wang et al. |
| 2009/0134399 A1 | 5/2009 | Sakakura et al. |
| 2009/0142888 A1 | 6/2009 | Tsuchiya |
| 2009/0152506 A1 | 6/2009 | Umeda et al. |
| 2009/0152541 A1 | 6/2009 | Maekawa et al. |
| 2009/0189153 A1 | 7/2009 | Iwasaki et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2010/0203673 A1 | 8/2010 | Hayashi et al. |
| 2010/0295042 A1 | 11/2010 | Yano et al. |
| 2010/0320458 A1 | 12/2010 | Umeda et al. |
| 2010/0320459 A1 | 12/2010 | Umeda et al. |
| 2011/0089417 A1 | 4/2011 | Yamazaki et al. |
| 2011/0089419 A1 | 4/2011 | Yamazaki et al. |
| 2011/0101332 A1 | 5/2011 | Yamazaki et al. |
| 2011/0101334 A1 | 5/2011 | Yamazaki et al. |
| 2011/0101339 A1 | 5/2011 | Yamazaki et al. |
| 2011/0101351 A1 | 5/2011 | Yamazaki |
| 2011/0110145 A1 | 5/2011 | Yamazaki et al. |
| 2011/0122673 A1 | 5/2011 | Kamata et al. |
| 2011/0134683 A1 | 6/2011 | Yamazaki et al. |
| 2011/0215328 A1 | 9/2011 | Morosawa et al. |
| 2012/0119205 A1 | 5/2012 | Taniguchi et al. |
| 2012/0161220 A1 | 6/2012 | Yamazaki |
| 2012/0168750 A1 | 7/2012 | Hayashi et al. |
| 2013/0194858 A1* | 8/2013 | Yamazaki ............. G11C 11/404 365/149 |
| 2016/0172410 A1 | 6/2016 | Kurokawa |

FOREIGN PATENT DOCUMENTS

| | | |
|---|---|---|
| JP | 47-016085 A | 8/1972 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-268184 A | 11/1988 |
| JP | 05-251705 A | 9/1993 |
| JP | 05-282881 A | 10/1993 |
| JP | 08-264794 A | 10/1996 |
| JP | 11-505377 | 5/1999 |
| JP | 11-233789 A | 8/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2003-101407 A | 4/2003 |
| JP | 2004-103957 A | 4/2004 |
| JP | 2004-273614 A | 9/2004 |
| JP | 2004-273732 A | 9/2004 |
| JP | 2007-122758 A | 5/2007 |
| JP | 2008-277665 A | 11/2008 |
| JP | 2009-135350 A | 6/2009 |
| JP | 2009-198990 A | 9/2009 |
| JP | 2010-177431 A | 8/2010 |
| JP | 2012-160679 A | 8/2012 |
| JP | 2012-256400 A | 12/2012 |
| JP | 2014-199707 A | 10/2014 |
| KR | 2008-0052107 A | 6/2008 |
| WO | WO-2004/114391 | 12/2004 |

OTHER PUBLICATIONS

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Kim.M et al., "High mobility bottom gate InGaZnO thin film transistors with SiOx etch stopper", Appl. Phys. Lett. (Applied Physics Letters), May 24, 2007, vol. 90, No. 21, pp. 212114-1-212114-3.

Nakayama.M et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Kameshiro.N et al., "A Fully Logic-Process-Compatible, 3-Transistor, SESO-memory Cell Featuring 0.1-FIT/Mb Soft Error, 100-MHz Random Cycle, and 100-ms Retention", 2008 Symposium on VLSI Circuits Digest of Technical Papers, Aug. 1, 2008, pp. 122-123.

Aslam-Siddiqi.A et al., "A 16×16 Nonvolatile Programmable Analog Vector-Matrix Multiplier", IEEE Journal of Solid-State Circuits, Oct. 1, 1998, vol. 33, No. 10, pp. 1502-1509.

(56) References Cited

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

(56) References Cited

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs Wth a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

FIG. 28A  out-of-plane method CAAC-OS
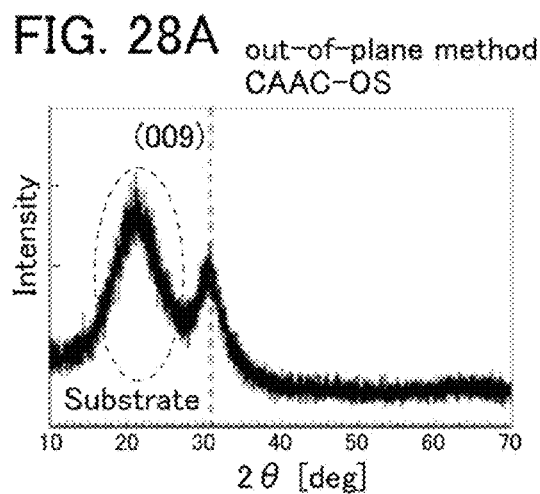
FIG. 28B  in-plane method φ scan CAAC-OS
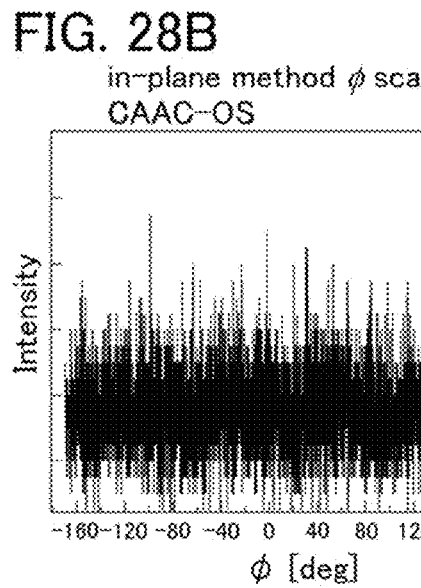
FIG. 28C  in-plane method φ scan single crystal OS
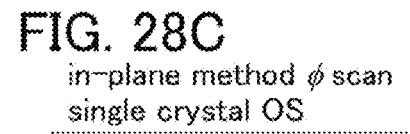
FIG. 28D
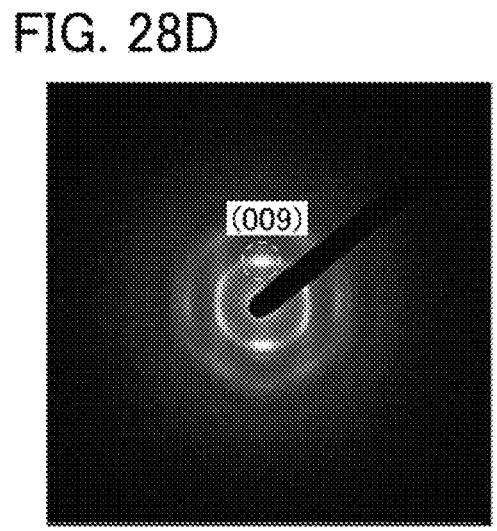
FIG. 28E
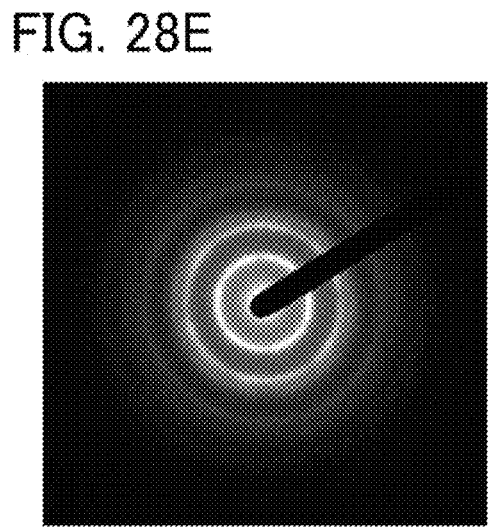

FIG. 35A
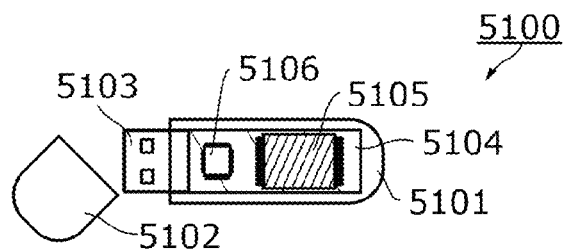
FIG. 35B
FIG. 35C
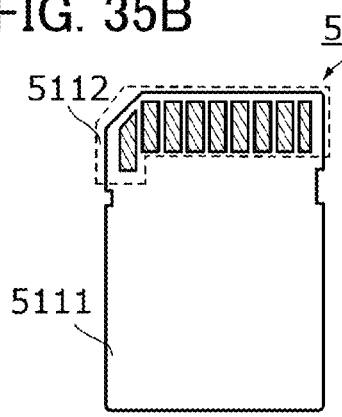
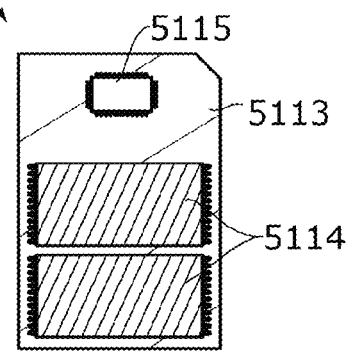
FIG. 35D
FIG. 35E
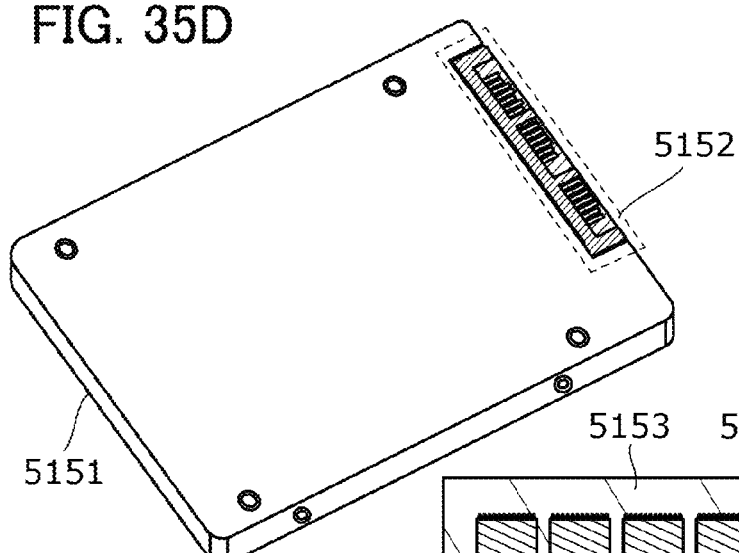
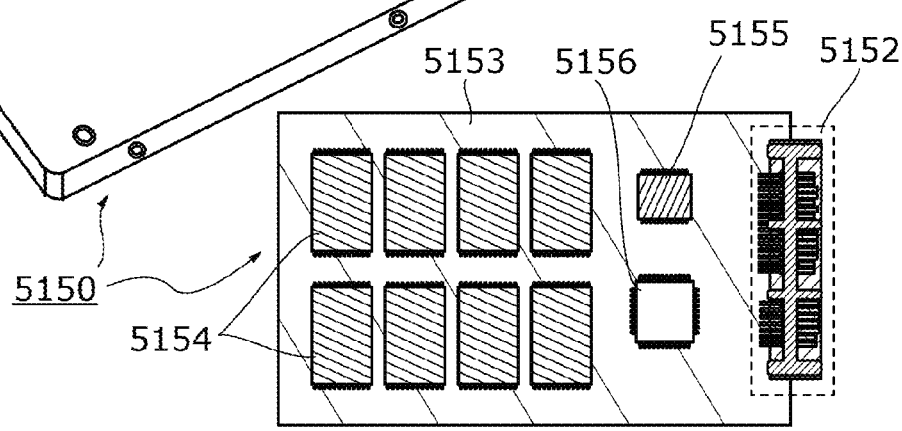

4000

4000

4000

4000

4000

4000

SEMICONDUCTOR DEVICE, MEMORY DEVICE, ELECTRONIC DEVICE, OR METHOD FOR DRIVING THE SEMICONDUCTOR DEVICE

BACKGROUND OF THE INVENTION

1. Field of the Invention

One embodiment of the present invention relates to a semiconductor device, a memory device, an electronic device, or a driving method of the semiconductor device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

2. Description of the Related Art

In recent years, electronic components such as central processing units (CPUs), memory devices, and sensors have been used in various electronic devices such as personal computers, smart phones, and digital cameras. The electronic components have been improved to achieve miniaturization, lower power consumption, and other various objectives.

In particular, a recent increase in the amount of data manipulated requires a memory device having large storage capacity. Patent Documents 1 and 2 each disclose a semiconductor device allowing writing and reading of multi-level data.

With a reduction in the size of electronic devices, electronic components in the electronic devices need to be miniaturized. Specifically, a small size and an increased capacity are both required for a memory device.

REFERENCE

Patent Document

[Patent Document 1] Japanese Published Patent Application No. 2012-256400
[Patent Document 2] Japanese Published Patent Application No. 2014-199707

SUMMARY OF THE INVENTION

When data is written to a memory cell capable of storing multi-level or analog data, the data to be written is converted into a potential with a predetermined level, and the potential is retained in a retention node included in the memory cell. When the data is read out from the memory cell, the potential of the retention node is output to a bit line or a source line and converted into binary data suitable for digital processing (such data is also referred to as digital data) or the like by a reading circuit, whereby the retained data can be output.

In the above manner, when writing or reading is performed, data retained in the memory cell capable of handling multi-level or analog data needs to be subjected to processing for converting digital data into a potential corresponding to multi-level or analog data or processing for converting a potential corresponding to multi-level or analog data into digital data.

In the case where the data retained in the memory cell capable of retaining multi-level or analog data is subjected to addition or subtraction processing, in general, the retained potential is read out from the memory cell and converted into digital data by a reading circuit, and then the digital data is subjected to addition or subtraction processing.

To execute addition or subtraction processing, the data retained in the memory cell needs to be converted into a digital value; therefore, it takes time to execute addition or subtraction processing after reading. In addition, it is necessary to separately provide a functional block for executing addition or subtraction processing, which may increase the circuit size.

An object of one embodiment of the present invention is to provide a novel semiconductor device. Another object of one embodiment of the present invention is to provide a memory device including the novel semiconductor device. Another object of one embodiment of the present invention is to provide an electronic device using the memory device including the novel semiconductor device. Another object of one embodiment of the present invention is to provide a system with the memory device including the novel semiconductor device. Another object of one embodiment of the present invention is to provide a novel driving method of a semiconductor device.

Another object of one embodiment of the present invention is to provide a memory device with large data storage capacity. Another object of one embodiment of the present invention is to provide a miniaturized memory device. Another object of one embodiment of the present invention is to provide a memory device with a decreased circuit size. Another object of one embodiment of the present invention is to provide a memory device capable of maintaining stored data without any change. Another object of one embodiment of the present invention is to provide a memory device with low power consumption or a driving method of the memory device. Another object of one embodiment of the present invention is to provide a memory device in which a time needed for a reading operation and addition or subtraction processing is short, or a driving method of the memory device.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention achieves at least one of the above objects and the other objects. One embodiment of the present invention does not necessarily achieve all the above objects and the other objects.

(1) One embodiment of the present invention is a driving method of a semiconductor device, which includes a first step and a second step. The semiconductor device includes a first transistor, a second transistor, a capacitor, and a control circuit. A first terminal of the first transistor is electrically connected to a first terminal of the capacitor. A gate of the second transistor is electrically connected to the first terminal of the capacitor. The control circuit is electrically connected to a second terminal of the capacitor. First data of m bits is retained in the gate of the second transistor (m is an integer of 1 or more). The first data has a value of i (i is an integer of 0 to $2^m-2$). In the first step, the control circuit supplies a first potential to the second terminal of the capacitor, and a value of j that corresponds to the first potential is added to the value of the first data, so that the first data is changed to second data (j is an integer of 1 to $2^m-1-i$). In the second step, a second potential is supplied to a first terminal of the second transistor, so that a third potential corresponding to the potential of the gate of the second transistor that is the second data is output from the second terminal of the second transistor.

(2) Another embodiment of the present invention is a driving method of a semiconductor device, which includes a first step and a second step. The semiconductor device includes a first transistor, a second transistor, a capacitor, and a control circuit. A first terminal of the first transistor is electrically connected to a first terminal of the capacitor. A gate of the second transistor is electrically connected to the first terminal of the capacitor. The control circuit is electrically connected to a second terminal of the capacitor. First data of m bits is retained in the gate of the second transistor (m is an integer of 1 or more). The first data has a value of i (i is an integer of 1 to $2^m-1$). In the first step, the control circuit supplies a first potential to the second terminal of the capacitor, and a value of j that corresponds to the first potential is subtracted from the value of the first data, so that the first data is changed to second data (j is an integer of 1 to i). In the second step, a second potential is supplied to a first terminal of the second transistor, so that a third potential corresponding to the potential of the gate of the second transistor that is the second data is output from the second terminal of the second transistor.

(3) Another embodiment of the present invention is the driving method described in (1) or (2), in which the third potential is equal to the potential of the gate of the second transistor in the second step.

(4) Another embodiment of the present invention is a semiconductor device, in which the driving method described in any one of (1) to (3) is used, a channel formation region of the first transistor includes an oxide semiconductor, and a channel formation region of the second transistor includes silicon.

(5) Another embodiment of the present invention is a semiconductor device, in which the driving method described in any one of (1) to (3) is used, a channel formation region of the first transistor includes an oxide semiconductor, and a channel formation region of the second transistor includes an oxide semiconductor.

(6) Another embodiment of the present invention is a memory device including the semiconductor device using the driving method described in any one of (1) to (3), the semiconductor device described in (4), or the semiconductor device described in (5); and a driver circuit.

(7) Another embodiment of the present invention is an electronic device including the memory device described in (6) and a housing.

According to one embodiment of the present invention, a novel semiconductor device can be provided. According to one embodiment of the present invention, a memory device including the novel semiconductor device can be provided. According to one embodiment of the present invention, an electronic device using the memory device including the novel semiconductor device can be provided. According to one embodiment of the present invention, a system with the memory device including the novel semiconductor device can be provided. According to one embodiment of the present invention, a novel driving method of a semiconductor device can be provided.

According to one embodiment of the present invention, a memory device with large data storage capacity can be provided. According to one embodiment of the present invention, a miniaturized memory device can be provided. According to one embodiment of the present invention, a memory device with a decreased circuit size can be provided. According to one embodiment of the present invention, a memory device capable of maintaining stored data without any change can be provided. According to one embodiment of the present invention, a memory device with low power consumption or a driving method of the memory device can be provided. According to one embodiment of the present invention, a memory device in which a time needed for a reading operation and addition or subtraction processing is short, or a driving method of the memory device can be provided.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF THE DRAWINGS

FIGS. 28A to 28E show structural analysis of a CAAC-OS and a single crystal oxide semiconductor by XRD and selected-area electron diffraction patterns of a CAAC-OS.

FIGS. 35A to 35E illustrate electronic devices.

DETAILED DESCRIPTION OF THE INVENTION

An "electronic device", an "electronic component", a "module", and a "semiconductor device" are described. In general, an "electronic device" may refer to as a personal computer, a mobile phone, a tablet terminal, an e-book reader, a wearable terminal, an audiovisual (AV) device, an electronic appliance, a household appliance, an industrial appliance, a digital signage, a car, or an electric appliance including a system, for example. An "electronic component" or a "module" may refer to a processor, a memory device, a sensor, a battery, a display device, a light-emitting device, an interface device, a radio frequency (RF) tag, a receiver, or a transmitter included in an electronic device. A "semiconductor device" may refer to a device including a semiconductor element or a driver circuit, a control circuit, a logic circuit, a signal generation circuit, a signal conversion circuit, a potential level converter circuit, a voltage source, a current source, a switching circuit, an amplifier circuit, a memory circuit, a memory cell, a display circuit, a display pixel, or the like which includes a semiconductor element and is included in an electronic component or a module.

In this specification, an oxide semiconductor is referred to as an OS in some cases. Thus, a transistor in which the channel formation region includes an oxide semiconductor is referred to as an OS transistor in some cases.

Embodiment 1

In this embodiment, an example of a semiconductor device of the disclosed invention is described.

Configuration Example

Figure 1:
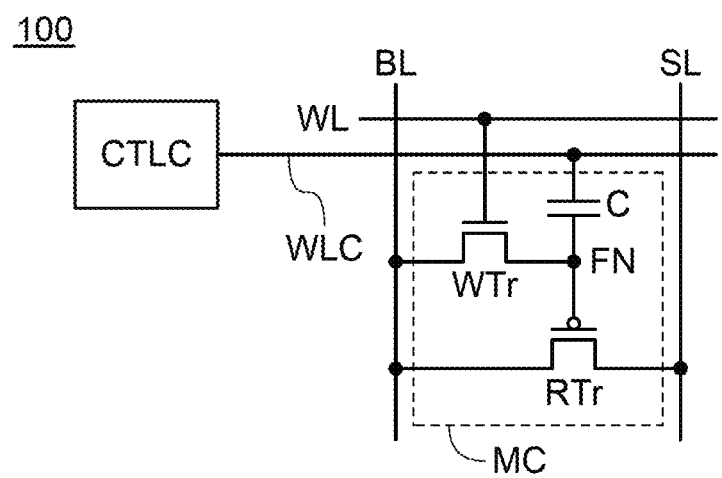
FIG. 1 is a block diagram showing an example of a semiconductor device.

FIG. 1 shows an example of a semiconductor device of one embodiment of the present invention. A semiconductor device 100 includes a memory cell MC and a control circuit CTLC. The memory cell MC includes a transistor WTr, a transistor RTr, and a capacitor C. Note that the transistor WTr is an n-channel transistor, and the transistor RTr is a p-channel transistor.

The memory cell MC is electrically connected to a wiring BL, a wiring SL, a wiring WL, and a wiring WLC.

A first terminal of the transistor WTr is electrically connected to a first terminal of the capacitor C and a gate of the transistor RTr via a retention node FN. A second terminal of the transistor WTr is electrically connected to the wiring BL, and a gate of the transistor WTr is electrically connected to the wiring WL. A first terminal of the transistor RTr is electrically connected to the wiring BL, and a second terminal of the transistor RTr is electrically connected to the wiring SL. A second terminal of the capacitor is electrically connected to the wiring WLC.

The control circuit CTLC is electrically connected to the wiring WLC.

The wiring BL functions as a bit line. When data is written to the memory cell MC, a potential is input from the wiring BL to the second terminal of the transistor WTr. When data is read out from the memory cell MC, a potential is output from the first terminal of the transistor RTr to the wiring BL. The wiring SL functions as a source line. When data is read out from the memory cell MC, a potential is input from the wiring SL to the second terminal of the transistor RTr. The wiring WL functions as a word line. When data is written to the memory cell MC, a potential is input from the wiring WL to the gate of the transistor WTr. The wiring WLC functions as a wiring for applying an appropriate potential to the second terminal of the capacitor C.

Figure 3:
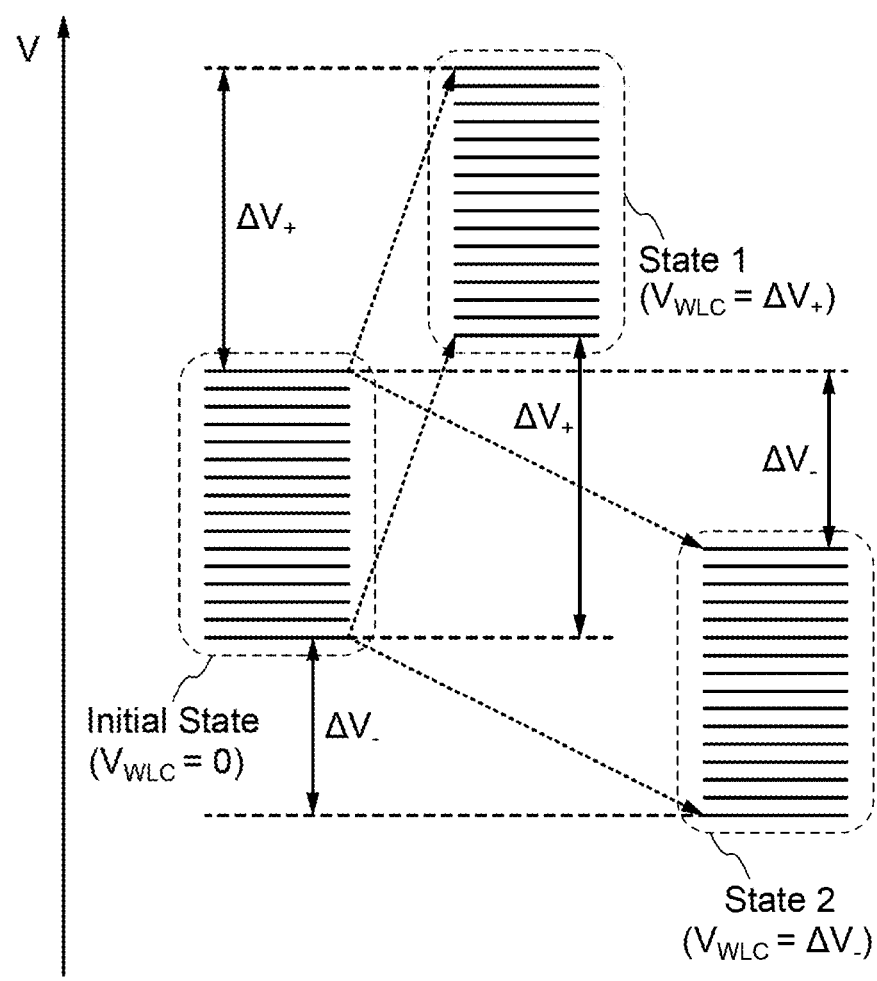
FIG. 3 shows change in the potential of a retention node of a semiconductor device.

Here, the role of the control circuit CTLC is described using FIG. 3.

The control circuit CTLC has a function of applying a voltage to the second terminal of the capacitor C via the wiring WLC. Here, when the retention node FN is in a floating state, the potential of the retention node FN changes in response to change in the potential of the second terminal of the capacitor C owing to capacitive coupling of the capacitor C. The amount of change in the potential of the retention node FN is determined by a capacitive coupling coefficient of the memory cell MC. The capacitive coupling coefficient is a determined by the amount of change in the potential of the second terminal of the capacitor C, the structure of the capacitor C, the gate capacitance of the transistor WTr, the gate capacitance of the transistor RTr, or wirings, elements, and the like provided in the vicinity of the retention node FN. In the description of the specification, influences by the structure of the capacitor C, the gate capacitance of the transistor WTr, the gate capacitance of the transistor RTr, and the wirings and elements in the vicinity of the retention node FN are not considered, and the amount of change in the potential of the retention node FN is substantially equal to the amount of change in the potential of the second terminal of the capacitor C. In other words, the capacitive coupling coefficient is 1 in the following description of this specification.

FIG. 3 shows a relationship between the potential of the retention node FN and a voltage $V_{WLC}$ which is applied to the second terminal of the capacitor C by the control circuit CTLC.

Note that in the description of the role of the control circuit, the semiconductor device 100 is capable of retaining 4-bit data. That is, any one of 16 levels of potentials of "0000" to "1111" (expressed by binary notation) can be retained in the retention node FN.

"Initial State" denotes an initial state in which a potential is retained in the retention node, and a potential corresponding any one of "0000" to "1111" is retained in the memory cell MC. In addition, the control circuit CTLC applies a potential of 0 V to the second terminal of the capacitor C, which is represented as $V_{WLC}=0$ in FIG. 3.

Here, the control circuit CTLC applies a voltage $V_{WLC}=\Delta V_+$ ($\Delta V_+$ is a positive voltage value) to the second terminal of the capacitor C. At that time, the potential of the retention node FN increases by $\Delta V_+$ owing to the capacitive coupling of the capacitor C. This state is represented as "State 1" in FIG. 3.

When the control circuit CTLC applies a voltage $V_{WLC}=\Delta V_-$ ($\Delta V_-$ is a negative voltage value) to the second terminal of the capacitor C in Initial State, the potential of the retention node FN decreases by $\Delta V_-$ owing to the capacitive coupling of the capacitor C. This state is represented as "State 2" in FIG. 3.

In other words, the control circuit CTLC applies a given voltage to the second terminal of the capacitor C, whereby the potential retained in the retention node FN can increase or decrease by the given voltage. In this manner, addition or subtraction of data (a value) retained in the retention node FN can be executed.

Next, reading out of data retained in the retention node is described.

When a potential is input to one of the first terminal and the second terminal of the transistor RTr, a potential which is output from the other of the first terminal and the second terminal of the transistor RTr is determined by the potential of the retention node FN that is input to the gate of the transistor RTr. The potential output from the other of the first terminal and the second terminal of the transistor RTr is also determined by the channel width, channel length, structure, threshold voltage, and the like of the transistor RTr, in addition to the potential of the retention node FN. That is, the channel width, channel length, structure, and the like of the transistor RTr are configured appropriately, or the threshold voltage of the transistor RTr is set to an appropriate value, whereby the absolute value of the potential output from the other of the first terminal and the second terminal of the transistor RTr can be substantially equal to the absolute value of the potential of the retention node FN.

Note that in the case where the transistor RTr is a p-channel transistor, when a constant current flows between the source and the drain of the transistor RTr, the source-drain voltage is increased as the gate voltage becomes lower. In that case, the size, structure, or the like of the transistor RTr is designed so that a reference voltage is 0 V and an inverted potential of the potential retained in the retention node FN is substantially equal to the potential output from the other of the first terminal and the second terminal of the transistor RTr.

In this manner, the potential that is output from the other of the first terminal and the second terminal of the transistor RTr is adjusted by appropriately configuring the channel width, channel length, structure, and the like of the transistor RTr or setting the threshold voltage of the transistor RTr to an appropriate value. Then, the potential is input to an AD converter as it is; as a result, the data retained in the retention node FN can be read out without using a circuit for converting a potential, such as a level shifter.

Accordingly, circuits which are needed for reading out of a potential can be reduced, thereby reducing the circuit size of the memory device. Therefore, the miniaturized memory device can be obtained.

A transistor in which the channel formation region includes an oxide semiconductor (OS transistor) is preferably used as the transistor WTr. The OS transistor has a feature of an extremely low off-state current. Therefore, using the OS transistor in the semiconductor device enables long-term retention of the potential in the retention node FN. Accordingly, refresh is not needed for the potential of the retention node FN, leading to reduction in the power consumption of the semiconductor device 100.

The retention node FN included in the memory cell MC of the semiconductor device 100 can retain any one of the states of three or more different amounts of charge. In other words, the memory cell MC is a multi-level cell (MLC) which can hold any one of three or more different states (also referred to multi-levels in some cases). For example, when the retention node of the memory cell MC can retain any one of the states of four different amounts of charge, the memory cell MC is regarded as being capable of storing four values (2 bits), and in that case, four pieces of data, i.e., "00", "01", "10", and "11" expressed by the binary notation can be handled.

Figure 2A:
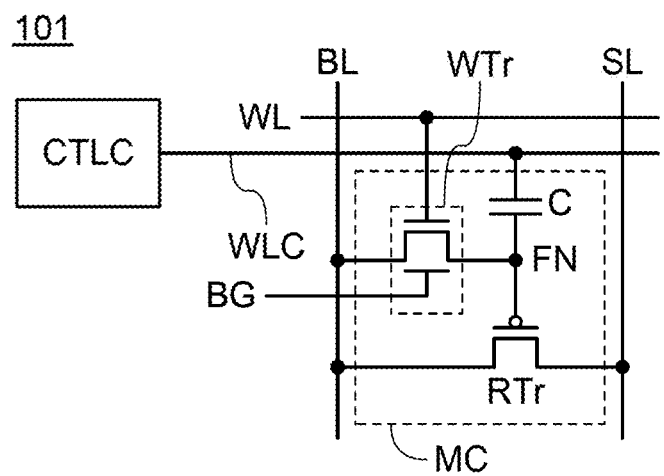
FIGS. 2A and 2B are block diagrams each showing an example of a semiconductor device.

Note that one embodiment of the present invention is not limited to the configuration of the semiconductor device 100 illustrated in FIG. 1. Any one of the configurations of semiconductor devices illustrated in FIGS. 2A and 2B may be employed. The transistor WTr included in a semiconductor device 101 illustrated in FIG. 2A has a back gate which is electrically connected to a wiring BG. In this configuration, the threshold voltage of the transistor WTr can be controlled by inputting a potential to the wiring BG.

Figure 2B:
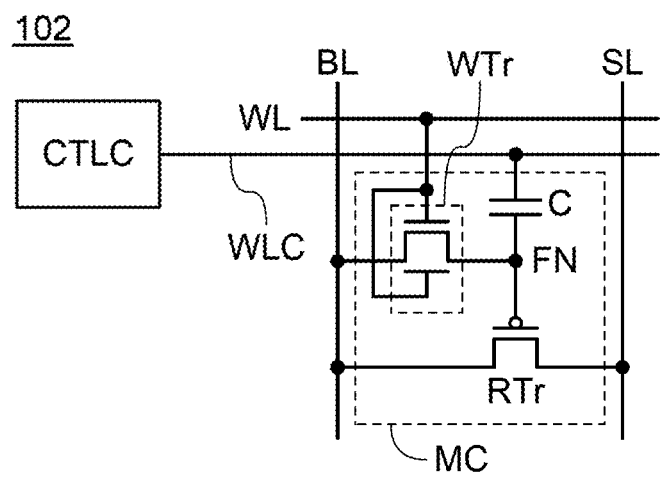

The transistor WTr included in a semiconductor device 102 illustrated in FIG. 2B has a back gate which is electrically connected to the gate of the transistor WTr. This configuration can increase an on-state current flowing through the transistor WTr.

Operation Example

Figure 4:
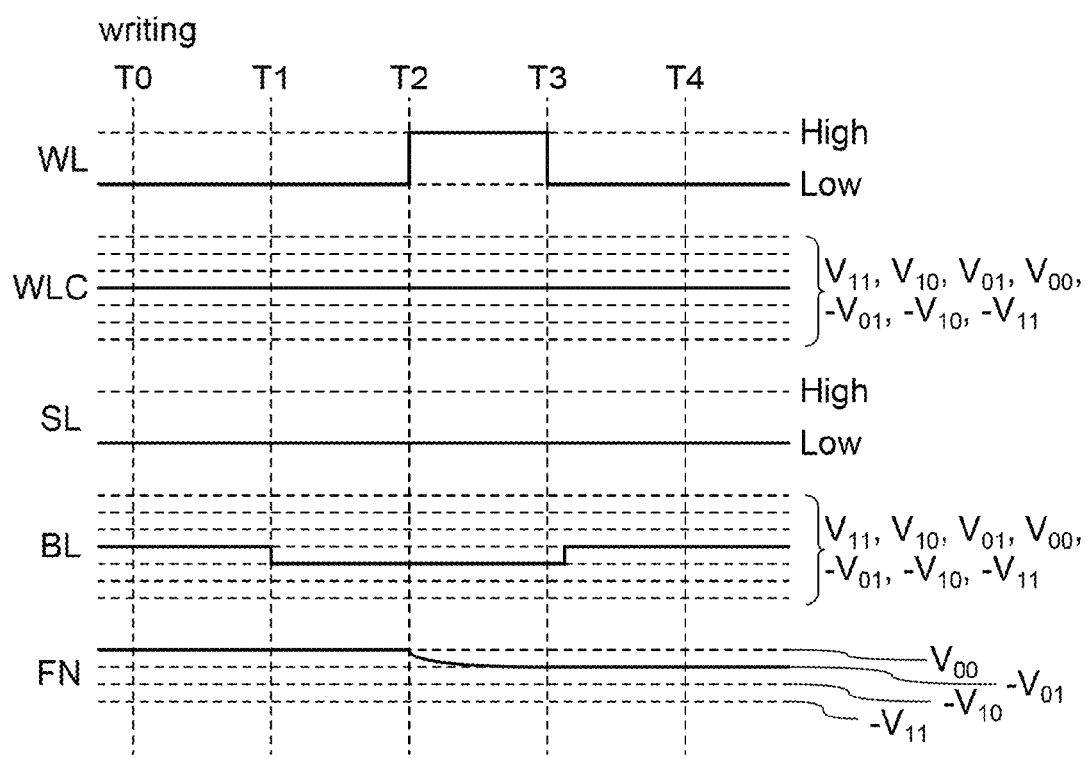
FIG. 4 is a timing chart showing an operation example of a semiconductor device.
Figure 5A:
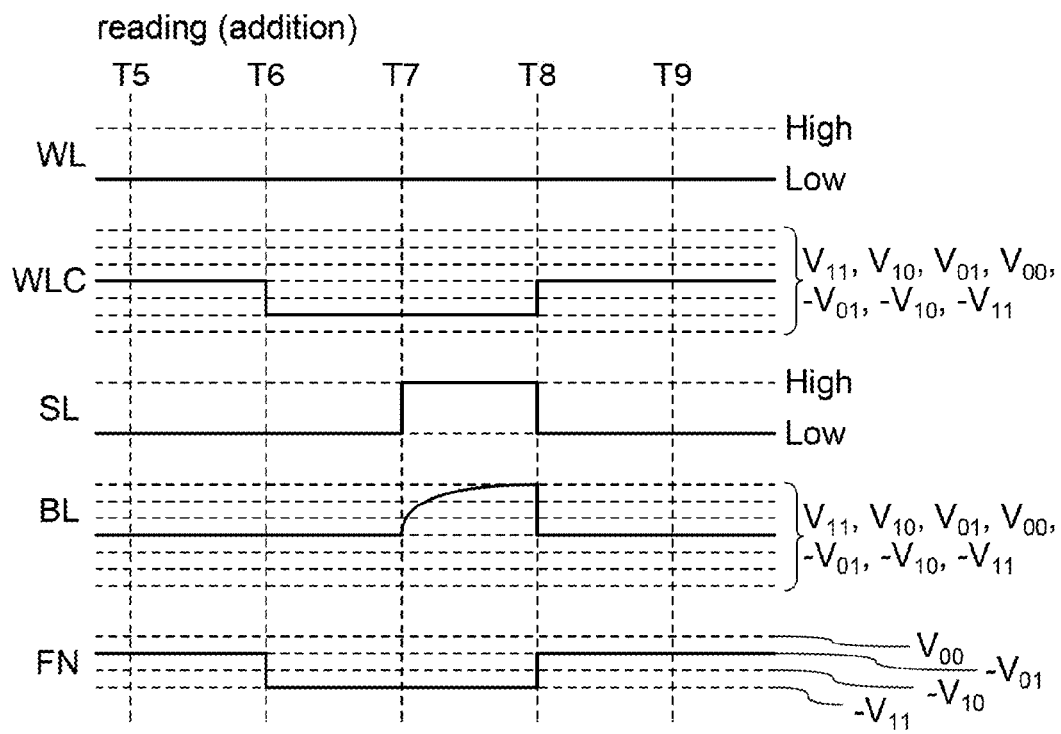
FIGS. 5A and 5B are timing charts each showing an operation example of a semiconductor device.
Figure 5B:
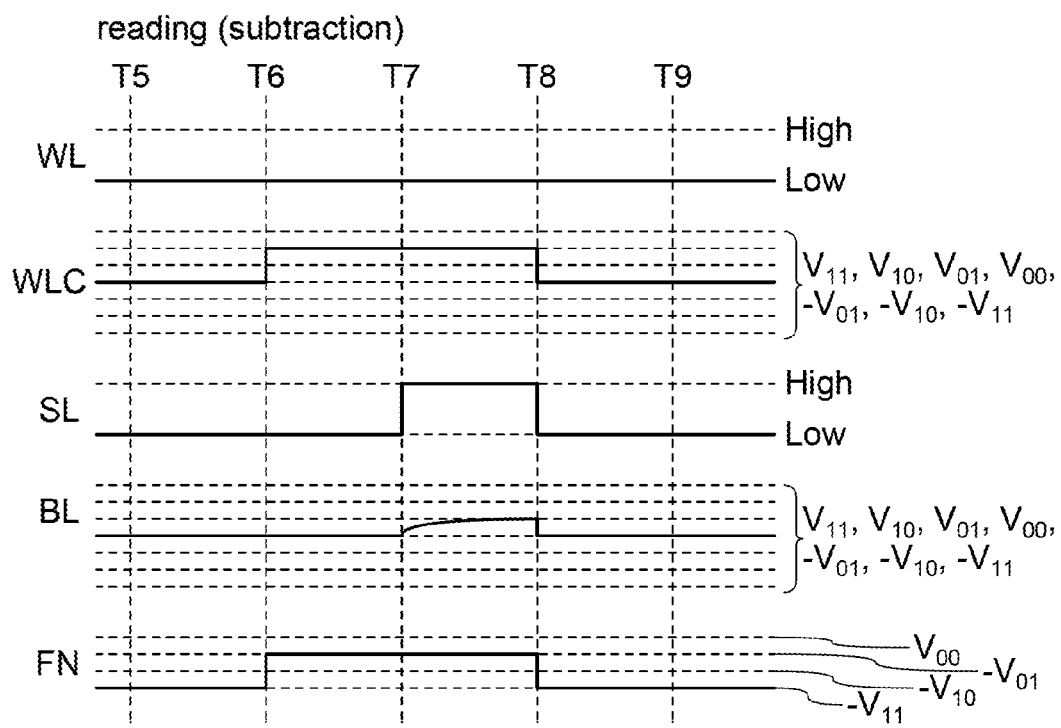

Next, the operation of the semiconductor device 100 of one embodiment of the present invention is described. FIG. 4 and FIGS. 5A and 5B are timing charts each showing an operation example of the semiconductor device 100.

<<Writing Operation>>

First, an example of a writing operation of the semiconductor device 100 is described. For writing of data to the memory cell MC, a high-level potential is applied to the wiring WL to turn on the transistor WTr. After that, a writing bit signal is input to the wiring BL to write the writing bit signal to the retention node FN via the transistor WTr. Finally, a low-level potential is applied to the wiring WL to turn off the transistor WTr, so that writing of data to the memory cell MC is completed. It is preferable that the potential of the wiring WLC be a reference potential continuously.

FIG. 4 is a timing chart showing an example of the operation for writing data to the semiconductor device 100.

FIG. 4 demonstrates changes in the potentials of the wiring WL, the wiring WLC, the wiring SL, the wiring BL, and the retention node FN when data is written to the retention node FN during a period from Time T0 to T4.

The memory cell MC included in the semiconductor device 100 described in this operation example is capable of storing four values. That is, the memory cell MC can handle four pieces of data: "00", "01", "10", and "11". Potentials representing the pieces of data "00", "01", "10", and "11" are denoted by $V_{00}$, $V_{01}$, $V_{10}$, and $V_{11}$, respectively. The lowest potential is $V_{00}$, followed by $V_{01}$, $V_{10}$, and $V_{11}$. A potential difference between $V_{00}$ and $V_{01}$, a potential difference between $V_{01}$ and $V_{10}$, and a potential difference between $V_{10}$ and $V_{11}$ are each represented as $\Delta V$. This operation example shows an operation for writing the potential $V_{01}$ to the retention node FN, which is described below.

Since the transistor RTr included in the semiconductor device 100 is a p-channel transistor, when a constant current flows between the source and the drain of the transistor RTr in a linear region, the source-drain voltage becomes large as the gate voltage is reduced. In that case, $V_{00}$ is set to 0 V as a reference potential, and the potential retained in the retention node FN is set to $V_{00}$, $-V_{01}$, $-V_{10}$, or $-V_{11}$ so that $V_{00}$, $V_{01}$, $V_{10}$, or $V_{11}$ is output from the other of the first terminal and the second terminal of the transistor RTr.

A high-level potential (denoted by "High" in FIG. 4) or a low-level potential (denoted by "Low" in FIG. 4) is input to the wiring WL. Here, the high-level potential is high enough to turn on the transistor WTr, and the low-level potential is low enough to turn off the transistor WTr.

A high-level potential (denoted by "High" in FIG. 4) or a low-level potential (denoted by "Low" in FIG. 4) is input to the wiring SL. Here, it is preferable that the high-level potential be sufficiently higher than the potential $V_{11}$.

One of the potentials $V_{11}$, $V_{10}$, $V_{01}$, $V_{00}$, $-V_{01}$, $-V_{10}$, and $-V_{11}$ is input to the wiring WLC. The highest potential is $V_{11}$, followed by $V_{10}$, $V_{01}$, $V_{00}$, $-V_{01}$, $-V_{10}$, and $-V_{11}$.

In a writing operation, any one of the potentials $V_{00}$, $-V_{01}$, $-V_{10}$, and $-V_{11}$ is input to the wiring BL. In a reading operation, the wiring BL has the potential $V_{11}$, $V_{10}$, or $V_{01}$ in some cases.

During a period from Time T0 to Time T1, the low-level potential is input to the wiring WL, the low-level potential is input to the wiring SL, and the potential $V_{00}$ is input to the wiring BL. In addition, the potential $V_{00}$ is input to the wiring WLC. The retention node FN retains the potential $V_{00}$ as a potential in the initial state.

The wiring BL is precharged with the potential $-V_{01}$ at Time T1, whereby the voltage $-V_{01}$ is applied to the second terminal of the transistor WTr.

At Time T2, the high-level potential is input to the wiring WL. Accordingly, the high-level potential is applied to the gate of the transistor WTr to turn on the transistor WTr.

Therefore, the wiring BL can be electrically connected to the retention node FN, so that charge flows from the wiring BL to the retention node FN during a period from Time T2 to Time T3. As a result, the potential $-V_{01}$ is retained in the retention node FN.

At Time T3, the low-level potential is input to the wiring WL. Accordingly, the low-level potential is applied to the gate of the transistor WTr to turn off the transistor WTr.

Accordingly, the wiring BL is not electrically connected to the retention node FN, so that no charge flows between the wiring BL and the retention node FN.

After the transistor WTr is turned off, the voltage $V_{00}$ is input to the wiring BL in a period from Time T3 to Time T4.

By the above operations from Time T0 to Time T4, data can be written to the retention node FN of the memory cell MC.

<<Reading Operation, Addition Processing, and Subtraction Processing>>

Next, an operation of the semiconductor device 100 for reading out data by executing addition or subtraction processing is described. When data stored in the memory cell MC is subjected to addition or subtraction processing, a potential which corresponds to a value which is added to or subtracted from the stored data is applied to the wiring WLC by the control circuit CTLC. As a result, the potential of the data that is initially stored in the memory cell MC is changed to a potential of data that has been subjected to the addition or subtraction processing. After that, the high level potential is applied to the wiring SL, and the high-level potential is input to the second terminal of the transistor RTr. Thus, the potential of the data subjected to the addition or subtraction processing can be output from the first terminal of the transistor RTr to be read out via the wiring BL.

FIG. 5A is a timing chart showing an operation in which data is read out from the memory cell MC of the semiconductor device 100 and then subjected to addition processing, and FIG. 5B is a timing chart showing an operation in which the data is subjected to subtraction processing. FIG. 5A or 5B demonstrates changes in the potentials of the wiring WL, the wiring WLC, the wiring SL, the wiring BL, and the retention node FN when data is written to the retention node FN during a period from Time T5 to T9.

For example, the potential $-V_{01}$ is retained in the retention node FN at Time T5 in FIG. 5A. Thus, FIG. 5A demonstrates an operation in which the potential $-V_{01}$ retained in the retention node FN is subjected to addition operation and then read out. Meanwhile, in FIG. 5B, the potential $-V_{11}$ is retained in the retention node FN at Time T5, for example. Thus, FIG. 5B demonstrates an operation in which the potential $-V_{11}$ retained in the retention node FN is subjected to subtraction processing and then read out.

First, the operation for executing the addition processing in reading (the timing chart of FIG. 5A) is described.

At Time T5, the low-level potential is input to the wiring WL, the potential $V_{00}$ is input to the wiring WLC, the low-level potential is input to the wiring SL, and the potential $V_{00}$ is input to the wiring BL. As described above, the retention node FN has retained the potential $-V_{01}$ since before Time T5.

At Time T6, the potential $-V_{10}$ is input to the wiring WLC, whereby the potential $-V_{10}$ is applied to the second terminal of the capacitor C. Since the low-level potential is input to the wiring WL, the transistor WTr is off. In other words, the retention node FN is in a floating state; therefore, the potential of the retention node FN changes in response to the change in the potential of the second terminal of the capacitor C (a boosting effect). In the case where the capacitive coupling coefficient in the memory cell MC is 1, the amount of change in the potential of the retention node FN corresponds to the amount of change in the potential of the second terminal of the capacitor C.

The potential of the second terminal of the capacitor C is $V_{00}$ at Time T5 and $-V_{10}$ at Time T7. Therefore, the amount of change in the potential of the second terminal of the capacitor C during a period from Time T5 to Time T7 is $-2\Delta V$.

Accordingly, the potential of the retention node FN in a floating state becomes a potential obtained by subtracting $2\Delta V$ corresponding to the amount of change in the potential of the second terminal of the capacitor C from the potential $-V_{01}$ that is originally retained in the retention node FN. That is, the potential of the retention node FN is reduced to the potential $-V_{11}$.

At Time T7, the high-level potential is input to the wiring SL. At that time, since the potential of the retention node FN is applied to the gate of the transistor RTr, a voltage is determined by the potential of the retention node FN and a current flowing between the first and second terminals of the transistor RTr. Therefore, when a current flows from the wiring SL to the wiring BL, a potential that corresponds to the potential of the retention node FN is output from the transistor RTr to the wiring BL. Here, a potential substantially equal to an inverted potential of the potential of the retention node FN is output to the wiring BL. Accordingly, the inverted potential of $-V_{11}$, i.e., a potential substantially equal to the potential $V_{11}$, is supplied from the first terminal of the transistor RTr to the wiring BL.

At that time, the potential of the wiring BL is input to a reading circuit connected to the wiring BL, whereby the potential retained in the retention node FN of the memory cell MC, i.e., data that is obtained as a result of addition processing, can be read out.

At Time T8, the potential $V_{00}$ is input to the wiring WLC, and the low-level potential is input to the wiring SL, whereby supply of charge from the wiring SL to the wiring BL is stopped; as a result, the potential of the wiring BL is reduced to $V_{00}$.

By performing the above operations from Time T5 to Time T9, data of the retention node FN of the memory cell MC can be subjected to addition processing and the resulting data can be read out.

Next, the operation for executing the subtraction processing in reading (the timing chart of FIG. 5B) is described.

At Time T5, the low-level potential is input to the wiring WL, the potential $V_{00}$ is input to the wiring WLC, the low-level potential is input to the wiring SL, and the potential $V_{00}$ is input to the wiring BL. As described above, the retention node FN has retained the potential $-V_{11}$ since before Time T5.

At Time T6, the potential $V_{10}$ is input to the wiring WLC, whereby the potential $V_{10}$ is applied to the second terminal of the capacitor C. Since the low-level potential is input to the wiring WL, the transistor WTr is off. In other words, the retention node FN is in a floating state; therefore, the potential of the retention node FN changes in response to the change in the potential of the second terminal of the capacitor C. In the case where the capacitive coupling coefficient in the memory cell MC is 1, the amount of change in the potential of the retention node FN corresponds to the amount of change in the potential of the second terminal of the capacitor C.

The potential of the second terminal of the capacitor C is $V_{00}$ at Time T5 and $V_{10}$ at Time T7. Therefore, the amount of change in the potential of the second terminal of the capacitor C during a period from Time T5 to Time T7 is $2\Delta V$.

Accordingly, the potential of the retention node FN in a floating state becomes a potential obtained by adding $2\Delta V$ corresponding to the amount of change in the potential of the second terminal of the capacitor C to the potential $-V_{11}$ that is originally retained in the retention node FN. That is, the potential of the retention node FN is reduced to the potential $-V_{01}$.

At Time T7, the high-level potential is input to the wiring SL. At that time, since the potential of the retention node FN is applied to the gate of the transistor RTr, a voltage is determined by the potential of the retention node FN and a current flowing between the first and second terminals of the transistor RTr. Therefore, when a current flows from the wiring SL to the wiring BL, a potential that corresponds to the potential of the retention node FN is output from the transistor RTr to the wiring BL. Here, a potential substantially equal to the potential of the retention node FN is output to the wiring BL. Accordingly, the inverted potential of $-V_{01}$, i.e., a potential substantially equal to the potential $V_{01}$, is supplied from the first terminal of the transistor RTr to the wiring BL.

At that time, the potential of the wiring BL is input to a reading circuit connected to the wiring BL, whereby the potential retained in the retention node FN of the memory cell MC, i.e., data that is obtained as a result of subtraction processing, can be read out.

At Time T8, the potential $V_{00}$ is input to the wiring WLC, and the low-level potential is input to the wiring SL, whereby supply of charge from the wiring SL to the wiring BL is stopped; as a result, the potential of the wiring BL is reduced to $V_{00}$.

By performing the above operations from Time T5 to Time T9, data of the retention node FN of the memory cell MC can be subjected to subtraction processing and the resulting data can be read out.

The above operations are executed in the semiconductor device 100 in this manner, whereby multi-level data retained in the retention node can be subjected to addition or subtraction processing without using an addition circuit or a subtraction circuit. In addition, the operation result can be output to the outside.

Since the semiconductor device 100 needs neither an addition circuit nor a subtraction circuit is needed, the circuit size of the memory device including the semiconductor device 100 can be reduced. That is, the memory device can be miniaturized.

In addition, since the above operation needs neither an addition circuit nor a subtraction circuit, it is not necessary to convert the read data into a digital value. Therefore, a time needed for executing addition or subtraction processing on data can be shortened.

Furthermore, the above-described subtraction processing makes it possible to perform comparison between the value of multi-level data retained in the semiconductor device 100 (hereinafter referred to as A value) and a given value (hereinafter referred to as B value). Such comparison is referred to as comparison processing in the following description. Specifically, a potential that corresponds to an reciprocal of a potential corresponding to B value, which is to be compared with A value retained in the memory cell MC, is applied from the control circuit CTLC to the wiring WLC. That is, subtraction processing for subtracting B value from A value retained in the memory cell MC is executed in the semiconductor device 100. After that, a potential corresponding to the result of the subtraction processing is output from the first terminal of the transistor RTr via the wiring BL. Then, the output potential corresponding to the result of the subtraction processing is read out, and whether the data has a positive value, a negative value, or is 0 is determined, whereby B value can be compared with A value retained in the memory cell MC. In this manner, application of subtraction processing enables comparison processing between the value of multi-level data retained in the memory cell MC and a given value.

Although the capacitive coupling coefficient in the memory cell MC of the semiconductor device 100 is given as 1 in this embodiment, the capacitive coupling coefficient is sometimes less than 1 actually by influences caused by the configuration of the capacitor C, wirings in the vicinity of the retention node FN, and other elements. In such a case, for example, a configuration which influences the manufacture of the semiconductor device 100 as little as possible is employed, or the potential applied from the control circuit CTLC to the second terminal of the capacitor C is adjusted in accordance with the capacitive coupling coefficient.

This embodiment can be achieved in a memory cell capable of retaining analog data as well as in the memory cell capable of retaining multi-level data. That is, analog data can also be subjected to addition processing, subtraction processing, or comparison processing in a manner similar to that described above.

Note that an example described as one embodiment of the present invention in this embodiment can be combined with any of the other examples as appropriate.

In Embodiment 1, one embodiment of the present invention has been described. Other embodiments of the present invention will be described in Embodiments 2 to 8. Note that one embodiment of the present invention is not limited thereto. In other words, various embodiments of the invention are described in this embodiment and the other embodiments, and one embodiment of the present invention is not limited to a particular embodiment. Although an example in which a channel formation region, a source region, a drain region, or the like of a transistor includes an oxide semiconductor is described as one embodiment of the present invention, one embodiment of the present invention is not limited thereto. Depending on the circumstances and conditions, a variety of semiconductors may be used for transistors in one embodiment of the present invention, the channel formation regions of the transistors, the source and drain regions of the transistors, and the like. Depending on the circumstances and conditions, transistors in one embodiment of the present invention, the channel formation regions of the transistors, the source and drain regions of the transistors, and the like may include, for example, at least one of silicon, germanium, silicon germanium, silicon carbide, gallium arsenide, aluminum gallium arsenide, indium phosphide, gallium nitride, and an organic semiconductor. Depending on the circumstances and conditions, transistors in one embodiment of the present invention, the channel formation regions of the transistors, the source and drain regions of the transistors, and the like do not necessarily include an oxide semiconductor.

Note that this embodiment can be combined with any of the other embodiments in this specification as appropriate.

Embodiment 2

In this embodiment, a configuration of a semiconductor device which is different from that of the semiconductor device 100 described in Embodiment 1 is described.

Configuration Example 1

Figure 6A:
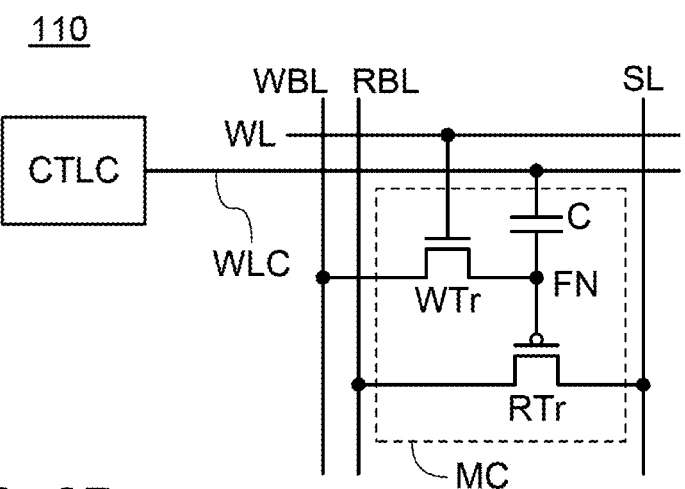
FIGS. 6A and 6B are block diagrams each showing an example of a semiconductor device.

FIG. 6A shows a semiconductor device of one embodiment of the present invention. A semiconductor device 110 includes the memory cell MC and the control circuit CTLC. The memory cell MC includes the transistor WTr, the transistor RTr, and the capacitor C. Note that the transistor WTr is an n-channel transistor, and the transistor RTr is a p-channel transistor.

The memory cell MC is electrically connected to a wiring WBL, a wiring RBL, the wiring BL, the wiring SL, the wiring WL, and the wiring WLC.

The first terminal of the transistor WTr is electrically connected to the first terminal of the capacitor C and the gate of the transistor RTr via the retention node FN. The second terminal of the transistor WTr is electrically connected to the wiring WBL, and the gate of the transistor WTr is electrically connected to the wiring WL. The first terminal of the transistor RTr is electrically connected to the wiring RBL, and the second terminal of the transistor RTr is electrically connected to the wiring SL. The second terminal of the capacitor is electrically connected to the wiring WLC.

The control circuit CTLC is electrically connected to the wiring WLC.

The wiring WBL functions as a writing bit line. When data is written to the memory cell MC, a potential is input from the wiring WBL to the second terminal of the transistor WTr. The wiring RBL functions as a reading bit line. When data is read out from the memory cell MC, a potential is output from the first terminal of the transistor RTr to the wiring RBL. The wiring SL functions as a source line. When data is read out from the memory cell MC, a potential is input from the wiring SL to the second terminal of the transistor RTr. The wiring WL functions as a word line. When data is written to the memory cell MC, a potential is input from the wiring WL to the gate of the transistor WTr. The wiring WLC functions as a wiring for applying an appropriate potential to the second terminal of the capacitor C.

As described above, the semiconductor device 110 has a connection configuration substantially similar to that of the semiconductor device 100; however, in the semiconductor device 100, a writing bit signal and a reading bit signal are both supplied (transmitted) by the wiring BL, whereas in the semiconductor device 110, a writing bit signal is transmitted by the wiring WBL and a reading bit signal is transmitted by the wiring RBL.

Accordingly, writing and reading operations of the semiconductor device 110 can be performed in the same manner as those of the semiconductor device 100.

Figure 7A:
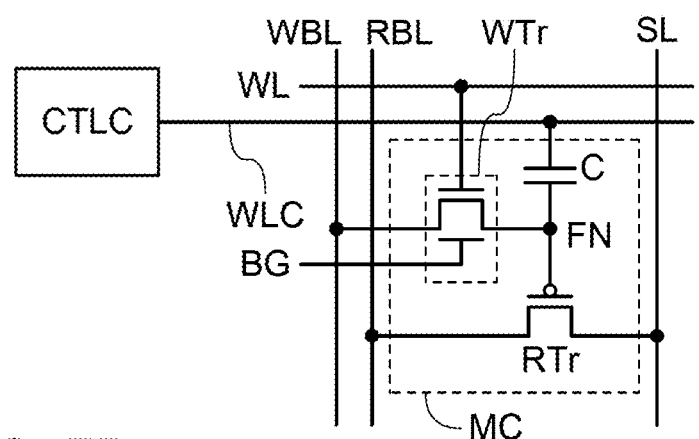
FIGS. 7A and 7B are block diagrams each showing an example of a semiconductor device.

Note that one embodiment of the present invention is not limited to the configuration of the semiconductor device 110 illustrated in FIG. 6A. Any one of the configurations of semiconductor devices illustrated in FIGS. 7A and 7B may be employed. The transistor WTr included in a semiconductor device 111 illustrated in FIG. 7A has a back gate which is electrically connected to the wiring BG. In this configuration, the threshold voltage of the transistor WTr can be controlled by inputting a potential to the wiring BG.

Figure 7B:
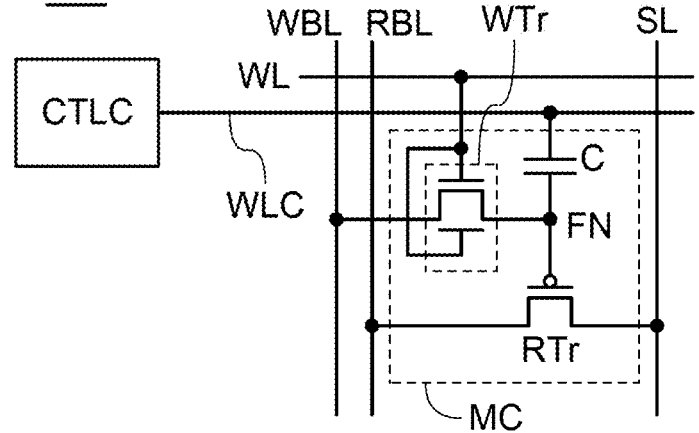

The transistor WTr included in a semiconductor device 112 illustrated in FIG. 7B has a back gate which is electrically connected to the gate of the transistor WTr. This configuration can increase an on-state current flowing through the transistor WTr.

Configuration Example 2

Figure 6B:
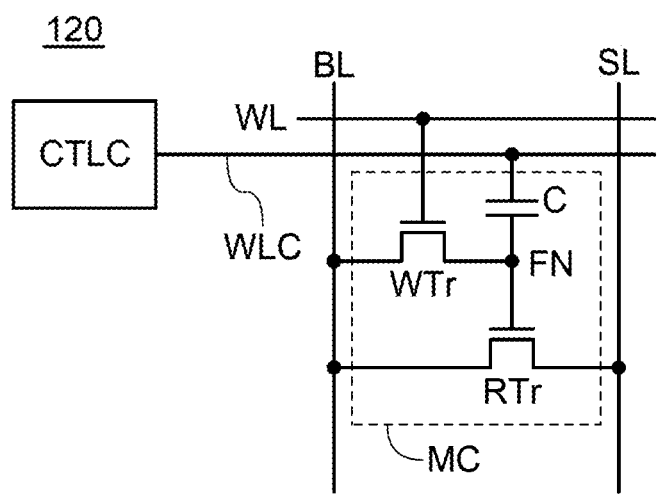

FIG. 6B shows a semiconductor device of one embodiment of the present invention. A semiconductor device 120 includes the memory cell MC and the control circuit CTLC. The memory cell MC includes the transistor WTr, the transistor RTr, and the capacitor C. Note that the transistors WTr and RTr are n-channel transistors.

For the connection configuration of the semiconductor device 120, the description of the semiconductor device 100 is referred to.

Since the transistors WTr and RTr are n-channel transistors, the transistors WTr and RTr can be formed using the same materials or can be formed by the same formation process. For example, the transistors WTr and RTr may each be a transistor in which the channel formation region includes an oxide semiconductor. In this manner, when the transistors WTr and RTr are formed using the same materials or formed by the same formation process, the manufacturing process of the semiconductor device 120 can be shortened.

The transistor in which the channel formation region includes an oxide semiconductor can have an extremely low off-state current. Accordingly, the potential of the retention node FN can be retained for a long time, and therefore it is not necessary to refresh the potential of the retention node FN; as a result, the power consumption of the semiconductor device 120 can be reduced.

Since the transistor RTr included in the semiconductor device 120 is an n-channel transistor, when a constant current flows between the source and the drain of the transistor RTr, as the gate voltage is increased, the source-drain voltage becomes large. Accordingly, the potential written to the retention node FN and the potential output from the first terminal of the transistor RTr are different from those in the semiconductor device 100. In that case, it is preferably to take any of the following countermeasures and the like: providing a back gate in the transistor RTr to control the threshold voltage of the transistor RTr; and providing a correction circuit for the wiring BL to correct the value of the potential output from the first terminal of the transistor RTr.

Figure 8A:
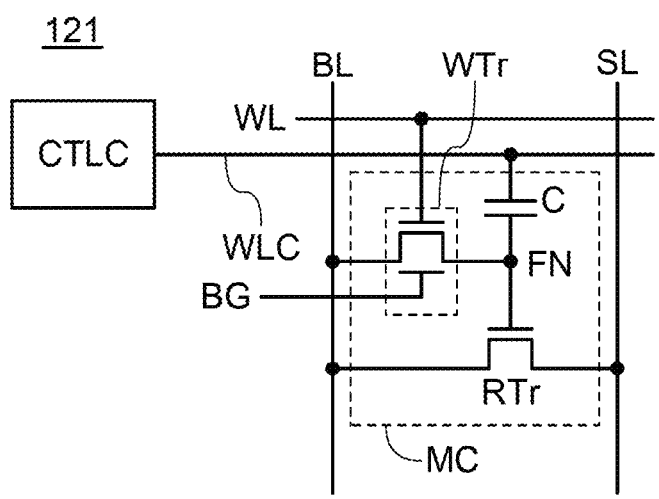
FIGS. 8A and 8B are block diagrams each showing an example of a semiconductor device.

Note that one embodiment of the present invention is not limited to the configuration of the semiconductor device 120 illustrated in FIG. 6B. Any one of the configurations of semiconductor devices illustrated in FIGS. 8A and 8B may be employed. The transistor WTr included in a semiconductor device 121 illustrated in FIG. 8A has a back gate which is electrically connected to the wiring BG. In this configuration, the threshold voltage of the transistor WTr can be controlled by inputting a potential to the wiring BG.

Figure 8B:
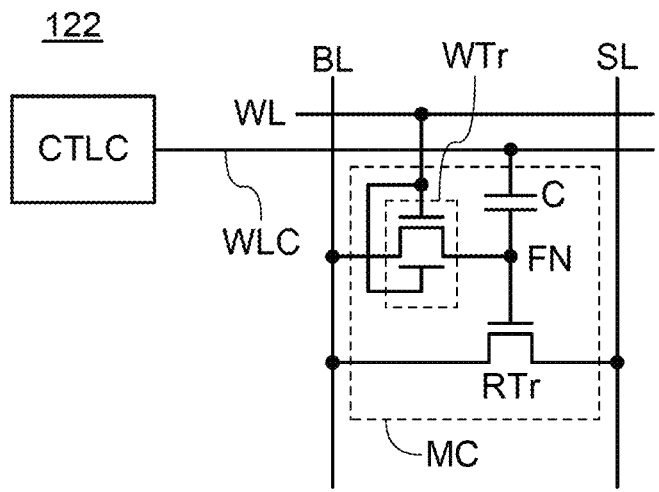

The transistor WTr included in a semiconductor device 122 illustrated in FIG. 8B has a back gate which is electrically connected to the gate of the transistor WTr. This configuration can increase an on-state current flowing through the transistor WTr.

Configuration Example 3

Figure 9A:
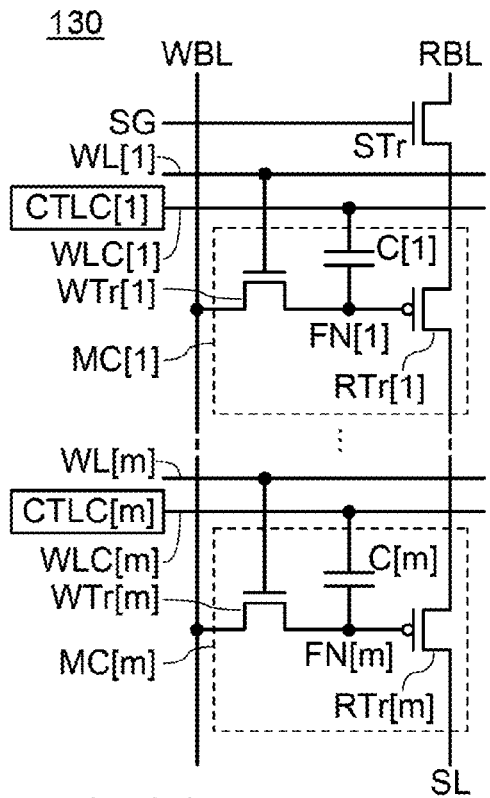
FIGS. 9A to 9C are block diagrams each showing an example of a semiconductor device.

FIG. 9A shows a semiconductor device of one embodiment of the present invention. A semiconductor device 130 includes a transistor STr, control circuits CTLC[1] to CTLC[m], and memory cells MC[1] to MC[m] (m is an integer of 1 or more).

The memory cell MC[i] includes a transistor WTr[i], a transistor RTr[i], and a capacitor C[i] (i is an integer of 1 to m). Note that the transistor WTr[i] is an n-channel transistor, and the transistor RTr[i] is a p-channel transistor.

The memory cell MC[i] is electrically connected to the wiring WBL, a wiring WL[i], and a wiring WLC[i].

A first terminal of the transistor WTr[i] is electrically connected to a first terminal of the capacitor C[i] and a gate of the transistor RTr[i] via a retention node FN[i]. A second terminal of the transistor WTr[i] is electrically connected to the wiring WBL, and a gate of the transistor WTr[i] is electrically connected to the wiring WL[i]. A second terminal of the capacitor C[i] is electrically connected to the wiring WLC[i]. The wiring WLC[i] is electrically connected to the control circuit CTLC[i].

A first terminal of the transistor STr is electrically connected to the wiring RBL, a second terminal of the transistor STr is electrically connected to a first terminal of the transistor RTr[1], and a gate of the transistor STr is electrically connected to a wiring SG. A first terminal of the transistor RTr[m] is electrically connected to the wiring SL. The transistors RTr[1] to RTr[m] are connected in series.

That is, the semiconductor device 130 is a string with a NAND connection which includes the plurality of memory cells MC, each of which corresponds to the memory cell MC in the semiconductor device 100 described in Embodiment 1.

Next, a writing operation and a reading operation which is performed after addition or subtraction processing in the semiconductor device 130 are described.

The writing operation of the semiconductor device 130 is performed in such a manner that the memory cell MC[i] is selected by application of a potential to the wiring WL[i], and a writing bit signal is supplied from the wiring WBL to the memory cell MC[i]. That is, the writing operation of the semiconductor device 130 can be performed in a manner similar to that of the writing operation of the semiconductor device 100 described in Embodiment 1.

The reading operation of the semiconductor device 130 after addition or subtraction processing is performed in such a manner that a high-level potential is output to the wiring SG so that the transistor STr of a string that includes the memory cell MC[i] from which data is to be read out is turned on.

Next, the memory cell MC[i] from which data is to be read out is subjected to the addition or subtraction processing described in Embodiment 1. Specifically, a potential is applied from the control circuit CTLC[i] to the second terminal of the capacitor C[i] via the wiring WLC[i] to increase or reduce the potential of the retention node FN[i] by capacitive coupling.

Meanwhile, as for the memory cell MC[j] which is not selected (j is an integer of 1 to m other than i), a potential sufficiently lower than $-V_{11}$ is applied from the control circuit CTLC[j] to the second terminal of the capacitor C[j] via the wiring WLC[j] to turn on the transistor RTr[j]. Therefore, when a current flows between the source and the drain of the transistor RTr[j] of the memory cell MC[j] that is not selected, substantially no potential difference is generated between the source and the drain of the transistor RTr[j]. That is, when a current flows between the wiring RBL and the wiring SL, of the transistors RTr[1] to RTr[m], only the transistor RTr[i] has the potential difference between the source and the drain; accordingly, a potential substantially equal to that of the retention node FN[i] is output from the drain of the transistor RTr[i] to the wiring RBL. The output potential is read out by a reading circuit or the like, whereby data of the memory cell MC[i] which has been subjected to addition or subtraction processing can be read out.

Note that only the wirings WBL, RBL, SG, SL, WL[1], WL[m], WLC[1], and WLC[m], the control circuits CTLC[1] and CTLC[m], the memory cells MC[1] and MC[m], the transistors STr, WTr[1], WTr[m], RTr[1], and RTr[m], the capacitors C[1] and C[m], and the retention nodes FN[1] and FN[m] are shown in the semiconductor device 130 of FIG. 9A, and the other reference numerals, wirings, elements, and the like are omitted.

Configuration Example 4

Figure 9B:
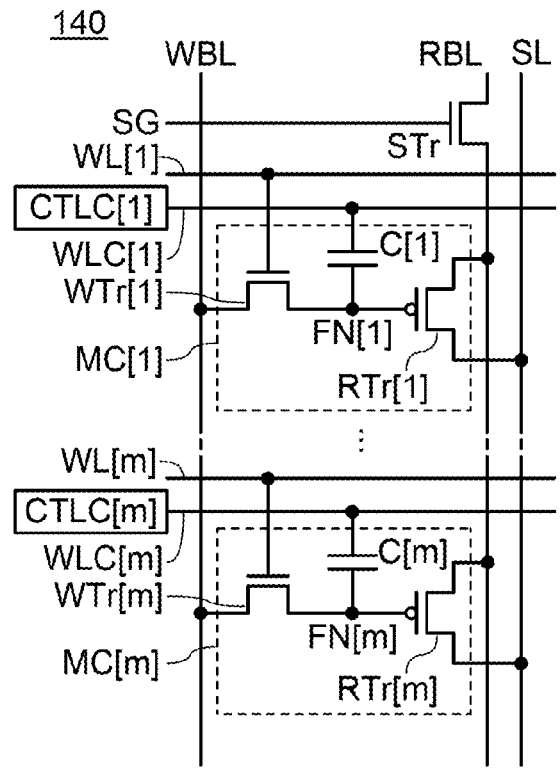

FIG. 9B shows a semiconductor device of one embodiment of the present invention. A semiconductor device 140 includes the transistor STr, the control circuits CTLC[1] to CTLC[m], and the memory cells MC[1] to MC[m] (m is an integer of 1 or more).

The memory cell MC[i] includes the transistor WTr[i], the transistor RTr[i], and the capacitor C[i] (i is an integer of 1 to m).

The memory cell MC[i] is electrically connected to the wiring WBL, the wiring WL[i], the wiring WLC[i], and the wiring SL.

The first terminal of the transistor WTr[i] is electrically connected to the first terminal of the capacitor C[i] and the gate of the transistor RTr[i] via the retention node FN[i]. The second terminal of the transistor WTr[i] is electrically connected to the wiring WBL, and the gate of the transistor WTr[i] is electrically connected to the wiring WL[i]. The second terminal of the capacitor C[i] is electrically connected to the wiring WLC[i]. The wiring WLC[i] is electrically connected to the control circuit CTLC [i].

The first terminal of the transistor STr is electrically connected to the wiring RBL, the second terminal of the transistor STr is electrically connected to the first terminals of the transistors RTr[1] to RTr[m], and the gate of the transistor STr is electrically connected to the wiring SG. The wiring SL is electrically connected to the second terminals of the transistors RTr[1] to RTr[m].

The semiconductor device 140 is a string with a NOR connection which includes the plurality of memory cells MC, each of which corresponds to the memory cell MC in the semiconductor device 100 described in Embodiment 1.

Next, writing and reading operations of the semiconductor device 140 are described.

The writing operation of the semiconductor device 140 is performed in such a manner that the memory cell MC[i] is selected by application of a potential to the wiring WL[i], and a writing bit signal is supplied from the wiring WBL to the memory cell MC[i]. That is, the writing operation can be performed in a manner similar to that of the writing operation of the semiconductor device 100 described in Embodiment 1.

The reading operation of the semiconductor device 140 is performed in such a manner that a high-level potential is output to the wiring SG so that the transistor STr of a string that includes the memory cell MC[i] from which data is to be read out is turned on.

Next, the memory cell MC[i] from which data is to be read out is subjected to the addition or subtraction processing described in Embodiment 1. Specifically, a potential is applied from the control circuit CTLC[i] to the second terminal of the capacitor C[i] via the wiring WLC[i] to increase or reduce the potential of the retention node FN[i] by capacitive coupling.

Meanwhile, as for the memory cell MC[j] which is not selected (j is an integer of 1 to m other than i), a potential sufficiently higher than $V_{11}$ is applied from the control circuit CTLC[j] to the second terminal of the capacitor C[j] via the wiring WLC[j] to turn off the transistor RTr[j]. Therefore, no current flows between the source and the drain of the transistor RTr[j] of the memory cell MC[j] that is not selected. That is, of the transistors RTr[1] to RTr[m] positioned between the wiring RBL and the wiring SL, only the transistor RTr[i] is turned on; accordingly, a potential which is substantially equal to that of the retention node FN[i] is input from the drain of the transistor RTr[i] to the wiring RBL.

Note that only the wirings WBL, RBL, SG, SL, WL[1], WL[m], WLC[1], and WLC[m], the control circuits CTLC [1] and CTLC[m], the memory cells MC[1] and MC[m], the transistors STr, WTr[1], WTr[m], RTr[1], and RTr[m], the capacitors C[1] and C[m], and the retention nodes FN[1] and FN[m] are shown in the semiconductor device 140 of FIG. 9B, and the other reference numerals, wirings, elements, and the like are omitted.

Figure 9C:
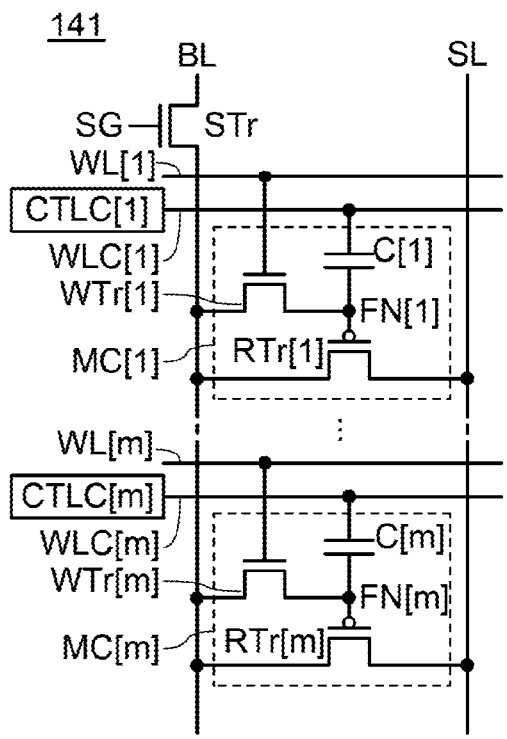

Note that one embodiment of the present invention is not limited to the configuration of the semiconductor device 140 of FIG. 9B, and the configuration can be changed as appropriate depending on circumstances or conditions. For example, the number of wirings included in the semiconductor device 140 may be increased or reduced. A configuration in that case is shown in FIG. 9C. A semiconductor device 141 has a configuration in which one wiring BL serves as the wirings WBL and RBL of the semiconductor device 140. In the writing and reading operations of the semiconductor device 141, a writing bit line signal and a reading bit line signal are transmitted by the wiring BL.

Configuration Example 5

Figure 10:
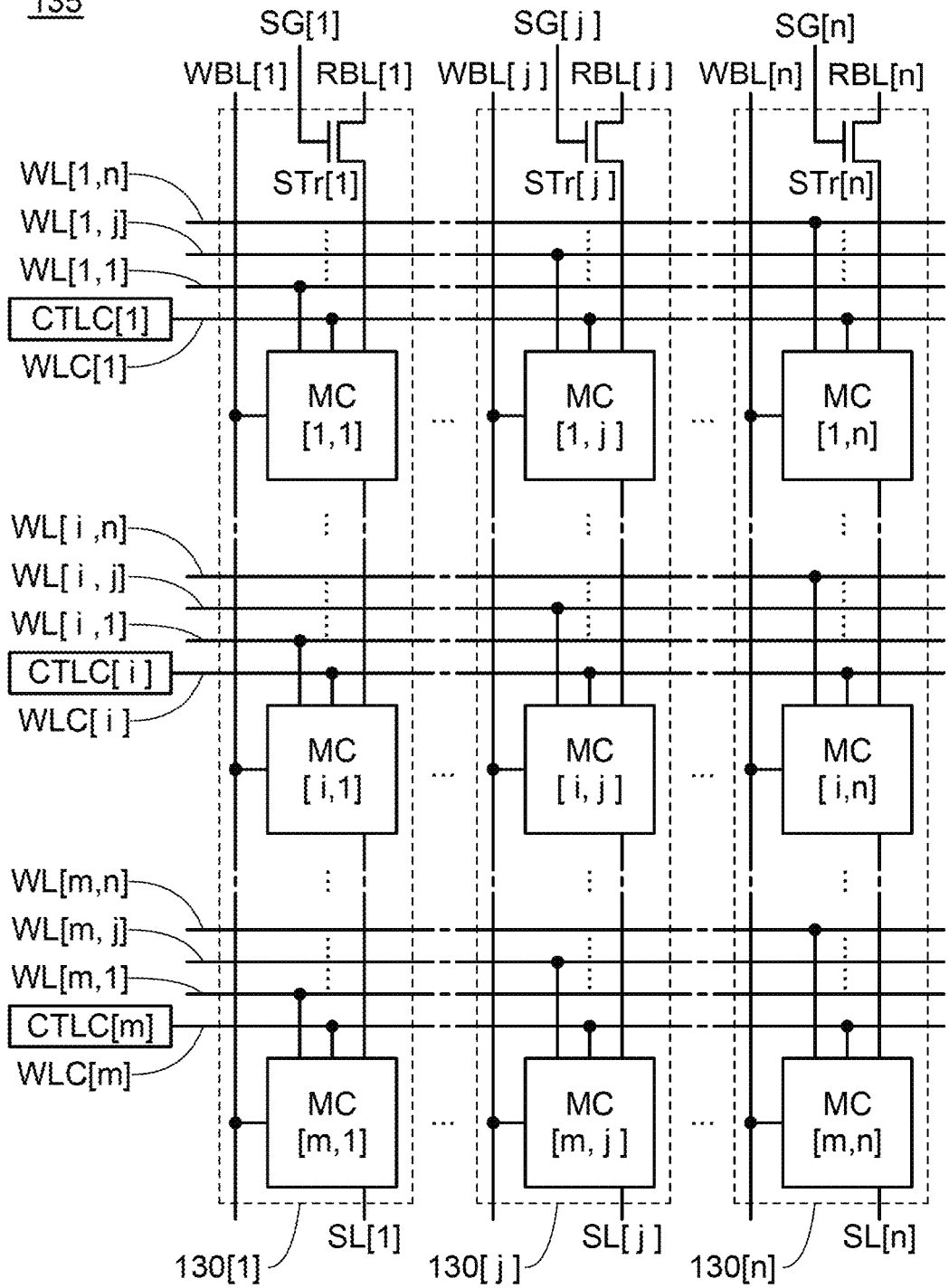
FIG. 10 is a block diagram showing an example of a semiconductor device.

FIG. 10 shows a semiconductor device of one embodiment of the present invention.

In a semiconductor device 135, semiconductor devices 130[1] to 130[*n*] (n is an integer of 1 or more) each of which has the same configuration as the semiconductor device 130 described in Configuration example 3 are arranged in a stripe form. The semiconductor devices 130[1] to 130[*n*] each include m memory cells MC. That is, the memory cells are arranged in m columns and n rows, and the total number of memory cells of the semiconductor device 135 is m×n. Note that the memory cell positioned in the i-th row and j-th column of the semiconductor device 135 is referred to as a memory cell MC[i,j] (here, i is an integer of 1 to m and j is an integer of 1 to n). Note that each of the memory cells MC[1,1] to MC[m,n] has the same configuration as one of the memory cells MC[1] to MC[m] illustrated in FIGS. 9A to 9C.

The semiconductor device 135 includes the control circuits CTLC[1] to CTLC[m]. The control circuits CTLC[1] to CTLC[m] are electrically connected to the wirings WLC [1] to WLC[m], respectively. The wiring WLC[i] is electrically connected to the memory cells MC[i,1] to MC[i,n].

The semiconductor device 135 is electrically connected to wirings WL[1,1] to WL[m,n]. Note that the wirings WL[1,1] to WL[m,n] extend in the row direction and are divided into groups of n for individual rows. The wirings WL[i,1] to WL[i,n] are electrically connected to the memory cells MC[i,1] to MC[i,n], respectively.

The semiconductor device 135 is electrically connected to wirings RBL[1] to RBL[n]. Furthermore, the semiconductor device 135 is electrically connected to wirings WBL[1] to WBL[n]. In addition, the semiconductor device 135 is electrically connected to wirings SL[1] to SL[n]. Moreover, the semiconductor device 135 is electrically connected to wirings SG[1] to SG[n]. Specifically, the wiring RBL[j] is electrically connected to a first terminal of the transistor STr[j], the wiring WBL[j] is electrically connected to the memory cells MC[1,j] to MC[m,j], the wiring SL[j] is electrically connected to the memory cell MC[m,j], and the wiring SG[j] is electrically connected to a gate of the transistor STr[j].

When data is written to the memory cell MC[i,j] in the semiconductor device 135, a predetermined potential is applied to the wiring WL[i,j] first to select the memory cell MC[i,j]. Then, a writing bit signal is supplied by the wiring WBL[j], whereby data can be written to the memory cell MC[i,j]. In other words, the writing operation of the semiconductor device 135 can be performed in a manner similar to that of the writing operation of the semiconductor device 100 or the semiconductor device 130.

When data of the memory cell MC[i,j] in the semiconductor device 135 is subjected to addition or subtraction processing and then read out, a predetermined potential is applied to the wiring SG[j] first to select the semiconductor device 130[j] including the memory cell MC[i,j]. Next, the memory cell MC[i,j] from which data is to be read out is subjected to the addition or subtraction processing described in Embodiment 1. Specifically, a predetermined potential is applied from the control circuit CTLC[i] via the wiring WLC[i] to increase or reduce the potential of the retention node of the memory cell MC[i,j]. Meanwhile, in the memory cell MC[k,j] (k is an integer of 1 to m other than i) from which data is not read out, a sufficiently low potential is applied from the control circuit CTLC[k] via the wiring WLC[k] to turn on the transistor RTr included in the memory cell MC[k,j]. When a current flows between the wiring RBL[j] and the wiring SL[j] in that state, no potential difference is generated between the source and the drain of the transistor RTr included in the memory cell MC[k,j], and a potential difference is generated only between the source and the drain of the transistor RTr included in the memory cell MC[i,j]. Therefore, a potential substantially equal to that of the retention node of the memory cell MC[i,j] is output from the drain of the transistor RTr included in the memory cell MC [i,j] to the wiring RBL. The output potential is read out by a reading circuit or the like, whereby data of the memory cell MC[i,j] which has been subjected to addition or subtraction processing can be read out.

Such a configuration makes it possible to obtain a semiconductor device with large storage capacity.

Note that only the semiconductor devices 130[1], 130[j], and 130[n]; the wirings WBL[1], WBL[j], WBL[n], RBL[1], RBL[j], RBL[n], SL[1], SL[j], SL[n], SG[1], SG[j], SG[n], WLC[1], WLC[i], WLC[m], WL[1,1], WL[1,j], WL[1,n], WL[i,1], WL[i,j], WL[i,n], WL[m,1], WL[m,j], and WL[m,n]; the control circuits CTLC[1], CTLC[i], and CTLC[m]; the memory cells MC[1,1], MC[1,j], MC[1,n], MC[i,n], MC[i,1], MC[i,j], MC[i,n], MC[m,1], MC[m,j], and MC[m,n]; the transistors STr[1], STr[j], and STr[n] are shown in the semiconductor device 135 of FIG. 10, and the other reference numerals, wirings, elements, and the like are omitted.

Configuration Example 6

Figure 11:
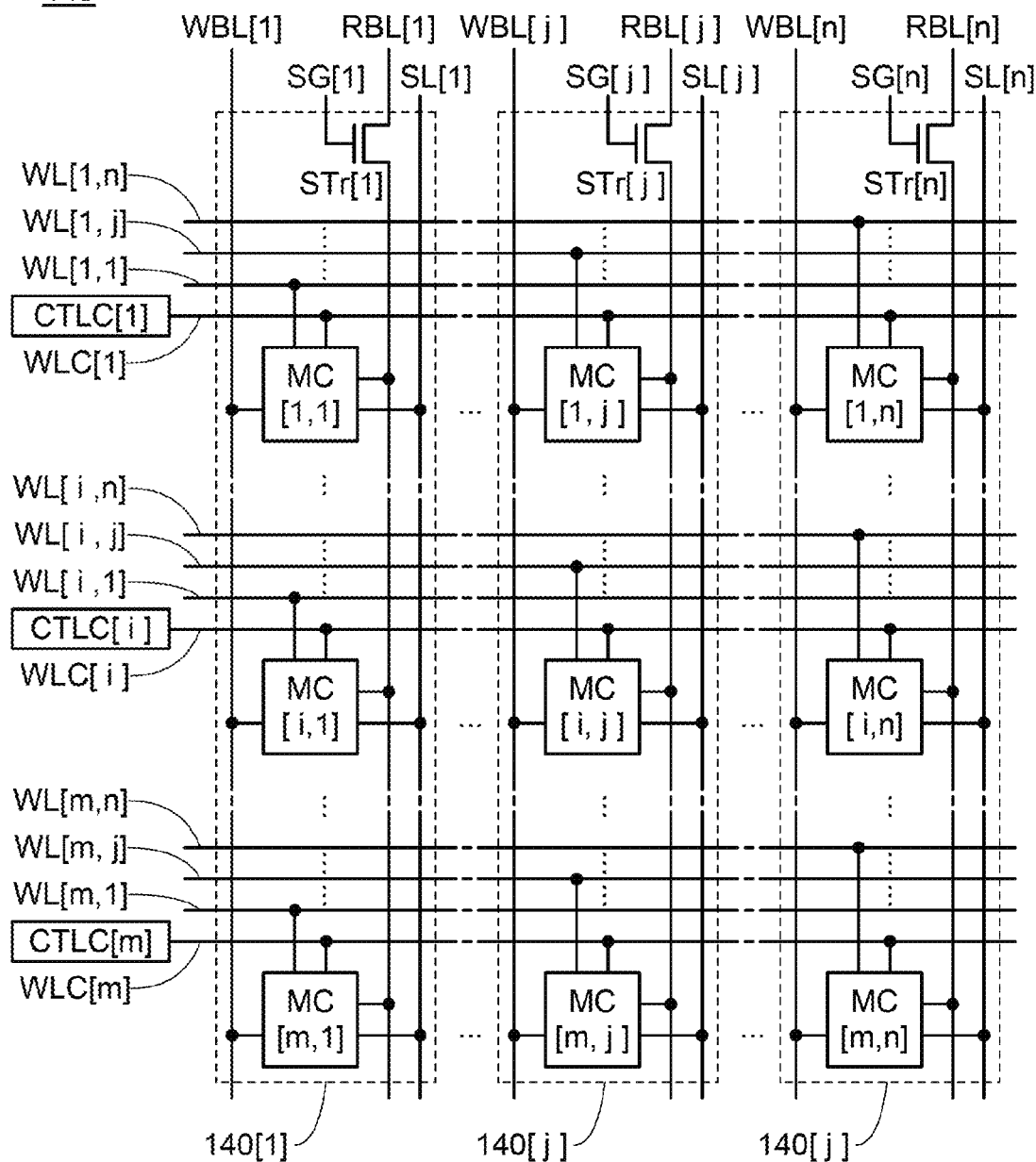
FIG. 11 is a block diagram showing an example of a semiconductor device.

FIG. 11 shows a semiconductor device of one embodiment of the present invention.

In a semiconductor device 145, semiconductor devices 140[1] to 140[n] (n is an integer of 1 or more) each of which has the same configuration as the semiconductor device 140 described in Configuration example 4 are arranged in a stripe form. The semiconductor devices 140[1] to 140[n] each include m memory cells MC. That is, the memory cells MC are arranged in m columns and n rows, and the total number of memory cells MC of the semiconductor device 145 is m×n. Note that the memory cell MC positioned in the i-th row and j-th column of the semiconductor device 145 is referred to as a memory cell MC[i,j] (here, i is an integer of 1 to m and j is an integer of 1 to n). Each of the memory cells MC[1,1] to MC[m,n] has the same configuration as the memory cell MC illustrated in FIG. 1.

The semiconductor device 145 includes the control circuits CTLC[1] to CTLC[m]. The control circuits CTLC[1] to CTLC[m] are electrically connected to the wirings WLC[1] to WLC[m], respectively. The wiring WLC[i] is electrically connected to the memory cells MC[i,1] to MC[i,n].

The semiconductor device 145 is electrically connected to the wirings WL[1,1] to WL[m,n]. Note that the wirings WL[1,1] to WL[m,n] extend in the row direction and are divided into groups of n for individual rows. The wirings WL[i,1] to WL[i,n] are electrically connected to the memory cells MC[i,1] to MC[i,n], respectively.

The semiconductor device 145 is electrically connected to the wirings RBL[1] to RBL[n]. Furthermore, the semiconductor device 145 is electrically connected to the wirings WBL[1] to WBL[n]. In addition, the semiconductor device 145 is electrically connected to the wirings SL[1] to SL[n]. Moreover, the semiconductor device 145 is electrically connected to the wirings SG[1] to SG[n]. Specifically, the wiring RBL[j] is electrically connected to the first terminal of the transistor STr[j], the wiring WBL[j] is electrically connected to the memory cells MC[1,j] to MC[m,j], the wiring SL[j] is electrically connected to the memory cells MC [1,j] to MC[m,j], and the wiring SG[j] is electrically connected to the gate of the transistor STr[j].

When data is written to the memory cell MC[i,j] in the semiconductor device 145, a predetermined potential is applied to the wiring WL[i,j] first to select the memory cell MC[i,j]. Then, a writing bit signal is supplied by the wiring WBL[j], whereby data can be written to the memory cell MC[i,j]. In other words, the writing operation of the semiconductor device 145 can be performed in a manner similar to that of the writing operation of the semiconductor device 100, the semiconductor device 130, or the semiconductor device 135.

When data of the memory cell MC[i,j] in the semiconductor device 145 is subjected to addition or subtraction processing and then read out, a predetermined potential is applied to the wiring SG[j] first to select the semiconductor device 140[j] including the memory cell MC[i,j]. Next, the memory cell MC[i,j] from which data is to be read out is subjected to the addition or subtraction processing described in Embodiment 1. Specifically, a predetermined potential is applied from the control circuit CTLC[i] via the wiring WLC[i] to increase or reduce the potential of the retention node of the memory cell MC[i,j]. Meanwhile, in the memory cell MC[k,j] (k is an integer of 1 to m other than i) from which data is not read out, a sufficiently high potential is applied from the control circuit CTLC[k] via the wiring WLC[k] to turn off the transistor RTr included in the memory cell MC[k,j]. When a current flows between the wiring RBL[j] and the wiring SL[j] in that state, no current flows between the source and the drain of the transistor RTr included in the memory cell MC[k,j], and a current flows only between the source and the drain of the transistor RTr included in the memory cell MC[i,j] to generate a potential difference therebetween. Therefore, a potential substantially equal to that of the retention node of the memory cell MC[i,j] is output from the drain of the transistor RTr included in the memory cell MC[i,j] to the wiring RBL. The output potential is read out by a reading circuit or the like, whereby data of the memory cell MC[i,j] which has been subjected to addition or subtraction processing can be read out.

Such a configuration makes it possible to obtain a semiconductor device with large storage capacity.

Note that only the semiconductor devices 140[1], 140[j], and 140[n]; the wirings WBL[1], WBL[j], WBL[n], RBL[1], RBL[j], RBL[n], SL[1], SL[j], SL[n], SG[1], SG[j], SG[n], WLC[1], WLC[i], WLC[m], WL[1,1], WL[1,j], WL[1,n], WL[i,1], WL[i,j], WL[i,n], WL[m,1], WL[m,j], and WL[m,n]; the control circuits CTLC[1], CTLC[i], and CTLC[m]; the memory cells MC[1,1], MC[1,j], MC[1,n], MC[i,1], MC[i,j], MC[i,n], MC[m,1], MC[m,j], and MC[m,n]; the transistors STr[1], STr[j], and STr[n] are shown in the semiconductor device 145 of FIG. 11, and the other reference numerals, wirings, elements, and the like are omitted.

Note that this embodiment can be combined with any of the other embodiments in this specification as appropriate.

Embodiment 3

A configuration example of a memory device of one embodiment of the present invention is described with reference to FIG. 12.

Figure 12:
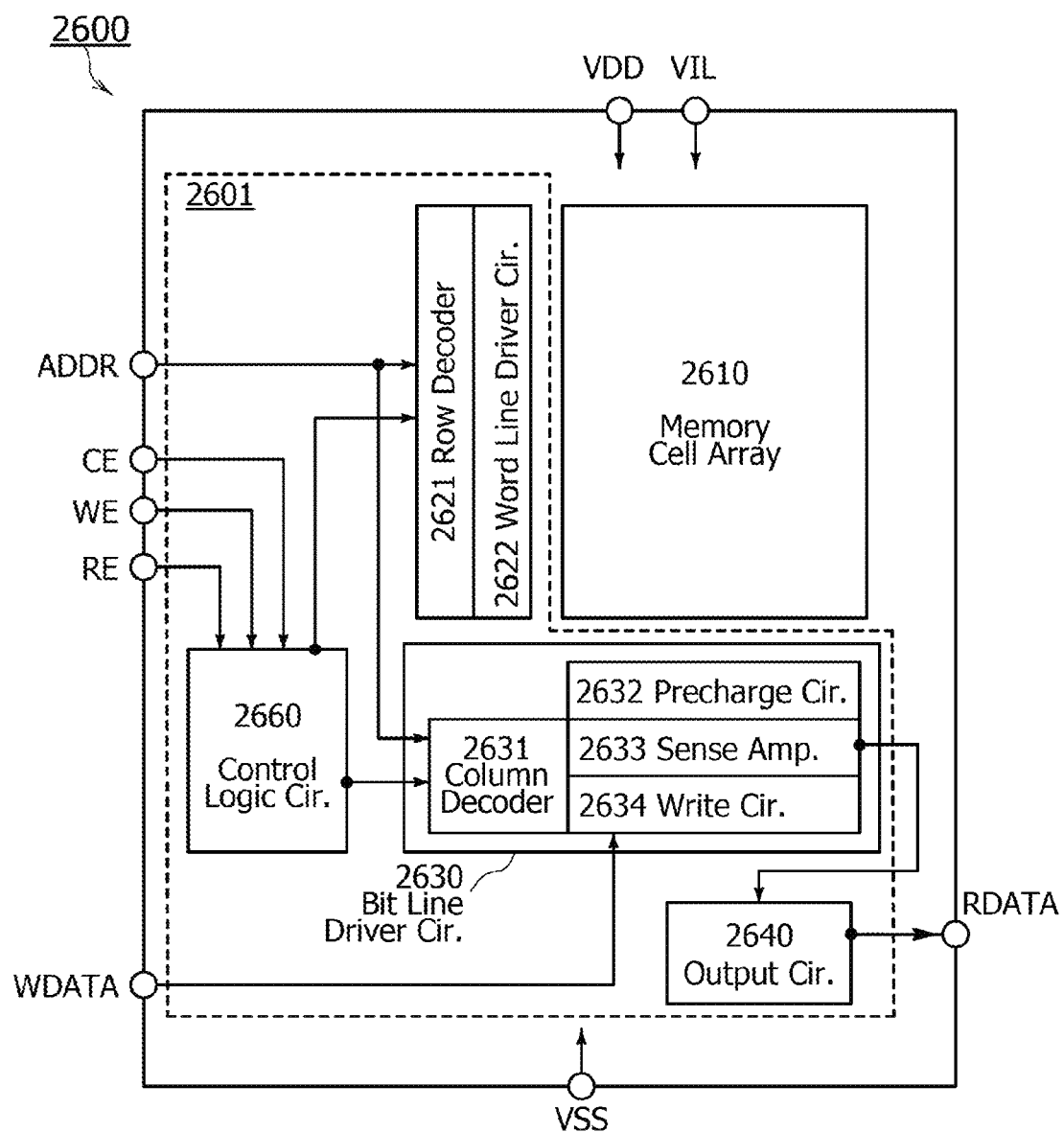
FIG. 12 is a block diagram showing an example of a memory device.

FIG. 12 illustrates a configuration example of a memory device. A memory device 2600 includes a peripheral circuit 2601 and a memory cell array 2610. The peripheral circuit 2601 includes a row decoder 2621, a word line driver circuit 2622, a bit line driver circuit 2630, an output circuit 2640, and a control logic circuit 2660.

The bit line driver circuit 2630 includes a column decoder 2631, a precharge circuit 2632, a sense amplifier 2633, and a write circuit 2634. The precharge circuit 2632 has a function of precharging the wiring BL, the wiring SL, the wiring WBL, and the wiring RBL that are described in Embodiments 1 and 2 (these wirings are not illustrated in FIG. 12). The sense amplifier 2633 has a function of amplifying a data signal read from the wiring BL or the wiring RBL. The amplified data signal is output to the outside of the memory device 2600 as a digital data signal RDATA, via the output circuit 2640.

As power source voltages, a low power source voltage (VSS), a high power source voltage (VDD) for the peripheral circuit 2601, and a high power source voltage (VIL) for the memory cell array 2610 are supplied to the memory device 2600 from the outside.

Control signals (CE, WE, and RE), an address signal ADDR, and a data signal WDATA are input to the memory device 2600 from the outside. The address signal ADDR is input to the row decoder 2621 and the column decoder 2631, and the data signal WDATA is input to the write circuit 2634.

The control logic circuit 2660 processes the signals (CE, WE, RE) input from the outside, and generates control signals for the row decoder 2621 and the column decoder 2631. The signal CE is a chip enable signal, the signal WE is a write enable signal, and the signal RE is a read enable signal. Signals processed by the control logic circuit 2660 are not limited to those listed above, and other control signals may be input as necessary.

Note that whether each circuit or each signal described above is provided or not can be determined as appropriate as needed.

When a p-channel Si transistor and a transistor in which the channel formation region includes an oxide semiconductor (preferably an oxide containing In, Ga, and Zn) described in a later embodiment are used in the memory device 2600, the memory device 2600 can be reduced in size. In addition, the memory device 2600 can be reduced in power consumption. Furthermore, the memory device 2600 can be increased in operation speed. Particularly when the Si transistors are only p-channel ones, the manufacturing cost can be reduced.

Note that the configuration example of this embodiment is not limited to that shown in FIG. 12. The configuration may be changed as appropriate: for example, part of the peripheral circuit 2601, e.g., the precharge circuit 2632 and/or the sense amplifier 2633 may be provided below the memory cell array 2610. For example, in the case where the semiconductor device 135 described in Configuration example 5 or the semiconductor device 145 described in Configuration example 6 of Embodiment 2 is used in the memory cell array 2610, the control circuits CTLC[1] to CTLC[m] may be provided in the periphery of the row decoder 2621 or the word line driver circuit 2622.

Note that this embodiment can be combined with any of the other embodiments in this specification as appropriate.

Embodiment 4

Described in this embodiment are transistors of one embodiment of the disclosed invention.

Transistors according to one embodiment of the present invention each preferably include an nc-OS or a CAAC-OS, which are described in Embodiment 7.

Structure Example 1 of Transistor

Figure 13A:
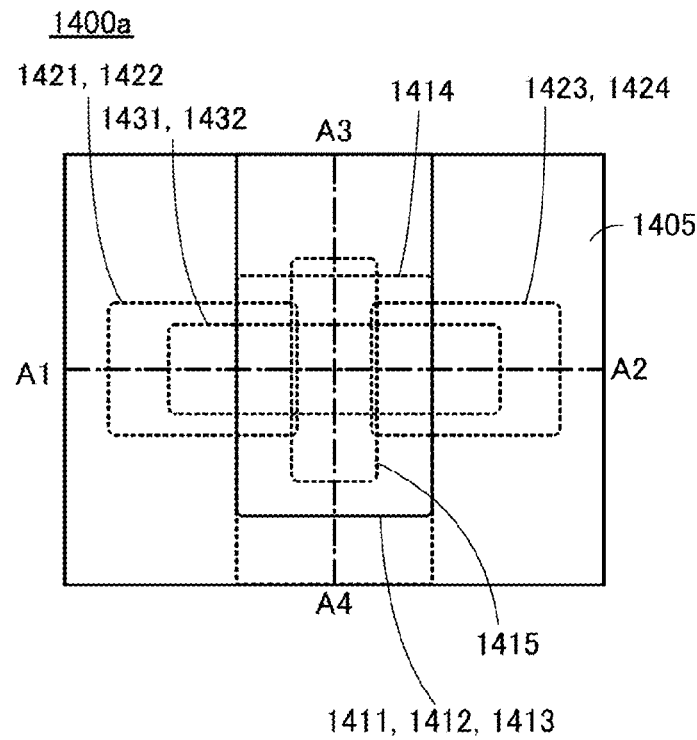
FIGS. 13A to 13C are a top view and cross-sectional views showing a structure example of a transistor.
Figure 13B:
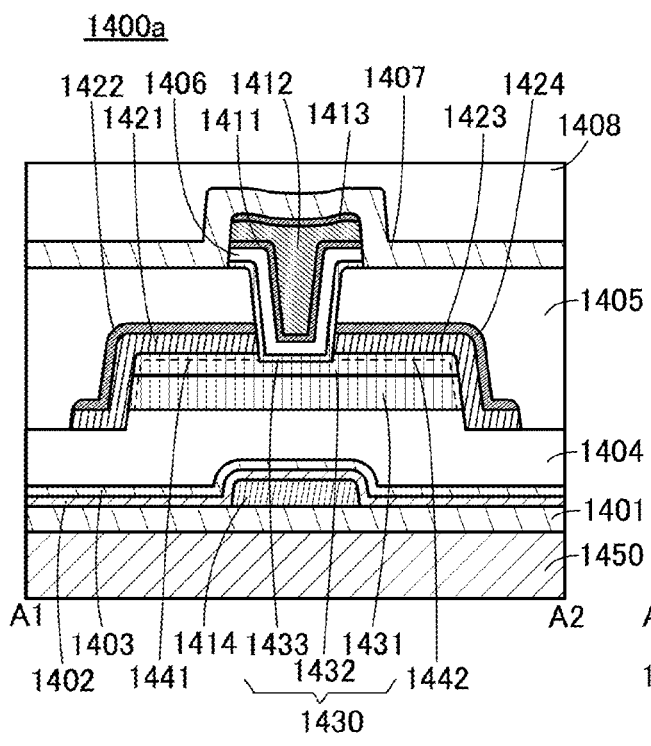
Figure 13C:
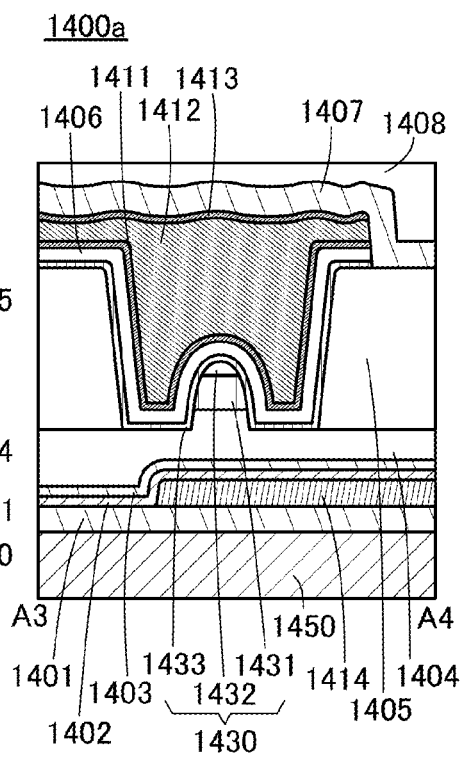

FIGS. 13A to 13C are a top view and cross-sectional views of a transistor 1400a. FIG. 13A is a top view, FIG. 13B is a cross-sectional view taken along dashed-dotted line A1-A2 in FIG. 13A, and FIG. 13C is a cross-sectional view taken along dashed-dotted line A3-A4 in FIG. 13A. Note that for simplification of the drawing, some components are not illustrated in the top view in FIG. 13A. Note that the dashed-dotted line A1-A2 and the dashed-dotted line A3-A4 are sometimes referred to as a channel length direction of the transistor 1400a and a channel width direction of the transistor 1400a, respectively.

The transistor 1400a includes a substrate 1450, an insulating film 1401 over the substrate 1450, a conductive film 1414 over the insulating film 1401, an insulating film 1402 covering the conductive film 1414, an insulating film 1403 over the insulating film 1402, an insulating film 1404 over the insulating film 1403, a metal oxide 1431 and a metal oxide 1432 which are stacked in this order over the insulating film 1404, a conductive film 1421 in contact with top and side surfaces of the metal oxide 1432, a conductive film 1423 also in contact with the top and side surfaces of the metal oxide 1432, a conductive film 1422 over the conductive film 1421, a conductive film 1424 over the conductive film 1423, an insulating film 1405 over the conductive films 1422 and 1424, a metal oxide 1433 in contact with the metal oxides 1431 and 1432, the conductive films 1421 to 1424, and the insulating film 1405, an insulating film 1406 over the metal oxide 1433, a conductive film 1411 over the insulating film 1406, a conductive film 1412 over the conductive film 1411, a conductive film 1413 over the conductive film 1412, an insulating film 1407 covering the conductive film 1413, and an insulating film 1408 over the insulating film 1407. Note that the metal oxides 1431 to 1433 are collectively referred to as a metal oxide 1430.

The metal oxide 1432 is a semiconductor and serves as a channel of the transistor 1400a.

Furthermore, the metal oxides 1431 and 1432 include a region 1441 and a region 1442. The region 1441 is formed in the vicinity of a region where the conductive film 1421 is in contact with the metal oxides 1431 and 1432. The region 1442 is formed in the vicinity of a region where the conductive film 1423 is in contact with the metal oxides 1431 and 1432.

The regions 1441 and 1442 serve as low-resistance regions. The region 1441 contributes to a decrease in the contact resistance between the conductive film 1421 and the metal oxides 1431 and 1432. The region 1442 also contributes to a decrease in the contact resistance between the conductive film 1423 and the metal oxides 1431 and 1432.

The conductive films 1421 and 1422 serve as one of source and drain electrodes of the transistor 1400a. The conductive films 1423 and 1424 serve as the other of the source and drain electrodes of the transistor 1400a.

The conductive film 1422 is configured to allow less oxygen to pass therethrough than the conductive film 1421. It is thus possible to prevent a decrease in the conductivity of the conductive film 1421 due to oxidation.

The conductive film 1424 is also configured to allow less oxygen to pass therethrough than the conductive film 1423. It is thus possible to prevent a decrease in the conductivity of the conductive film 1423 due to oxidation.

The conductive films 1411 to 1413 serve as a first gate electrode of the transistor 1400a.

The conductive films 1411 and 1413 are configured to allow less oxygen to pass therethrough than the conductive film 1412. It is thus possible to prevent a decrease in the conductivity of the conductive film 1412 due to oxidation.

The insulating film 1406 serves as a first gate insulating film of the transistor 1400a.

The conductive film 1414 serves as a second gate electrode of the transistor 1400a.

The potential applied to the conductive films 1411 to 1413 may be the same as or different from that applied to the conductive film 1414. The conductive film 1414 may be omitted in some cases.

The insulating films 1401 to 1404 serve as a base insulating film of the transistor 1400a. The insulating films 1402 to 1404 also serve as a second gate insulating film of the transistor 1400a.

The insulating films 1405 to 1408 serve as a protective insulating film or an interlayer insulating film of the transistor 1400a.

As shown in FIG. 13C, the side surface of the metal oxide 1432 is surrounded by the conductive film 1411. With this structure, the metal oxide 1432 can be electrically surrounded by an electric field of the conductive film 1411. Such a structure of a transistor in which a semiconductor is electrically surrounded by an electric field of a gate electrode is referred to as a surrounded channel (s-channel) structure. Since a channel is formed in the entire metal oxide 1432 (bulk) in the s-channel structure, a large amount of current can flow between a source and a drain of a transistor, increasing the on-state current of the transistor.

The s-channel structure, because of its high on-state current, is suitable for a semiconductor device such as large-scale integration (LSI) which requires a miniaturized transistor. A semiconductor device including the miniaturized transistor can have a high integration degree and high density.

In the transistor 1400a, a region serving as a gate electrode is formed so as to fill an opening 1415 formed in the insulating film 1405 or the like, that is, in a self-aligned manner.

As shown in FIG. 13B, the conductive films 1411 and 1422 have a region where they overlap with each other with the insulating film positioned therebetween. The conductive films 1411 and 1423 also have a region where they overlap with each other with the insulating film positioned therebetween. These regions serve as the parasitic capacitance caused between the gate electrode and the source or drain electrode and might decrease the operation speed of the transistor 1400a. This parasitic capacitance can be reduced by providing the insulating film 1405 in the transistor 1400a. The insulating film 1405 preferably contains a material with a low relative dielectric constant.

Figure 14A:
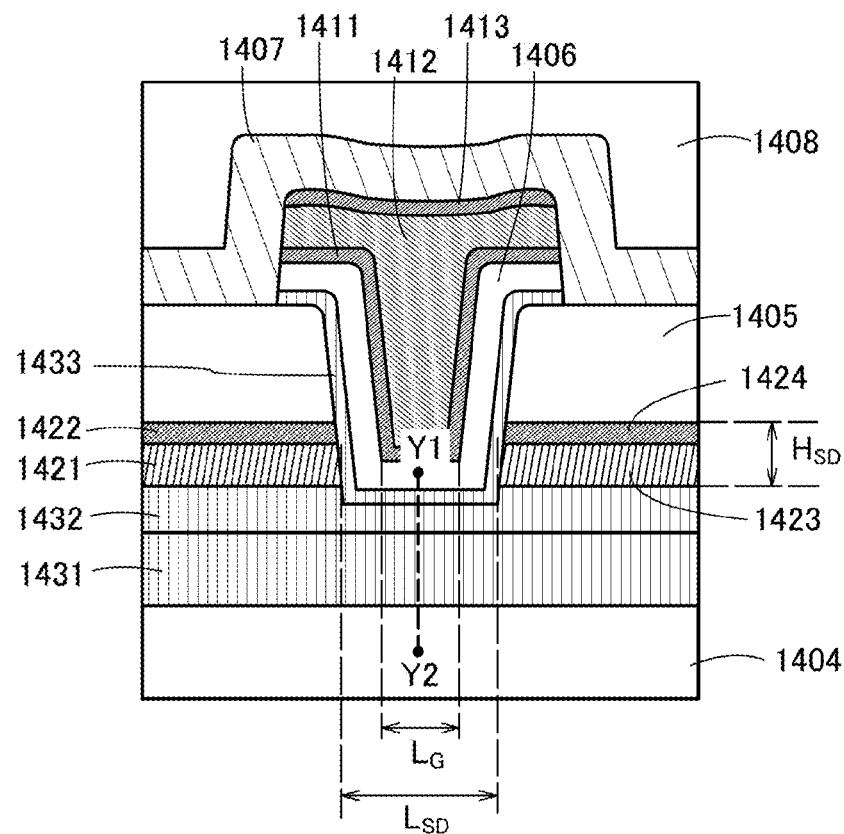
FIG. 14A is a cross-sectional view illustrating a structural example of a transistor.

FIG. 14A is an enlarged view of the center of the transistor 1400a. In FIG. 14A, a width $L_G$ denotes the length of the bottom surface of the conductive film 1411, which faces parallel to the top surface of the metal oxide 1432 with the insulating film 1406 and the metal oxide 1433 positioned therebetween. The width $L_G$ is the line width of the gate electrode. In FIG. 14A, a width $L_{SD}$ denotes the length between the conductive films 1421 and 1423, i.e., the length between the source electrode and the drain electrode.

The width $L_{SD}$ is generally determined by the minimum feature size. As shown in FIG. 14A, the width $L_G$ is narrower than the width $L_{SD}$. This means that in the transistor 1400a, the line width of the gate electrode can be made narrower than the minimum feature size; specifically, the width $L_G$ can be greater than or equal to 5 nm and less than or equal to 60 nm, preferably greater than or equal to 5 nm and less than or equal to 30 nm.

In FIG. 14A, a height $H_{SD}$ denotes the total thickness of the conductive films 1421 and 1422, or the total thickness of the conductive films 1423 and 1424.

The thickness of the insulating film 1406 is preferably less than or equal to the height $H_{SD}$, in which case the electric field of the gate electrode can be applied to the entire channel formation region. The thickness of the insulating film 1406 is less than or equal to 30 nm, preferably less than or equal to 10 nm.

The parasitic capacitance between the conductive films 1422 and 1411 and the parasitic capacitance between the conductive films 1424 and 1411 are inversely proportional to the thickness of the insulating film 1405. For example, the thickness of the insulating film 1405 is preferably three times or more, and further preferably five times or more the thickness of the insulating film 1406, in which case the parasitic capacitance is negligibly small. As a result, the transistor 1400a can operate at high frequencies.

Components of the transistor 1400a are described below.

<<Metal Oxide Layer>>

First, a metal oxide that can be used as the metal oxides 1431 to 1433 is described.

The transistor 1400a preferably has a low current (off-state current) flowing between a source and a drain in the non-conduction state. Examples of the transistor with a low off-state current include a transistor including an oxide semiconductor in a channel formation region.

The metal oxide 1432 is an oxide semiconductor containing indium (In), for example. The metal oxide 1432 can have high carrier mobility (electron mobility) by containing indium, for example. The metal oxide 1432 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the metal oxide, for example. Furthermore, the metal oxide 1432 preferably contains zinc (Zn). When containing zinc, the metal oxide is easily crystallized in some cases.

Note that the metal oxide 1432 is not limited to the oxide semiconductor containing indium. The metal oxide 1432 may be an oxide semiconductor that does not contain indium and contains at least one of zinc, gallium, and tin (e.g., a zinc tin oxide or a gallium tin oxide).

For the metal oxide 1432, an oxide semiconductor with a wide energy gap is used, for example. The energy gap of the metal oxide 1432 is, for example, greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

The metal oxide 1432 is preferably a CAAC-OS film which is described later.

The metal oxides 1431 and 1433 include, for example, one or more, or two or more elements other than oxygen included in the metal oxide 1432. Since the metal oxides 1431 and 1433 include one or more, or two or more elements other than oxygen included in the metal oxide 1432, an interface state is less likely to be formed at an interface between the metal oxides 1431 and 1432 and an interface between the metal oxides 1432 and 1433.

In the case of using an In-M-Zn oxide as the metal oxide 1431, when the total proportion of In and M is assumed to be 100 atomic %, the proportions of In and M are preferably set to be lower than 50 atomic % and higher than 50 atomic %, respectively, further preferably lower than 25 atomic % and higher than 75 atomic %, respectively. When the metal oxide 1431 is formed by a sputtering method, a sputtering target with an atomic ratio of In:M:Zn=1:3:2, In:M:Zn=1:3:4, or the like can be used.

In the case of using an In-M-Zn oxide as the metal oxide 1432, when the total proportion of In and M is assumed to be 100 atomic %, the proportions of In and M are preferably set to be higher than 25 atomic % and lower than 75 atomic %, respectively, further preferably higher than 34 atomic % and lower than 66 atomic %, respectively. When the metal oxide 1432 is formed by a sputtering method, a sputtering target with the above composition is preferably used. For example, In:M:Zn is preferably 1:1:1, 1:1:1.2, 2:1:3, 3:1:2, or 4:2:4.1. In particular, when a sputtering target with an atomic ratio of In:Ga:Zn=4:2:4.1 is used, the atomic ratio of In to Ga and Zn in the metal oxide 1432 may be 4:2:3 or in the neighborhood of 4:2:3.

In the case of using an In-M-Zn oxide as the metal oxide 1433, when the total proportion of In and M is assumed to be 100 atomic %, the proportions of In and M are preferably set to be lower than 50 atomic % and higher than 50 atomic %, respectively, further preferably lower than 25 atomic % and higher than 75 atomic %, respectively. For example, In:M:Zn is preferably 1:3:2 or 1:3:4. The metal oxide 1433 may be a metal oxide that is the same type as that of the metal oxide 1431.

The metal oxide 1431 or the metal oxide 1433 does not necessarily contain indium in some cases. For example, the metal oxide 1431 or the metal oxide 1433 may be gallium oxide.

Figure 14B:
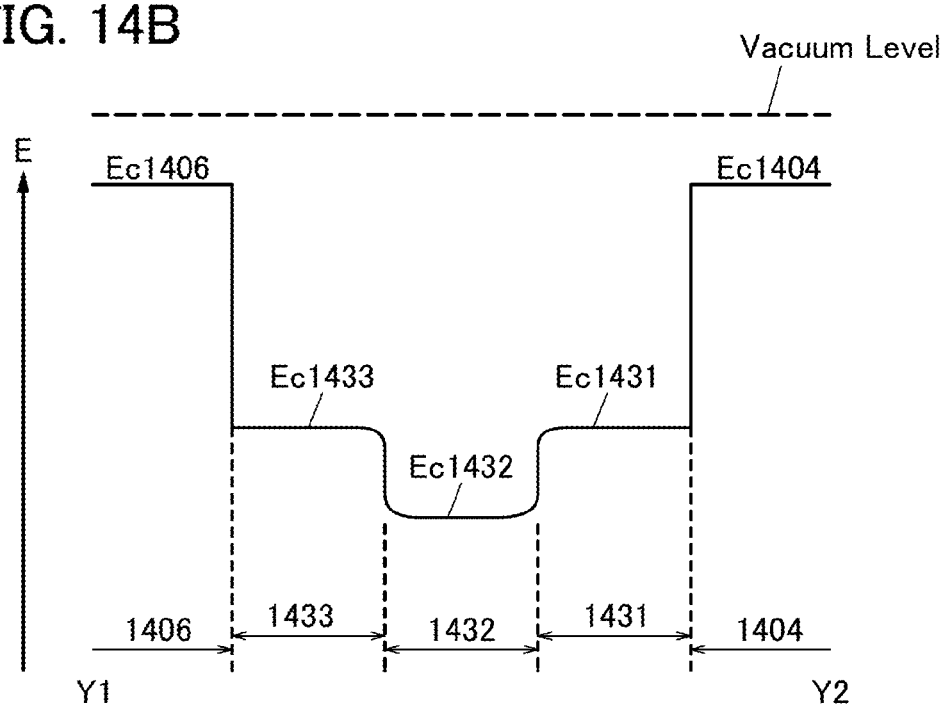
FIG. 14B is an energy band diagram of the transistor.

Next, the function and effect of the metal oxide 1430, which includes a stack of the metal oxides 1431 to 1433, are described with reference to the energy band diagram of FIG. 14B. FIG. 14B shows an energy band structure of a portion taken along dashed line Y1-Y2 in FIG. 14A, that is, the energy band structure of a channel formation region of the transistor 1400a and the vicinity thereof.

In FIG. 14B, Ec1404, Ec1431, Ec1432, Ec1433, and Ec1406 indicate the energy at the bottom of the conduction band of the insulating film 1404, the metal oxide 1431, the metal oxide 1432, the metal oxide 1433, and the insulating film 1406, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). Note that the energy gap can be measured using a spectroscopic ellipsometer. The energy difference between the vacuum level and the top of the valence band can be measured using an ultraviolet photoelectron spectroscopy (UPS) device.

Since the insulating films 1404 and 1406 are insulators, Ec1406 and Ec1404 are closer to the vacuum level (i.e., have a lower electron affinity) than Ec1431, Ec1432, and Ec1433.

The metal oxide 1432 is a metal oxide having higher electron affinity than those of the metal oxides 1431 and 1433. For example, as the metal oxide 1432, a metal oxide having an electron affinity higher than those of the metal oxides 1431 and 1433 by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used. Note that the electron affinity is an energy gap between the vacuum level and the bottom of the conduction band.

An indium gallium oxide has low electron affinity and a high oxygen-blocking property. Therefore, the metal oxide 1433 preferably includes an indium gallium oxide. The gallium atomic ratio [Ga/(In+Ga)] is, for example, higher than or equal to 70%, preferably higher than or equal to 80%, further preferably higher than or equal to 90%.

At this time, when gate voltage is applied, a channel is formed in the metal oxide 1432 having the highest electron affinity among the metal oxides 1431 to 1433.

Therefore, electrons move mainly in the metal oxide 1432, not in the metal oxides 1431 and 1433. Hence, the on-state current hardly varies even when the interface state density, which inhibits electron movement, is high at the interface between the metal oxide 1431 and the insulating film 1404 or at the interface between the metal oxide 1433 and the insulating film 1406. The metal oxides 1431 and 1433 have a function as an insulating film.

In some cases, there is a mixed region of the metal oxides 1431 and 1432 between the metal oxides 1431 and 1432. Furthermore, in some cases, there is a mixed region of the metal oxides 1432 and 1433 between the metal oxides 1432 and 1433. Because the mixed region has a low interface state density, a stack of the metal oxides 1431 to 1433 has a band structure where energy at each interface and in the vicinity of the interface is changed continuously (continuous junction).

As described above, the interface between the metal oxides 1431 and 1432 or the interface between the metal oxides 1432 and 1433 has a low interface state density. Hence, electron movement in the metal oxide 1432 is less likely to be inhibited and the on-state current of the transistor can be increased.

Electron movement in the transistor is inhibited, for example, in the case where physical unevenness in a channel formation region is large. To increase the on-state current of the transistor, for example, root mean square (RMS) roughness with a measurement area of 1 μm×1 μm of a top surface or a bottom surface of the metal oxide 1432 (a formation surface; here, the top surface of the metal oxide 1431) is less than 1 nm, preferably less than 0.6 nm, further preferably less than 0.5 nm, still further preferably less than 0.4 nm. The average surface roughness (Ra) with the measurement area of 1 μm×1 μm is less than 1 nm, preferably less than 0.6 nm, further preferably less than 0.5 nm, still further preferably less than 0.4 nm. The maximum difference (P-V) with the measurement area of 1 μm×1 μm is less than 10 nm, preferably less than 9 nm, further preferably less than 8 nm, still further preferably less than 7 nm. The RMS roughness, Ra, and P-V can be measured with, for example, a scanning probe microscope SPA-500 manufactured by SII Nano Technology Inc.

The electron movement is also inhibited in the case where the density of defect states is high in the channel formation region. For example, in the case where the metal oxide 1432 contains oxygen vacancies (Vo), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the metal oxide 1432, the on-state current of the transistor can be increased in some cases.

For example, at a certain depth in the metal oxide 1432 or in a certain region of the metal oxide 1432, the concentration of hydrogen measured by secondary ion mass spectrometry (SIMS) is set to be higher than or equal to $1 \times 10^{16}$ atoms/cm$^3$ and lower than or equal to $2 \times 10^{20}$ atoms/cm$^3$, preferably higher than or equal to $1 \times 10^{16}$ atoms/cm$^3$ and lower than or equal to $5 \times 10^{19}$ atoms/cm$^3$, further preferably higher than or equal to $1 \times 10^{16}$ atoms/cm$^3$ and lower than or equal to $1 \times 10^{19}$ atoms/cm$^3$, still more preferably higher than or equal to $1 \times 10^{16}$ atoms/cm$^3$ and lower than or equal to $5 \times 10^{18}$ atoms/cm$^3$.

To decrease oxygen vacancies in the metal oxide 1432, for example, there is a method in which excess oxygen contained in the insulating film 1404 is moved to the metal oxide 1432 through the metal oxide 1431. In that case, the metal oxide 1431 is preferably a layer having an oxygen-transmitting property (a layer through which oxygen passes or is transmitted).

Note that in the case where the transistor has an s-channel structure, a channel is formed in the entire metal oxide 1432. Therefore, as the metal oxide 1432 has larger thickness, a channel region becomes larger. In other words, the thicker the metal oxide 1432 is, the larger the on-state current of the transistor is.

Moreover, the thickness of the metal oxide 1433 is preferably as small as possible to increase the on-state current of the transistor. For example, the metal oxide 1433 has a region with a thickness of less than 10 nm, preferably less than or equal to 5 nm, further preferably less than or equal to 3 nm. Meanwhile, the metal oxide 1433 has a function of blocking entry of elements other than oxygen (such as hydrogen and silicon) included in the adjacent insulator into the metal oxide 1432 where a channel is formed. Thus, the metal oxide 1433 preferably has a certain thickness. For example, the metal oxide 1433 may have a region with a thickness of greater than or equal to 0.3 nm, preferably greater than or equal to 1 nm, further preferably greater than or equal to 2 nm. The metal oxide 1433 preferably has an oxygen blocking property to inhibit outward diffusion of oxygen released from the insulating film 1404 and the like.

To improve reliability, preferably, the thickness of the metal oxide 1431 is large and the thickness of the metal oxide 1433 is small. For example, the metal oxide 1431 has a region with a thickness of greater than or equal to 10 nm, preferably greater than or equal to 20 nm, further preferably greater than or equal to 40 nm, still further preferably greater than or equal to 60 nm. An increase in the thickness of the metal oxide 1431 can increase the distance from the interface between the adjacent insulator and the metal oxide 1431 to the metal oxide 1432 where a channel is formed. Note that the metal oxide 1431 has a region with a thickness of, for example, less than or equal to 200 nm, preferably less than or equal to 120 nm, further preferably less than or equal to 80 nm, otherwise the productivity of the semiconductor device might be decreased.

For example, a region in which the concentration of silicon is higher than or equal to $1 \times 10^{16}$ atoms/cm$^3$ and lower than $1 \times 10^{19}$ atoms/cm$^3$ is provided between the metal oxides 1432 and 1431. The concentration of silicon is preferably higher than or equal to $1 \times 10^{16}$ atoms/cm$^3$ and lower than $5 \times 10^{18}$ atoms/cm$^3$, further preferably higher than or equal to $1 \times 10^{16}$ atoms/cm$^3$ and lower than $2 \times 10^{18}$ atoms/cm$^3$. A region in which the concentration of silicon is higher than or equal to $1 \times 10^{16}$ atoms/cm$^3$ and lower than $1 \times 10^{19}$ atoms/cm$^3$ is provided between the metal oxides 1432 and 1433. The concentration of silicon is preferably higher than or equal to $1 \times 10^{16}$ atoms/cm$^3$ and lower than $5 \times 10^{18}$ atoms/cm$^3$, further preferably higher than or equal to $1 \times 10^{16}$ atoms/cm$^3$ and lower than $2 \times 10^{18}$ atoms/cm$^3$. The concentration of silicon can be measured by SIMS.

It is preferable to reduce the concentration of hydrogen in the metal oxides 1431 and 1433 in order to reduce the concentration of hydrogen in the metal oxide 1432. The metal oxides 1431 and 1433 each have a region in which the concentration of hydrogen is higher than or equal to $1 \times 10^{16}$ atoms/cm$^3$ and lower than or equal to $2 \times 10^{20}$ atoms/cm$^3$. The concentration of hydrogen is preferably higher than or equal to $1 \times 10^{16}$ atoms/cm$^3$ and lower than or equal to $5 \times 10^{19}$ atoms/cm$^3$, further preferably higher than or equal to $1 \times 10^{16}$ atoms/cm$^3$ and lower than or equal to $1 \times 10^{19}$ atoms/cm$^3$, still further preferably higher than or equal to $1 \times 10^{16}$ atoms/cm$^3$ and lower than or equal to $5 \times 10^{18}$ atoms/cm$^3$. The concentration of hydrogen can be measured by SIMS. It is also preferable to reduce the concentration of nitrogen in the metal oxides 1431 and 1433 in order to reduce the concentration of nitrogen in the metal oxide 1432. The metal oxides 1431 and 1433 each have a region in which the concentration of nitrogen is higher than or equal to $1 \times 10^{16}$ atoms/cm$^3$ and lower than $5 \times 10^{19}$ atoms/cm$^3$. The concentration of nitrogen is preferably higher than or equal to $1 \times 10^{16}$ atoms/cm$^3$ and lower than or equal to $5 \times 10^{18}$ atoms/cm$^3$, further preferably higher than or equal to $1 \times 10^{16}$ atoms/cm$^3$ and lower than or equal to $1 \times 10^{18}$ atoms/cm$^3$, still further preferably higher than or equal to $1 \times 10^{16}$ atoms/cm$^3$ and lower than or equal to $5 \times 10^{17}$ atoms/cm$^3$. The concentration of nitrogen can be measured by SIMS.

The metal oxides 1431 to 1433 may be formed by a sputtering method, a chemical vapor deposition (CVD) method, a molecular beam epitaxy (MBE) method, a pulsed laser deposition (PLD) method, an atomic layer deposition (ALD) method, or the like.

After the metal oxides 1431 and 1432 are formed, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The crystallinity of the metal oxides 1431 and 1432 can be increased by the first heat treatment. Furthermore, impurities such as hydrogen and water can be removed by the first heat treatment.

The above three-layer structure is an example. For example, a two-layer structure without one of the metal oxides 1431 and 1433 may be employed. Alternatively, any one of the metal oxides 1431 to 1433 may be provided over or below the metal oxide 1431 or over or below the metal oxide 1433, i.e., a four-layer structure may be employed. Further alternatively, an n-layer structure (n is an integer of 5 or more) in which any one of the metal oxides 1431 to 1433 is provided at two or more of the following positions may be employed: over the metal oxide 1431, below the metal oxide 1431, over the metal oxide 1433, and below the metal oxide 1433.

<<Substrate>>

As the substrate 1450, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. The semiconductor substrate may be a silicon on insulator (SOI) substrate in which an insulating region is provided in the above semiconductor substrate. Examples of the conductor substrate include a graphite substrate, a metal substrate, an alloy substrate, and a conductive resin substrate. A substrate including a metal nitride, a substrate including a metal oxide, or the like can also be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. Examples of the element provided over the substrate include a capacitor, a resistor, a switching element, a light-emitting element, and a memory element.

A flexible substrate may be used as the substrate 1450. As a method for providing a transistor over a flexible substrate, there is a method in which a transistor is formed over a non-flexible substrate, and then the transistor is separated and transferred to the substrate 1450 which is a flexible substrate. In that case, a separation layer is preferably provided between the non-flexible substrate and the transistor. As the substrate 1450, a sheet, a film, or foil containing a fiber may be used. The substrate 1450 may have elasticity. The substrate 1450 may have a property of returning to its original shape when bending or pulling is stopped. Alternatively, the substrate 1450 may have a property of not returning to its original shape. The thickness of the substrate 1450 is, for example, greater than or equal to 5 µm and less than or equal to 700 µm, preferably greater than or equal to 10 µm and less than or equal to 500 µm, further preferably greater than or equal to 15 µm and less than or equal to 300 µm. When the substrate 1450 has a small thickness, the weight of the semiconductor device can be reduced. When the substrate 1450 has a small thickness, even in the case of using glass or the like, the substrate 1450 may have elasticity or a property of returning to its original shape when bending or pulling is stopped. Therefore, an impact applied to the semiconductor device over the substrate 1450, which is caused by dropping or the like, can be reduced. That is, a durable semiconductor device can be provided.

For the flexible substrate 1450, metal, an alloy, a resin, glass, or fiber thereof can be used, for example. The flexible substrate 1450 preferably has a lower coefficient of linear expansion because deformation due to an environment is suppressed. The flexible substrate 1450 is preferably formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 1450 because of its low coefficient of linear expansion.

<<Base Insulating Film>>

The insulating film 1401 has a function of electrically isolating the substrate 1450 from the conductive film 1414.

The insulating film 1401 or 1402 is formed using an insulating film having a single-layer structure or a layered structure. Examples of the material of an insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulating film 1402 may be formed using silicon oxide with high step coverage which is formed by reacting tetraethyl orthosilicate (TEOS), silane, or the like with oxygen, nitrous oxide, or the like.

After the insulating film 1402 is formed, the insulating film 1402 may be subjected to planarization treatment using a CMP method or the like to improve the planarity of the top surface thereof.

The insulating film 1404 preferably contains an oxide. In particular, the insulating film 1404 preferably contains an oxide material from which part of oxygen is released by heating. The insulating film 1404 preferably contains an oxide containing oxygen more than that in the stoichiometric composition. Part of oxygen is released by heating from an oxide film containing oxygen more than that in the stoichiometric composition. Oxygen released from the insulating film 1404 is supplied to the metal oxide 1430, so that oxygen vacancies in the metal oxide 1430 can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulating film 1404 preferably contains an oxide that can supply oxygen to the metal oxide 1430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulating film 1404.

To make the insulating film 1404 contain excess oxygen, the insulating film 1404 is formed in an oxygen atmosphere, for example. Alternatively, a region containing excess oxygen may be formed by introducing oxygen into the insulating film 1404 that has been formed. Both the methods may be combined.

For example, oxygen (at least including any of oxygen radicals, oxygen atoms, and oxygen ions) may be introduced into the insulating film 1404 that has been formed, so that a region containing excess oxygen is formed. Oxygen can be introduced by, for example, an ion implantation method, an ion doping method, a plasma immersion ion implantation method, plasma treatment, or the like.

A gas containing oxygen can be used in an oxygen introducing method. Examples of the gas containing oxygen include oxygen, nitrous oxide, nitrogen dioxide, carbon dioxide, and carbon monoxide. Furthermore, a rare gas may be included in the gas containing oxygen for the oxygen introducing treatment. Moreover, hydrogen or the like may be included. For example, a mixed gas of carbon dioxide, hydrogen, and argon may be used.

After the insulating film 1404 is formed, the insulating film 1404 may be subjected to planarization treatment using a CMP method or the like to improve the planarity of the top surface thereof.

The insulating film 1403 has a passivation function of preventing oxygen contained in the insulating film 1404 from decreasing by bonding to metal contained in the conductive film 1414.

The insulating film 1403 has a function of blocking oxygen, hydrogen, water, alkali metal, alkaline earth metal, and the like. Providing the insulating film 1403 can prevent outward diffusion of oxygen from the metal oxide 1430 and entry of hydrogen, water, or the like into the metal oxide 1430 from the outside.

The insulating film 1403 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

The threshold voltage of the transistor 1400a can be controlled by injecting electrons into a charge trap layer. The charge trap layer is preferably provided in the insulating film 1402 or the insulating film 1403. For example, when the insulating film 1403 is formed using hafnium oxide, aluminum oxide, tantalum oxide, aluminum silicate, or the like, the insulating film 1403 can function as a charge trap layer.

<<Gate Electrode>>

The conductive films 1411 to 1414 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

<<Source Electrode and Drain Electrode>>

The conductive films 1421 to 1424 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

The conductive films 1421 to 1424 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

<<Low-Resistance Region>>

The regions 1441 and 1442 are formed when, for example, the conductive films 1421 and 1423 take oxygen from the metal oxides 1431 and 1432. Oxygen is more likely to be extracted at higher temperatures. Oxygen vacancies are formed in the regions 1441 and 1442 through several heating steps in the manufacturing process of the transistor. In addition, hydrogen enters sites of the oxygen vacancies by heating, increasing the carrier concentration in the regions 1441 and 1442. As a result, the resistance of the regions 1441 and 1442 is reduced.

<<Gate Insulating Film>>

The insulating film 1406 preferably contains an insulator with a high relative dielectric constant. For example, the insulating film 1406 preferably contains gallium oxide, hafnium oxide, an oxide containing aluminum and hafnium, oxynitride containing aluminum and hafnium, an oxide containing silicon and hafnium, or oxynitride containing silicon and hafnium.

The insulating film 1406 preferably has a layered structure containing silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the layered structure to be thermally stable and have a high relative dielectric constant. For example, when aluminum oxide, gallium oxide, or hafnium oxide is closer to the metal oxide 1433, entry of silicon from silicon oxide or silicon oxynitride into the metal oxide 1432 can be suppressed.

When silicon oxide or silicon oxynitride is closer to the metal oxide 1433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

<<Interlayer Insulating Film and Protective Insulating Film>>

The insulating film 1405 preferably contains an insulator with a low relative dielectric constant. For example, the insulating film 1405 preferably contains silicon oxide, silicon oxynitride, silicon nitride oxide, silicon nitride, or a resin. Alternatively, the insulating film 1405 preferably has a layered structure containing silicon oxide or silicon oxynitride and a resin. Because silicon oxide and silicon oxynitride have thermal stability, combination of silicon oxide or silicon oxynitride with a resin allows the layered structure to be thermally stable and have a low relative dielectric constant. Examples of the resin include polyester, polyolefin, polyamide (e.g., nylon or aramid), polyimide, polycarbonate, and acrylic.

The insulating film 1407 has a function of blocking oxygen, hydrogen, water, alkali metal, alkaline earth metal, and the like. Providing the insulating film 1407 can prevent outward diffusion of oxygen from the metal oxide 1430 and entry of hydrogen, water, or the like into the metal oxide 1430 from the outside.

The insulating film 1407 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

An aluminum oxide film is preferably used as the insulating film 1407 because it is highly effective in preventing transmission of both oxygen and impurities such as hydrogen and moisture.

When the insulating film 1407 is formed by a method using plasma containing oxygen, e.g., by a sputtering method or a CVD method, oxygen can be added to side and top surfaces of the insulating films 1405 and 1406. It is preferable to perform second heat treatment at any time after the formation of the insulating film 1407. Through the second heat treatment, oxygen added to the insulating films 1405 and 1406 is diffused in the insulating films to reach the metal oxide 1430, whereby oxygen vacancies in the metal oxide 1430 can be reduced.

Figure 15A:
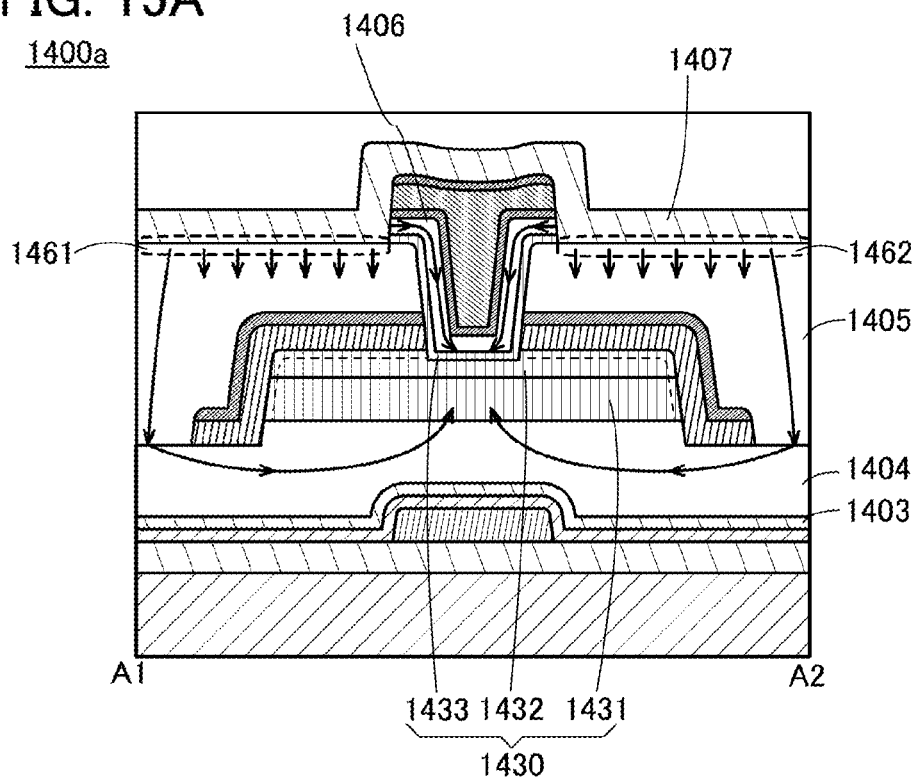
FIGS. 15A and 15B are cross-sectional views illustrating oxygen diffusion paths.
Figure 15B:
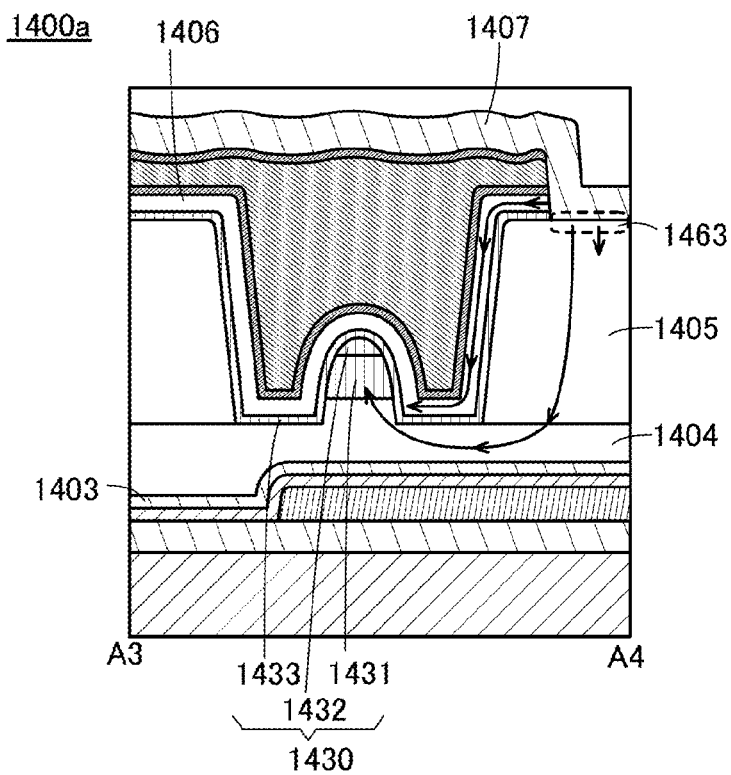

In schematic views of FIGS. 15A and 15B, oxygen added to the insulating films 1405 and 1406 in the formation of the insulating film 1407 is diffused in the insulating films through the second heat treatment and reaches the metal oxide 1430. In FIG. 15A, oxygen diffused in the cross-sectional view of FIG. 13B is indicated by arrows. In FIG. 15B, oxygen diffused in the cross-sectional view of FIG. 13C is indicated by arrows.

As shown in FIGS. 15A and 15B, oxygen added to the side surface of the insulating film 1406 is diffused in the insulating film 1406 and reaches the metal oxide 1430. In addition, a region 1461, a region 1462, and a region 1463 each containing excess oxygen are sometimes formed in the vicinity of the interface between the insulating films 1407 and 1405. Oxygen contained in the regions 1461 to 1463 reaches the metal oxide 1430 through the insulating films 1405 and 1404. In the case where the insulating film 1405 includes silicon oxide and the insulating film 1407 includes aluminum oxide, a mixed layer of silicon, aluminum, and oxygen is formed in the regions 1461 to 1463 in some cases.

The insulating film 1407 has a function of blocking oxygen and prevents oxygen from being diffused over the insulating film 1407. The insulating film 1403 also has a function of blocking oxygen and prevents oxygen from being diffused under the insulating film 1403.

Note that the second heat treatment may be performed at a temperature that allows oxygen added to the insulating films 1405 and 1406 to be diffused to the metal oxide 1430. For example, the description of the first heat treatment may be referred to for the second heat treatment. Alternatively, the temperature of the second heat treatment is preferably lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of oxygen from the insulating film 1404 can be inhibited. Note that the second heat treatment is not necessarily performed when heating during formation of the films can work as heat treatment comparable to the second heat treatment.

As described above, oxygen can be supplied to the metal oxide 1430 from above and below through the formation of the insulating film 1407 and the second heat treatment.

Alternatively, oxygen can be added to the insulating films 1405 and 1406 by forming a film containing indium oxide, e.g., an In-M-Zn oxide, as the insulating film 1407.

The insulating film 1408 can be formed using an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, for the insulating film 1408, a resin such as a polyimide resin, a polyamide resin, an acrylic resin, a siloxane resin, an epoxy resin, or a phenol resin can be used. The insulating film 1408 may be a stack including any of the above materials.

Structure Example 2 of Transistor

The conductive film 1414 and the insulating films 1402 and 1403 can be omitted in the transistor 1400a illustrated in FIGS. 13A to 13C. An example of such a structure is illustrated in FIGS. 16A to 16C.

Figure 16A:
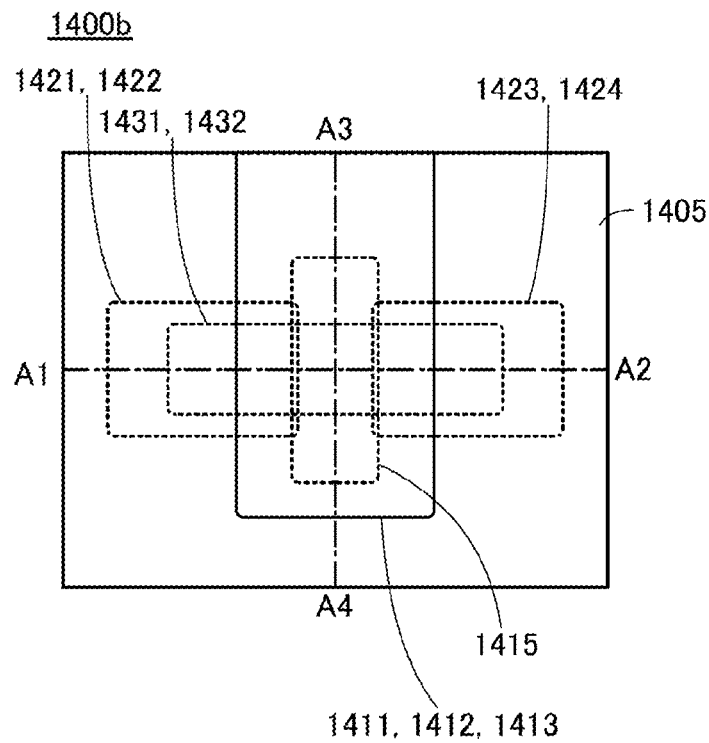
FIGS. 16A to 16C are a top view and cross-sectional views illustrating a structure example of a transistor.
Figure 16B:
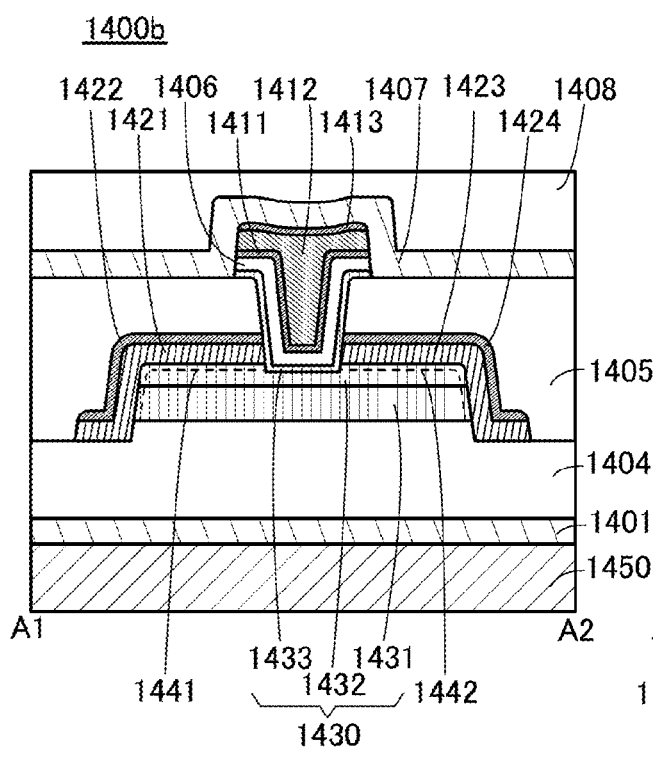
Figure 16C:
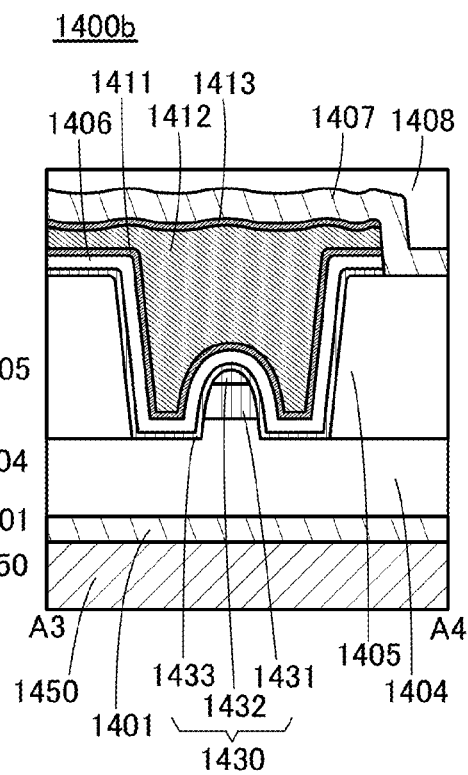

FIGS. 16A to 16C are a top view and cross-sectional views of a transistor 1400b. FIG. 16A is a top view. FIG. 16B is a cross-sectional view taken along dashed-dotted line A1-A2 in FIG. 16A, and FIG. 16C is a cross-sectional view taken along dashed-dotted line A3-A4 in FIG. 16A. Note that for simplification of the drawing, some components are not illustrated in the top view in FIG. 16A. Note that the dashed-dotted line A1-A2 and the dashed-dotted line A3-A4 are sometimes referred to as a channel length direction of the transistor 1400b and a channel width direction of the transistor 1400b, respectively.

Structure Example 3 of Transistor

In the transistor 1400a illustrated in FIGS. 13A to 13C, parts of the conductive films 1421 and 1423 that overlap with the gate electrode (the conductive films 1411 to 1413) can be reduced in thickness. An example of such a structure is illustrated in FIGS. 17A to 17C.

Figure 17A:
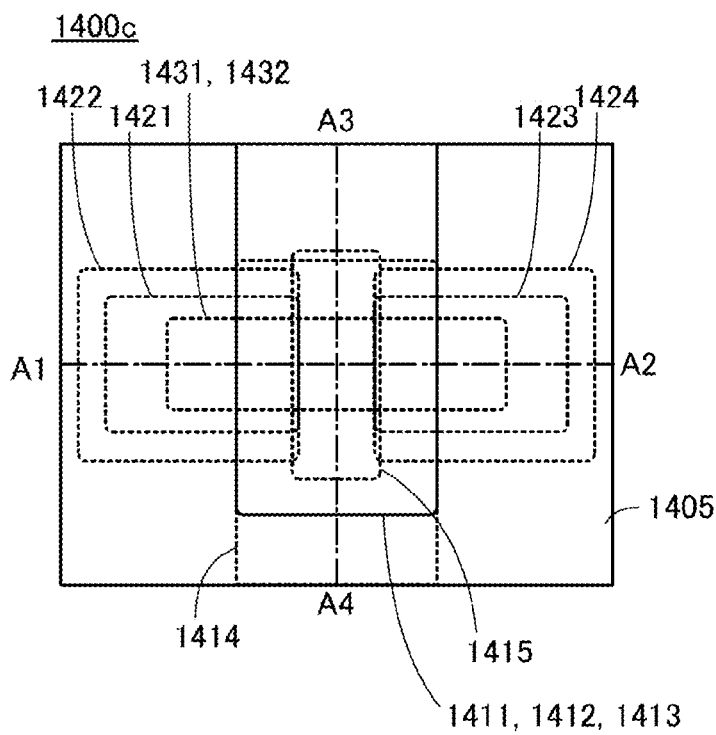
FIGS. 17A to 17C are a top view and cross-sectional views illustrating a structure example of a transistor.
Figure 17B:
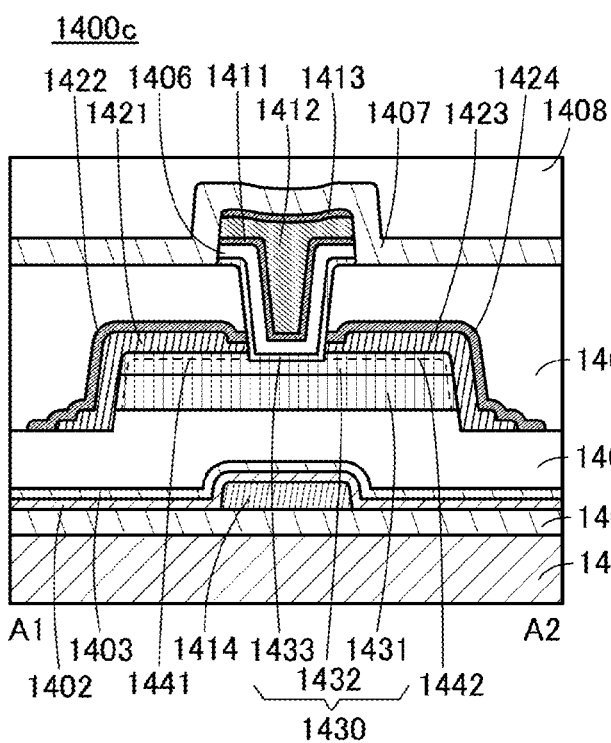
Figure 17C:
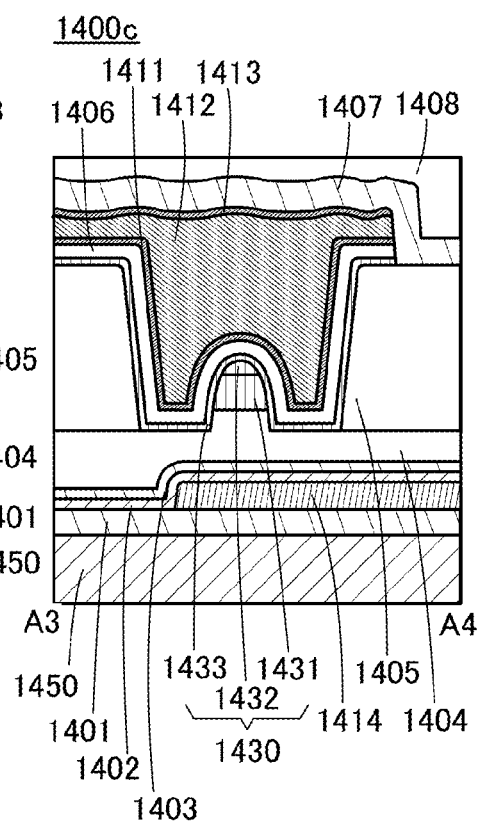

FIGS. 17A to 17C are a top view and cross-sectional views of a transistor 1400c. FIG. 17A is a top view. FIG. 17B is a cross-sectional view taken along dashed-dotted line A1-A2 in FIG. 17A, and FIG. 17C is a cross-sectional view taken along dashed-dotted line A3-A4 in FIG. 17A. Note that for simplification of the drawing, some components in FIG. 17A are not illustrated. Note that the dashed-dotted line A1-A2 and the dashed-dotted line A3-A4 are sometimes referred to as a channel length direction of the transistor 1400c and a channel width direction of the transistor 1400c, respectively.

In the transistor 1400c illustrated in FIG. 17B, part of the conductive film 1421 that overlaps with the gate electrode is reduced in thickness, and the conductive film 1422 covers the conductive film 1421. Part of the conductive film 1423 that overlaps with the gate electrode is also reduced in thickness, and the conductive film 1424 covers the conductive film 1423.

The transistor 1400c, which has the structure illustrated in FIG. 17B, can have an increased distance between the gate and source electrodes or between the gate and drain electrodes. This results in a reduction in the parasitic capacitance formed between the gate electrode and the source and drain electrodes. As a result, a transistor capable of high-speed operation can be obtained.

Structure Example 4 of Transistor

In the transistor 1400c illustrated in FIGS. 17A to 17C, the width of the metal oxides 1431 and 1432 can be increased in the A3-A4 direction. An example of such a structure is illustrated in FIGS. 18A to 18C.

Figure 18A:
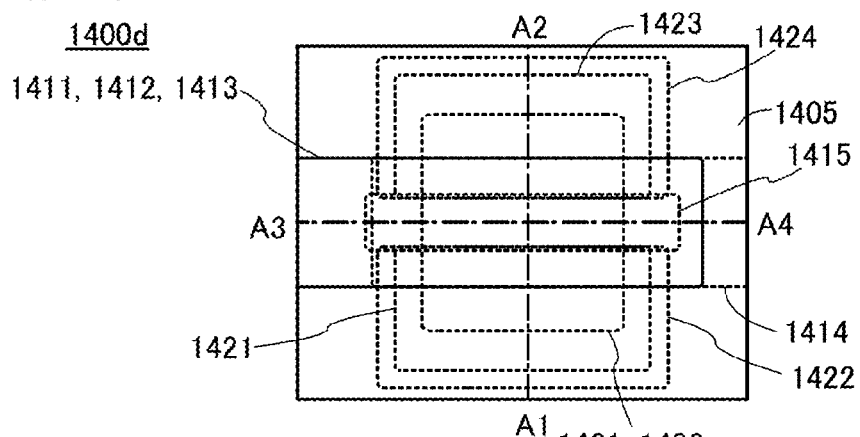
FIGS. 18A to 18C are a top view and cross-sectional views illustrating a structure example of a transistor.
Figure 18B:
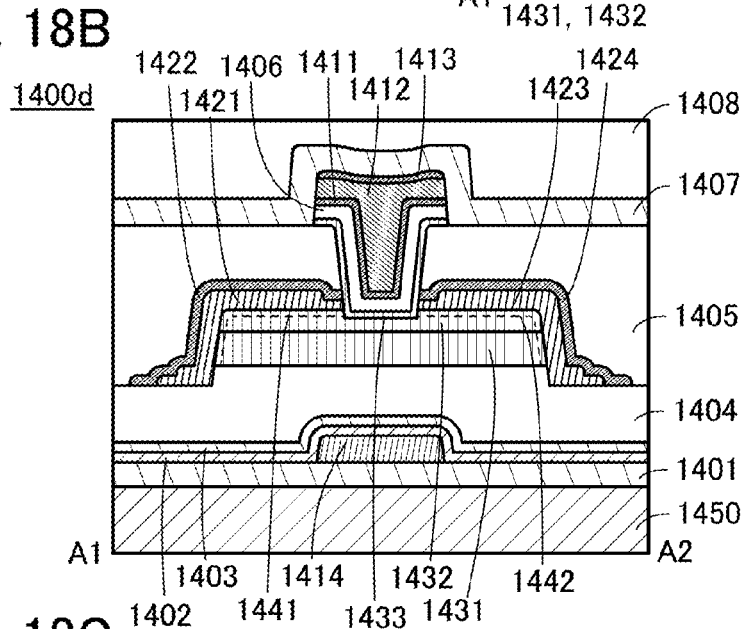
Figure 18C:
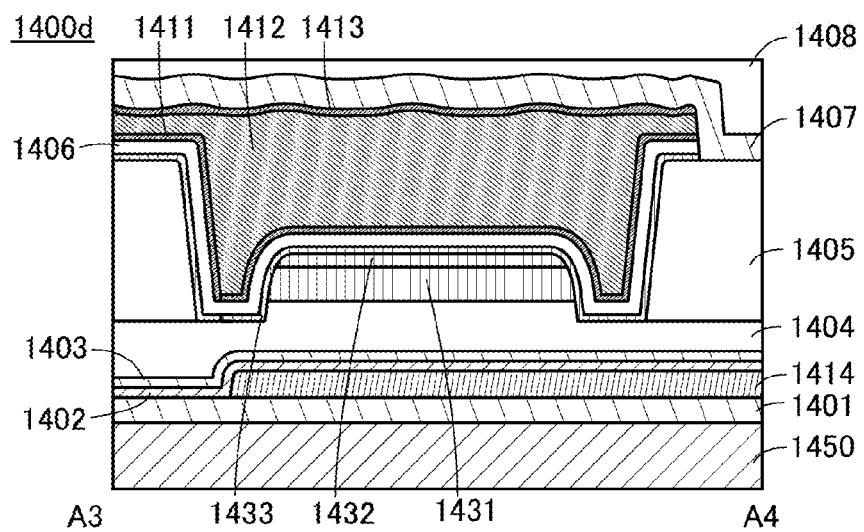

FIGS. 18A to 18C are a top view and cross-sectional views of a transistor 1400d. FIG. 18A is a top view. FIG. 18B is a cross-sectional view taken along dashed-dotted line A1-A2 in FIG. 18A, and FIG. 18C is a cross-sectional view taken along dashed-dotted line A3-A4 in FIG. 18A. Note that for simplification of the drawing, some components in the top view in FIG. 18A are not illustrated. Note that the dashed-dotted line A1-A2 and the dashed-dotted line A3-A4 are sometimes referred to as a channel length direction of the transistor 1400d and a channel width direction of the transistor 1400d, respectively.

The transistor 1400d, which has the structure illustrated in FIGS. 18A to 18C, can have an increased on-state current.

Structure Example 5 of Transistor

In the transistor 1400c illustrated in FIGS. 17A to 17C, a plurality of regions (hereinafter referred to as fins) consisting of the metal oxides 1431 and 1432 may be provided in the A3-A4 direction. An example of such a structure is illustrated in FIGS. 19A to 19C.

Figure 19A:
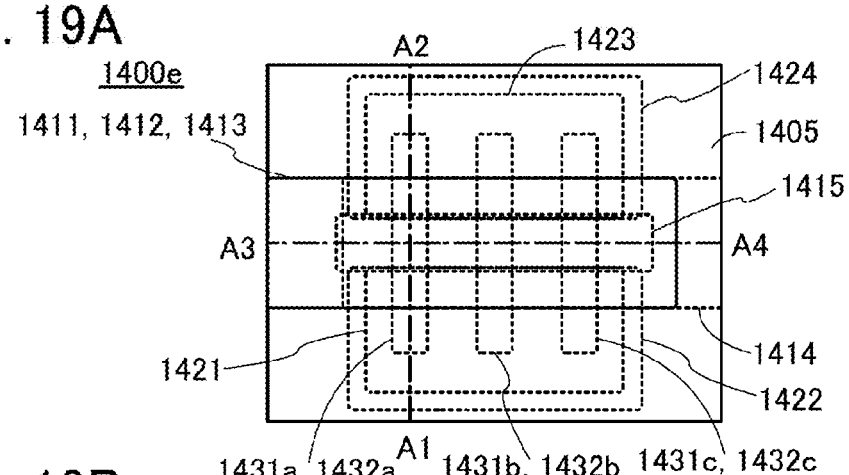
FIGS. 19A to 19C are a top view and cross-sectional views illustrating a structure example of a transistor.
Figure 19B:
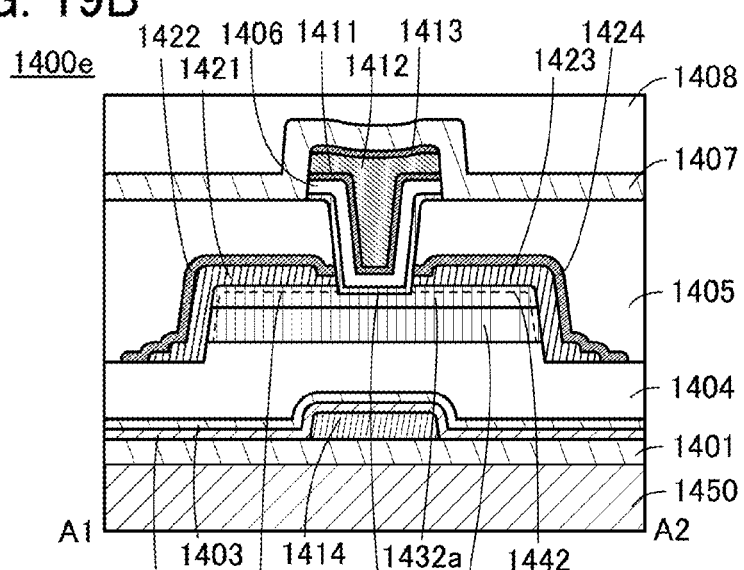
Figure 19C:
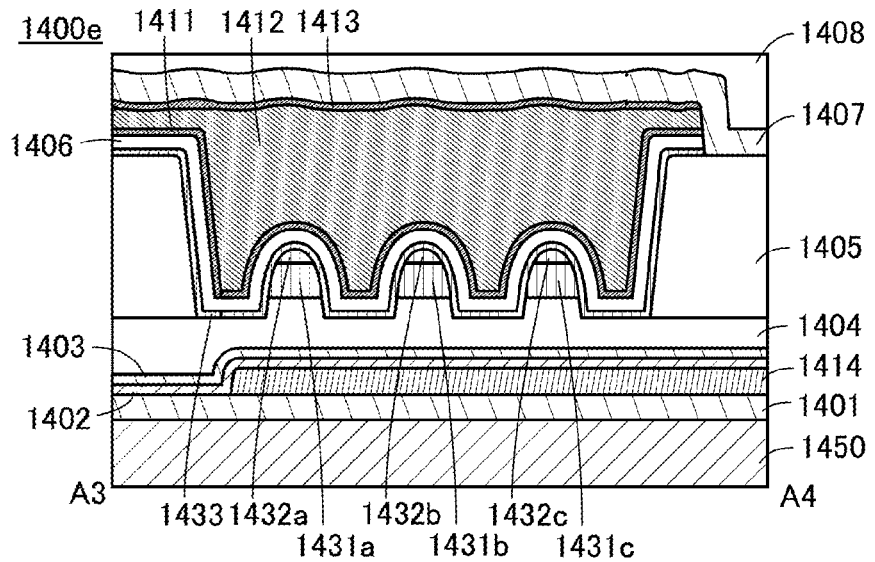

FIGS. 19A to 19C are a top view and cross-sectional views of a transistor 1400e. FIG. 19A is a top view. FIG. 19B is a cross-sectional view taken along dashed-dotted line A1-A2 in FIG. 19A, and FIG. 19C is a cross-sectional view taken along dashed-dotted line A3-A4 in FIG. 19A. Note that for simplification of the drawing, some components in the top view in FIG. 19A are not illustrated. Note that the dashed-dotted line A1-A2 and the dashed-dotted line A3-A4 are sometimes referred to as a channel length direction of the transistor 1400e and a channel width direction of the transistor 1400e, respectively.

The transistor 1400e includes a first fin consisting of metal oxides 1431a and 1432a, a second fin consisting of metal oxides 1431b and 1432b, and a third fin consisting of metal oxides 1431c and 1432c.

In the transistor 1400e, the metal oxides 1432a to 1432c where a channel is formed are surrounded by the gate electrode. Hence, a gate electric field can be applied to the entire channel, so that a transistor with a high on-state current can be obtained.

Structure Example 6 of Transistor

Figure 20A:
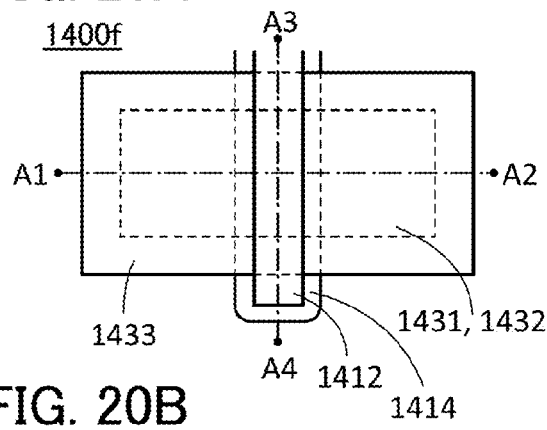
FIGS. 20A to 20D are a top view and cross-sectional views illustrating a structure example of a transistor.
Figure 20B:
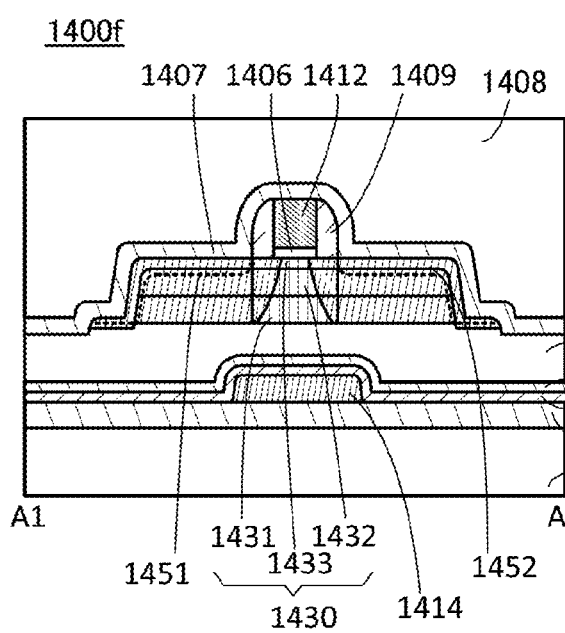
Figure 20C:
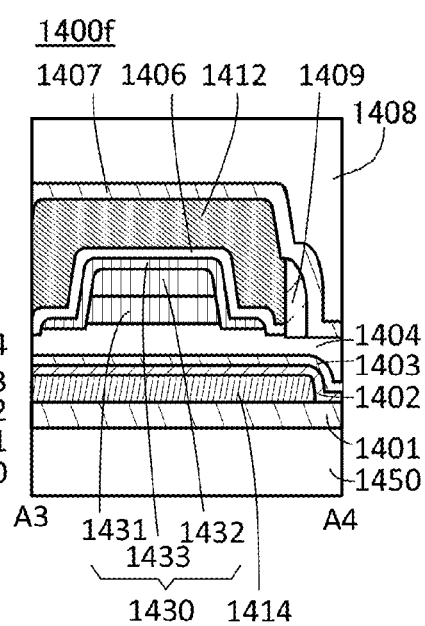

FIGS. 20A to 20D are a top view and cross-sectional views of a transistor 1400f. FIG. 20A is a top view of the transistor 1400f. FIG. 20B is a cross-sectional view taken along dashed-dotted line A1-A2 in FIG. 20A and FIG. 20C is a cross-sectional view taken along dashed-dotted line A3-A4 in FIG. 20A. Note that the dashed-dotted line A1-A2 and the dashed-dotted line A3-A4 are sometimes referred to as a channel length direction and a channel width direction, respectively. The transistor 1400f has the s-channel structure like the transistor 1400a and the like. In the transistor 1400f, an insulating film 1409 is provided in contact with the side surface of the conductive film 1412 used as a gate electrode. The insulating film 1407 and the insulating film 1409 are covered with the insulating film 1408. The insulating film 1409 serves as a sidewall insulating film of the transistor 1400f. As in the transistor 1400a, the gate electrode may be a stack of the conductive films 1411 to 1413.

The insulating film 1406 and the conductive film 1412 overlap with the conductive film 1414 and the metal oxide 1432 at least partly. The side edge of the conductive film 1412 in the channel length direction is preferably approximately aligned with the side edge of the insulating film 1406 in the channel length direction. Here, the insulating film 1406 serves as a gate insulating film of the transistor 1400f, and the conductive film 1412 serves as a gate electrode of the transistor 1400f.

The metal oxide 1432 has a region that overlaps with the conductive film 1412 with the metal oxide 1433 and the insulating film 1406 positioned therebetween. Preferably, the outer edge of the metal oxide 1431 is approximately aligned with the outer edge of the metal oxide 1432, and the outer edge of the metal oxide 1433 is outside of the outer edges of the metal oxides 1431 and 1432. However, the shape of the transistor in this embodiment is not limited to that where the outer edge of the metal oxide 1433 is outside of the outer edge of the metal oxide 1431. For example, the outer edge of the metal oxide 1431 may be outside of the outer edge of the metal oxide 1433, or the side edge of the metal oxide 1431 may be approximately aligned with the side edge of the metal oxide 1433.

Figure 20D:
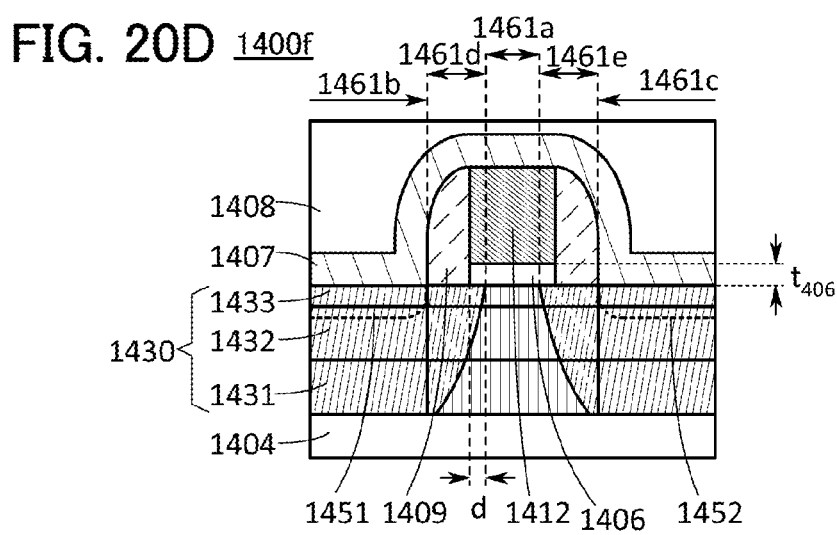

FIG. 20D is an enlarged view of part of FIG. 20B. As shown in FIG. 20D, regions 1461a to 1461e are formed in the metal oxide 1430. The regions 1461b to 1461e have a higher concentration of dopant and therefore have a lower resistance than the region 1461a. Furthermore, the regions 1461b and 1461c have a higher concentration of hydrogen and therefore have a much lower resistance than the regions 1461d and 1461e. The concentration of a dopant in the region 1461a is, for example, less than or equal to 5%, less than or equal to 2%, or less than or equal to 1% of the maximum concentration of a dopant in the region 1461b or 1461c. Note that the dopant may be rephrased as a donor, an acceptor, an impurity, or an element.

As shown in FIG. 20D, in the metal oxide 1430, the region 1461a substantially overlaps with the conductive film 1412, and the regions 1461b to 1461e are the regions other than the region 1461a. In the regions 1461b and 1461c, the top surface of the metal oxide 1433 is in contact with the insulating film 1407. In the regions 1461d and 1461e, the top surface of the metal oxide 1433 is in contact with the insulating film 1409 or 1406. That is, as shown in FIG. 20D, the border between the regions 1461b and 1461d overlaps with the border between the side edges of the insulating films 1407 and 1409. The same applies to the border between the regions 1461c and 1461e. Here, part of the regions 1461d and 1461e preferably overlaps with part of a region (a channel formation region) where the metal oxide 1432 and the conductive film 1412 overlap with each other. For example, preferably, the side edges of the regions 1461d and 1461e in the channel length direction are inside of the conductive film 1412 and the distance between the side edge of the conductive film 1412 and each of the side edges of the regions 1461d and 1461e is d. In that case, the thickness $t_{406}$ of the insulating film 1406 and the distance d preferably satisfy $0.25 t_{406} < d < t_{406}$.

In the above manner, the regions 1461d and 1461e are formed in part of the region where the metal oxide 1430 and the conductive film 1412 overlap with each other. Accordingly, the channel formation region of the transistor 1400f is in contact with the low-resistance regions 1461d and 1461e and a high-resistance offset region is not formed between the region 1461a and each of the regions 1461d and 1461e, so that the on-state current of the transistor 1400f can be increased. Furthermore, since the side edges of the regions 1461d and 1461e in the channel length direction are formed so as to satisfy the above range, the regions 1461d and 1461e can be prevented from being formed too deeply in the channel formation region and always conducted.

The regions 1461b to 1461e are formed by ion doping treatment such as an ion implantation method. Therefore, as illustrated in FIG. 20D, in some cases, the boundary between the regions 1461d and 1461a around the lower surface of the metal oxide 1431 is formed closer to the A1 side of the dashed-dotted line A1-A2 than the boundary between the regions 1461d and 1461a around the upper surface of the metal oxide 1433 is; in other words, the boundary is formed closer to the A1 side in the deeper region. The distance d in that case is the distance between the boundary between the regions 1461d and 1461a which is closest to the inner part of the conductive film 1412 in the direction of the dashed-dotted line A1-A2 and the side edge of the conductive film 1412 at A1 side in the direction of the dashed-dotted line A1-A2. Similarly, the boundary between the regions 1461e and 1461a around the lower surface of the metal oxide 1431 is formed closer to the A2 side of the dashed-dotted line A1-A2 than the boundary between the regions 1461e and 1461a around the upper surface of the metal oxide 1433 is; in other words, the boundary is formed closer to the A2 side in the deeper region. The distance d in that case is the distance between the boundary between the regions 1461e and 1461a which is closest to the inner part of the conductive film 1412 in the direction of the dashed-dotted line A1-A2 and the side edge of the conductive film 1412 at A2 side in the direction of the dashed-dotted line A1-A2.

In some cases, for example, the regions 1461d and 1461e in the metal oxide 1431 do not overlap with the conductive film 1412. In that case, at least part of the regions 1461d and 1461e in the metal oxide 1431 or 1432 is preferably formed in a region overlapping with the conductive film 1412.

In addition, low-resistance regions 1451 and 1452 are preferably formed in the metal oxide 1431, the metal oxide 1432, and the metal oxide 1433 in the vicinity of the interface with the insulating film 1407. The low-resistance regions 1451 and 1452 contain at least one of elements included in the insulating film 1407. Preferably, part of the low-resistance regions 1451 and 1452 is substantially in contact with or overlaps partly with the region (the channel formation region) where the metal oxide 1432 and the conductive film 1412 overlap with each other.

Since a large part of the metal oxide 1433 is in contact with the insulating film 1407, the low-resistance regions 1451 and 1452 are likely to be formed in the metal oxide 1433. The low-resistance regions 1451 and 1452 in the metal oxide 1433 contain a higher concentration of elements included in the insulating film 1407 than the other regions of the metal oxide 1433 (e.g., the region of the metal oxide 1433 that overlaps with the conductive film 1412).

The low-resistance regions 1451 and 1452 are formed in the regions 1461b and 1461c, respectively. Ideally, the metal oxide 1430 has a structure in which the concentration of added elements is the highest in the low-resistance regions 1451 and 1452, the second highest in the regions 1461b to 1461e other than the low-resistance regions 1451 and 1452, and the lowest in the region 1461a. The added elements refer to a dopant for forming the regions 1461b and 1461c and an element added from the insulating film 1407 to the low-resistance regions 1451 and 1452.

Although the low-resistance regions 1451 and 1452 are formed in the transistor 1400f, the semiconductor device shown in this embodiment is not limited to this structure. For example, the low-resistance regions 1451 and 1452 are not necessarily formed in the case where the regions 1461b and 1461c have a sufficiently low resistance.

Structure Example 7 of Transistor

Figure 21A:
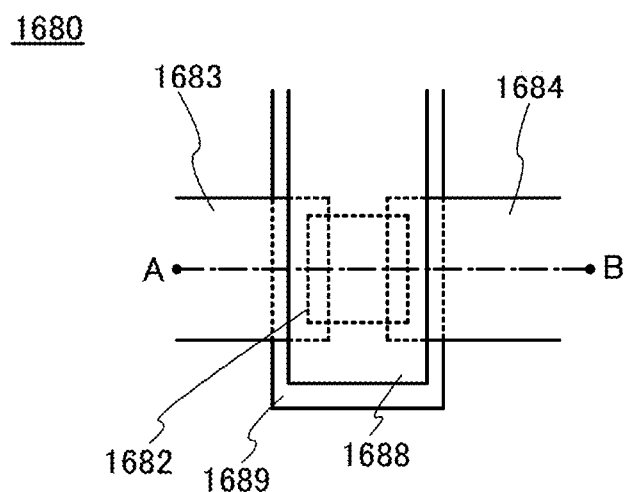
FIGS. 21A and 21B are a top view and a cross-sectional view illustrating a structure example of a transistor.
Figure 21B:
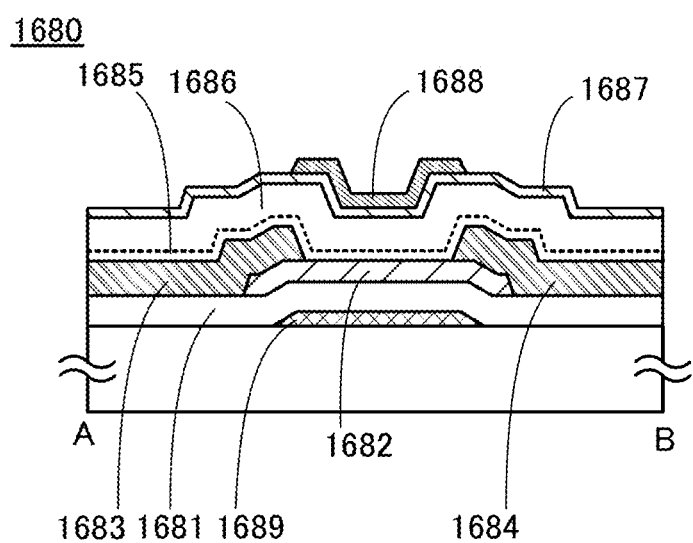

FIGS. 21A and 21B are a top view and a cross-sectional view of a transistor 1680. FIG. 21A is a top view, and FIG. 21B is a cross-sectional view taken along dashed-dotted line A-B in FIG. 21A. Note that for simplification of the drawing, some components are increased or reduced in size, or omitted in FIGS. 21A and 21B. Note that the dashed-dotted line A-B is sometimes referred to as a channel length direction.

The transistor 1680 shown in FIG. 21B includes a conductive film 1689 serving as a first gate, a conductive film 1688 serving as a second gate, a semiconductor 1682, a conductive film 1683 and a conductive film 1684 serving as a source and a drain, an insulating film 1681, an insulating film 1685, an insulating film 1686, and an insulating film 1687.

The conductive film 1689 is on an insulating surface. The conductive film 1689 overlaps with the semiconductor 1682 with the insulating film 1681 provided therebetween. The conductive film 1688 overlaps with the semiconductor 1682 with the insulating films 1685, 1686, and 1687 provided therebetween. The conductive films 1683 and 1684 are connected to the semiconductor 1682.

The description of the conductive films 1411 to 1414 in FIGS. 13A to 13C can be referred to for the details of the conductive films 1689 and 1688.

The conductive films 1689 and 1688 may be supplied with different potentials, or may be supplied with the same potential at the same time. The conductive film 1688 serving as a second gate electrode in the transistor 1680 leads to stabilization of threshold voltage. Note that the conductive film 1688 is not necessarily provided.

The description of the metal oxide 1432 in FIGS. 13A to 13C can be referred to for the details of the semiconductor 1682. The semiconductor 1682 may be a single layer or a stack including a plurality of semiconductor layers.

The description of the conductive films 1421 to 1424 in FIGS. 13A to 13C can be referred to for the details of the conductive films 1683 and 1684.

The description of the insulating film 1406 in FIGS. 13A to 13C can be referred to for the details of the insulating film 1681.

The insulating films 1685 to 1687 are sequentially stacked over the semiconductor 1682 and the conductive films 1683 and 1684 in FIG. 21B; however, an insulating film provided over the semiconductor 1682 and the conductive films 1683 and 1684 may be a single layer or a stack including a plurality of insulating films.

In the case of using an oxide semiconductor as the semiconductor 1682, the insulating film 1686 preferably contains oxygen at a proportion higher than or equal to that in the stoichiometric composition and has a function of supplying part of oxygen to the semiconductor 1682 by heating. Note that in the case where the provision of the insulating film 1686 directly on the semiconductor 1682 causes damage to the semiconductor 1682 at the time of formation of the insulating film 1686, the insulating film 1685 is preferably provided between the semiconductor 1682 and the insulating film 1686, as shown in FIG. 21B. The insulating film 1685 preferably allows oxygen to pass therethrough, and causes little damage to the semiconductor 1682 when the insulating film 1685 is formed compared with the case of the insulating film 1686. If the insulating film 1686 can be formed directly on the semiconductor 1682 while damage to the semiconductor 1682 is reduced, the insulating film 1685 is not necessarily provided.

For the insulating films 1685 and 1686, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 1687 preferably has an effect of blocking diffusion of oxygen, hydrogen, and water. Alternatively, the insulating film 1687 preferably has an effect of blocking diffusion of hydrogen and water.

As an insulating film has higher density and becomes denser or has a fewer dangling bonds and becomes more chemically stable, the insulating film has a more excellent blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 1687 has an effect of blocking diffusion of water, hydrogen, and the like, impurities such as water and hydrogen that exist in a resin in a panel or exist outside the panel can be prevented from entering the semiconductor 1682. In the case where an oxide semiconductor is used as the semiconductor 1682, part of water or hydrogen that enters the oxide semiconductor serves as an electron donor (donor). Thus, the use of the insulating film 1687 having the blocking effect can prevent a shift in the threshold voltage of the transistor 1680 due to generation of donors.

In addition, in the case where an oxide semiconductor is used as the semiconductor 1682, the insulating film 1687 has an effect of blocking diffusion of oxygen, so that diffusion of oxygen from the oxide semiconductor to the outside can be prevented. Accordingly, oxygen vacancies in the oxide semiconductor that serve as donors are reduced, so that a shift in the threshold voltage of the transistor 1680 due to generation of donors can be prevented.

Note that this embodiment can be combined with any of the other embodiments in this specification as appropriate.

Embodiment 5

In this embodiment, structure examples of a device in which the structure example of the transistor described in Embodiment 4 is used for the memory cell MC and the memory cells MC[1] to MC[m] (hereinafter collectively referred to as a memory cell MC) described in Embodiment 1 or 2 are described with reference to FIGS. 22A and 22B, FIGS. 23A and 23B, FIGS. 24A and 24B, FIGS. 25A and 25B, FIGS. 26A and 26B, and FIGS. 27A and 27B.

Structure Example 1 of Stacked Elements

Figure 22A:
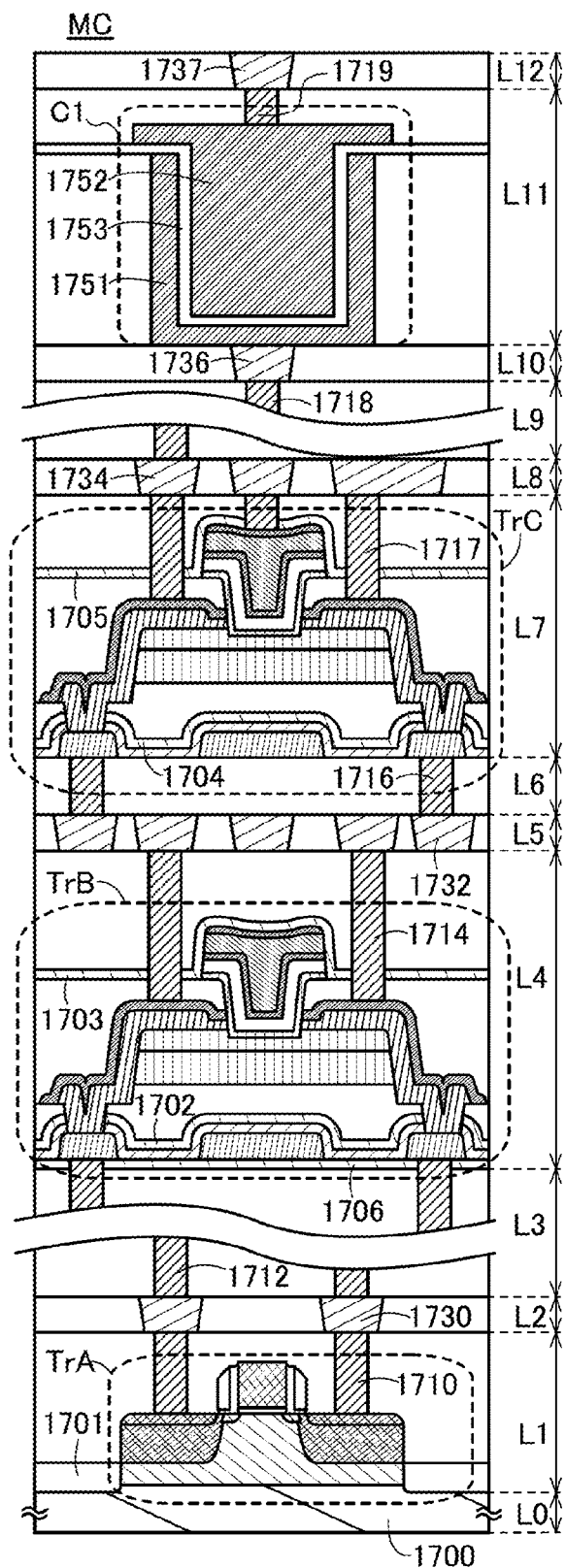
FIGS. 22A and 22B are cross-sectional views illustrating a structure example of a memory cell.
Figure 22B:
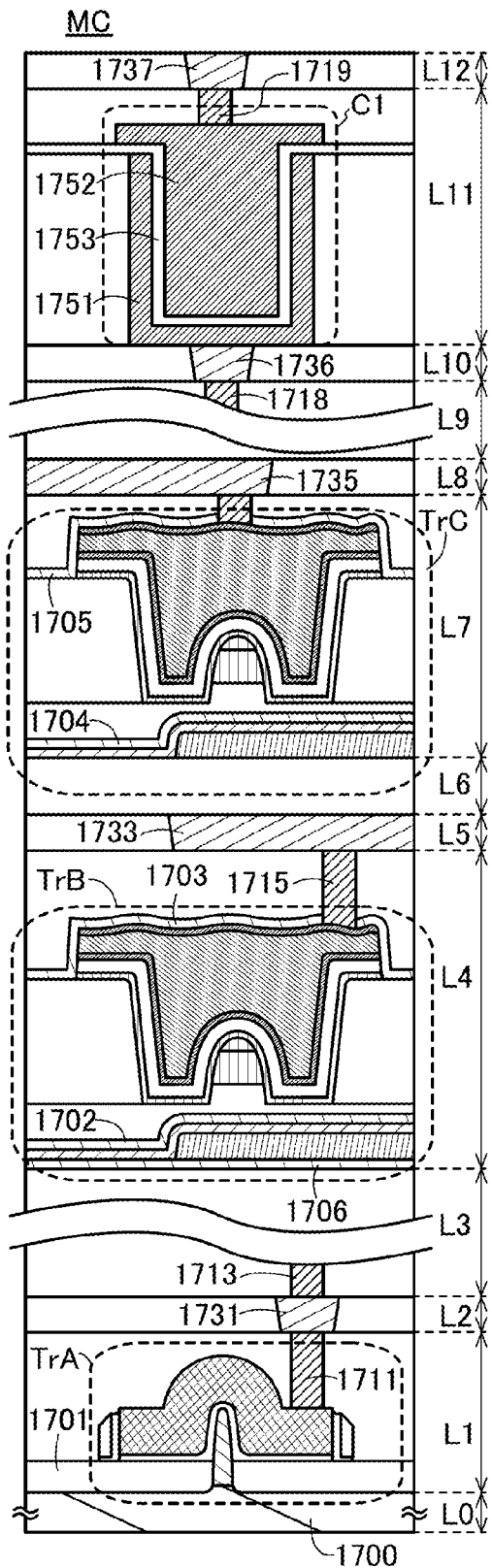

FIGS. 22A and 22B each illustrate part of a cross-sectional view of the memory cell MC. FIG. 22A is a cross-sectional view of transistors included in the memory cell MC in a channel length direction. FIG. 22B is a cross-sectional view of transistors included in the memory cell MC in a channel width direction.

The memory cell MC illustrated in FIGS. 22A and 22B includes layers L0, L1, L2, L3, L4, L5, L6, L7, L8, L9, L10, L11, and L12 in the order from the bottom.

The layer L1 includes a substrate 1700, a transistor TrA formed using the substrate 1700, an element isolation layer 1701, and a plurality of conductors such as a conductor 1710 and a conductor 1711.

The layer L2 includes a plurality of wirings such as a wiring 1730 and a wiring 1731.

The layer L3 includes a plurality of conductors such as a conductor 1712 and a conductor 1713 and a plurality of wirings (not illustrated).

The layer L4 includes an insulator 1706, a transistor TrB, an insulator 1702, an insulator 1703, and a plurality of conductors such as a conductor 1714 and a conductor 1715.

The layer L5 includes a plurality of wirings such as a wiring 1732 and a wiring 1733.

The layer L6 includes a plurality of conductors such as a conductor 1716.

The layer L7 includes a transistor TrC, an insulator 1704, an insulator 1705, and a plurality of conductors such as a conductor 1717.

The layer L8 includes a plurality of wirings such as a wiring 1734 and a wiring 1735.

The layer L9 includes a plurality of conductors such as a conductor 1718 and a plurality of wirings (not illustrated).

The layer L10 includes a plurality of wirings such as a wiring 1736.

The layer L11 includes a capacitor C1 and a plurality of conductors such as a conductor 1719. The capacitor C1 includes a first electrode 1751, a second electrode 1752, and an insulating film 1753.

The layer L12 includes a plurality of wirings such as a wiring 1737.

The OS transistor described in Embodiment 4 is preferably used as the transistors TrB and TrC. In FIGS. 22A and 22B, the transistor 1400c in FIGS. 17A to 17C is used as the transistors TrB and TrC.

The transistor TrA is preferably formed using a semiconductor material different from that for the transistors TrB and TrC. In FIGS. 22A and 22B, a Si transistor is used as the transistor TrA.

Note that in FIGS. 22A and 22B, the transistors TrB and TrC include the conductive film 1414 as a back gate electrode; however, the conductive film 1414 is not necessarily provided.

As the substrate 1700, a single crystal semiconductor substrate or a polycrystalline semiconductor substrate of silicon or silicon carbide, a compound semiconductor substrate of silicon germanium, an SOI substrate, or the like can be used.

For example, a glass substrate, a quartz substrate, a plastic substrate, a metal substrate, a flexible substrate, an attachment film, paper including a fibrous material, a base film, or the like may be used as the substrate 1700. Alternatively, a semiconductor element may be formed using one substrate, and then transferred to another substrate. In FIGS. 22A and 22B, as an example, a single crystal silicon wafer is used as the substrate 1700.

Figure 24A:
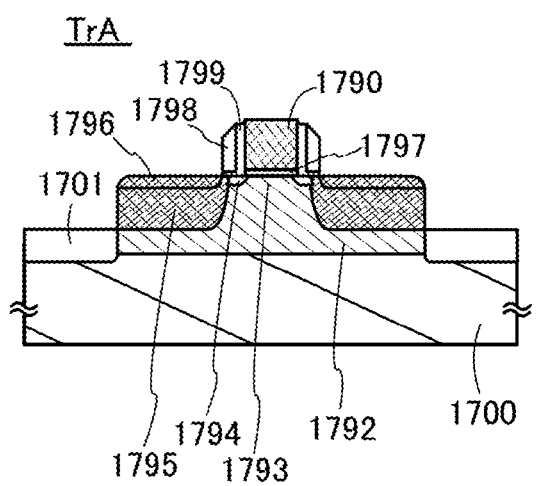
FIGS. 24A and 24B are cross-sectional views each illustrating a structure example of the transistor TrA illustrated in FIGS. 22A and 22B and FIGS. 23A and 23B.
Figure 24B:
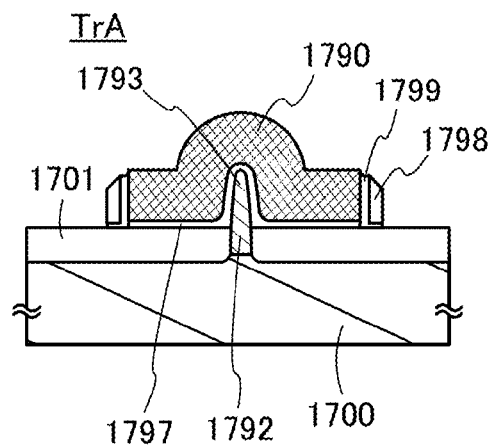

The transistor TrA is described in detail with reference to FIGS. 24A and 24B. FIG. 24A is a cross-sectional view of the transistor TrA in the channel length direction, and FIG. 24B is a cross-sectional view of the transistor TrA in the channel width direction. The transistor TrA includes a channel formation region 1793 formed in a well 1792, low concentration impurity regions 1794 and high concentration impurity regions 1795 (also collectively referred to as an impurity region simply), conductive regions 1796 provided in contact with the high concentration impurity regions 1795, a gate insulating film 1797 provided over the channel formation region 1793, a gate electrode 1790 provided over the gate insulating film 1797, and sidewall insulating layers 1798 and 1799 provided on side surfaces of the gate electrode 1790. Note that the conductive regions 1796 can be formed using metal silicide or the like. The conductive regions 1796 may be provided in contact with the low concentration impurity regions 1794.

In the transistor TrA in FIG. 24B, the channel formation region 1793 has a projecting portion, and the gate insulating film 1797 and the gate electrode 1790 are provided along side and top surfaces of the channel formation region 1793. The transistor with such a shape is referred to as a FIN-type transistor. Although the projecting portion is formed by processing part of the semiconductor substrate in this embodiment, a semiconductor layer with a projecting portion may be formed by processing an SOI substrate.

Figure 25A:
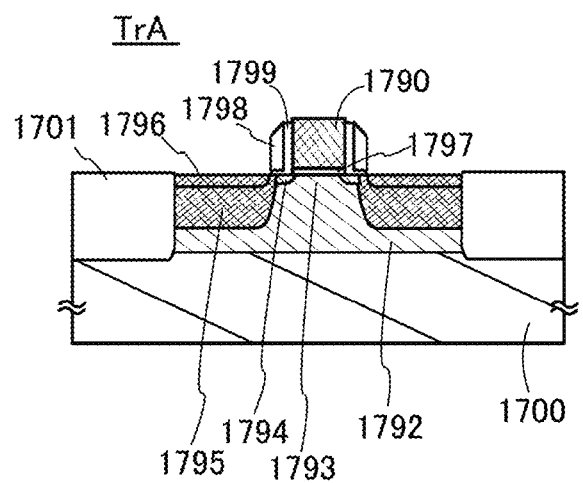
FIGS. 25A and 25B are cross-sectional views each illustrating a structure example of the transistor TrA illustrated in FIGS. 22A and 22B and FIGS. 23A and 23B.
Figure 25B:
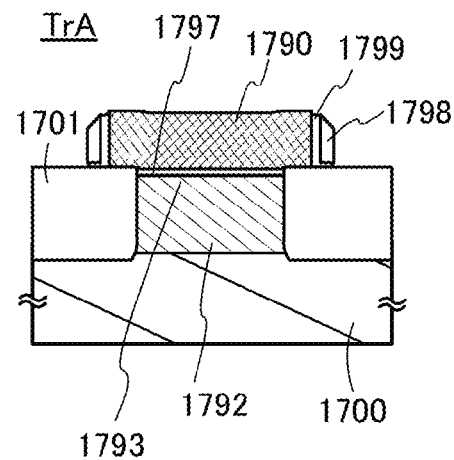

Note that the transistor TrA is not limited to the FIN-type transistor, and may be a planar-type transistor illustrated in FIGS. 25A and 25B. FIG. 25A is a cross-sectional view of the transistor TrA in the channel length direction, and FIG. 25B is a cross-sectional view of the transistor TrA in the channel width direction. The reference numerals in FIGS. 25A and 25B are the same as those in FIGS. 24A and 24B.

In FIGS. 22A and 22B, the insulators 1702 to 1706 preferably have a blocking effect against hydrogen, water, and the like. Water, hydrogen, and the like are factors that generate carriers in an oxide semiconductor; thus, such a blocking layer against hydrogen, water, and the like can improve the reliability of the transistors TrB and TrC. Examples of the insulator having a blocking effect against hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ).

The wirings 1730 to 1737 and the conductors 1710 to 1719 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), or cobalt (Co), an alloy of such a low-resistance material, or a compound containing such a material as its main component. It is particularly preferable to use a high-melting-point material that has both heat resistance and conductivity, such as tungsten or molybdenum. In addition, the conductive film is preferably formed using a low-resistance conductive material such as aluminum or copper. The use of a Cu—Mn alloy is further preferable because manganese oxide formed at the interface with an insulator containing oxygen has a function of preventing Cu diffusion.

In FIGS. 22A and 22B, regions without reference numerals and hatch patterns represent regions formed of an insulator. As the insulator, an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like can be used. Alternatively, in these regions, an organic resin such as a polyimide resin, a polyamide resin, an acrylic resin, a siloxane resin, an epoxy resin, or a phenol resin can be used. Note that in this specification, an oxynitride refers to a substance that contains more oxygen than nitrogen, and a nitride oxide refers to a substance that contains more nitrogen than oxygen.

In the case where an OS transistor used as the transistor WTr described in Embodiment 1, the transistor WTr is preferably formed in one of the layer L4 and the layer L7. In the other of the layer L4 and the layer L7, the transistor WTr of another memory cell MC or an OS transistor included in a driver circuit provided in the vicinity of the memory cell MC may be formed.

In the case where OS transistors are used as the transistors WTr, the transistor RTr, the transistors WTr[1] to WTr[n], and the transistors RTr[1] to RTr[n] described in Embodiment 2, they are preferably formed in the layer L4 or the layer L7.

In the case where Si transistor is used as the transistor RTr described in Embodiment 1, the transistor RTr is preferably formed in the layer L1.

Si transistors are used as the transistor RTr and the transistors RTr[1] to RTr[n] described in Embodiment 2, the transistor RTr and the transistors RTr[1] to RTr[n] are preferably formed in the layer L1.

Figure 26A:
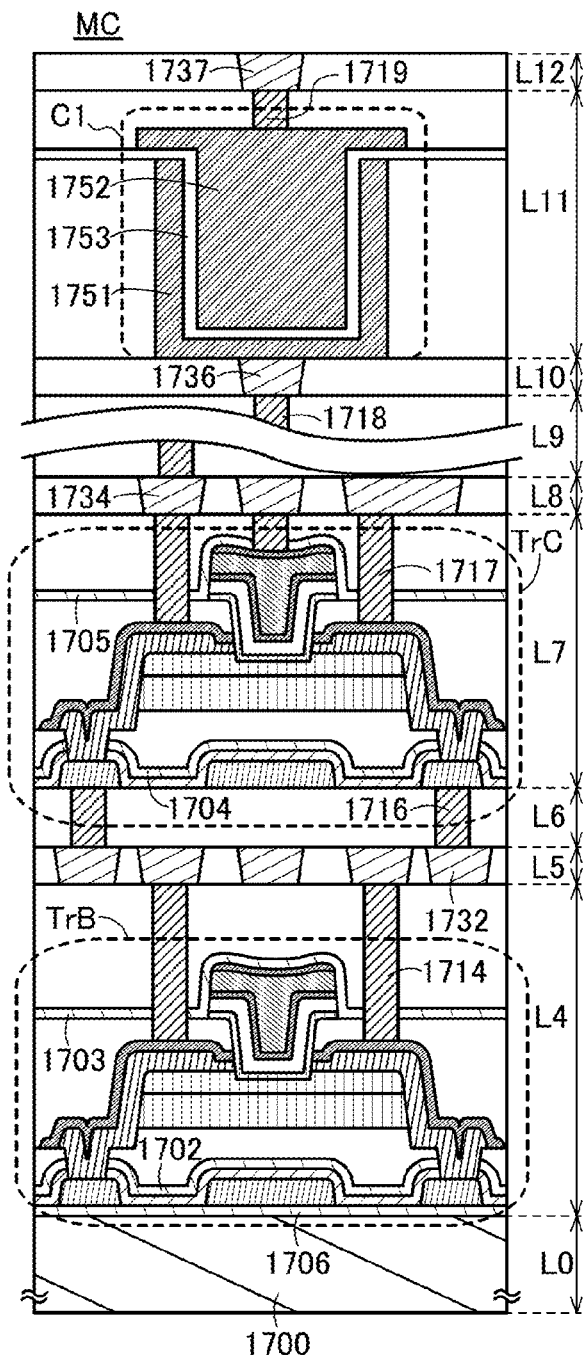
FIGS. 26A and 26B are cross-sectional views illustrating a structure example of a memory cell.
Figure 26B:
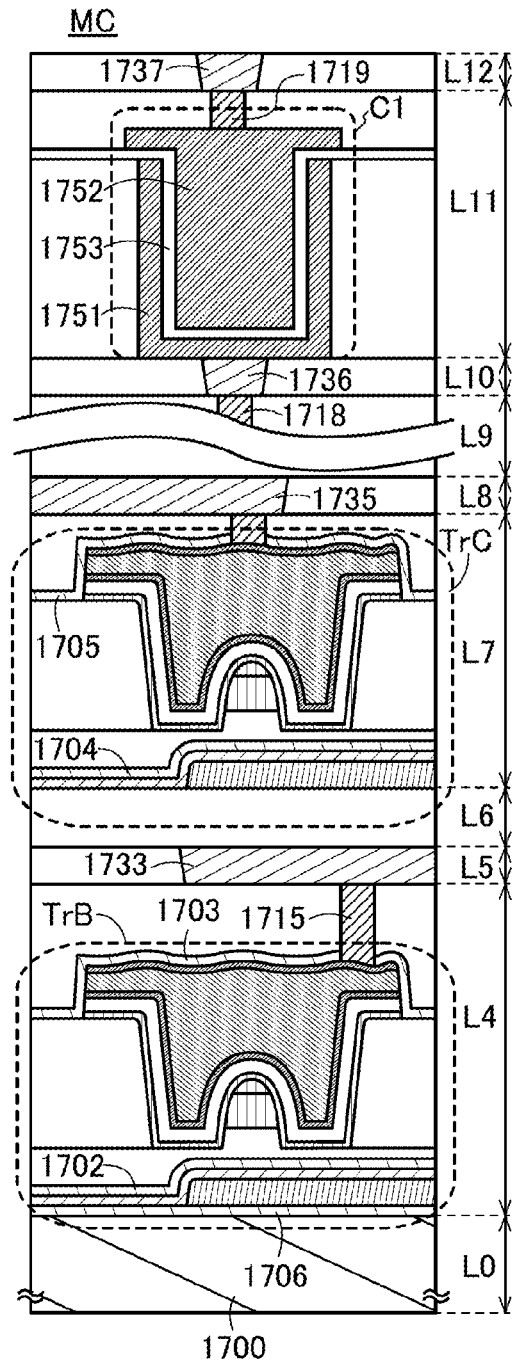

Note that in the case where no Si transistor is used as in the semiconductor device 120 described in Embodiment 2, a transistor TrB may be formed over the layer L0 as in a memory cell MC illustrated in FIGS. 26A and 26B.

The capacitor C described in Embodiment 1 is preferably formed in the layer L11.

The capacitor C and the capacitors C[1] to C[n] described in Embodiment 2 are preferably formed in the layer L11.

The capacitor C1 illustrated in FIGS. 22A and 22B is located over the transistors TrB and TrC; however, one embodiment of the present invention is not limited thereto. For example, a structure in which the transistors TrB and TrC are formed over the capacitor C1 may be employed (not illustrated).

The capacitor C1 illustrated in FIGS. 22A and 22B is a trench-type capacitor. When the capacitor C1 is a planar capacitor, the capacitor C1 can be formed in the same layer as the transistor TrB or TrC (not illustrated).

In the case where a driver circuit provided in the vicinity of the memory cell MC is formed using an OS transistor, the OS transistor may be formed in the layer L4 or L7.

In the case where a driver circuit provided in the vicinity of the memory cell MC is formed using a Si transistor, the Si transistor may be formed in the layer L1.

With the structure illustrated in FIGS. 22A and 22B, the area occupied by the memory cell MC can be reduced, leading to higher integration of the memory cell.

Note that in the case where the memory cell MC described in Embodiment 1 has the structure of FIGS. 22A and 22B, the number of transistors (TrA, TrB, and TrC) and the number of capacitors (C1) are sometimes different from those in FIGS. 22A and 22B. In that case, the structure of FIGS. 22A and 22B may be changed as appropriate; for example, the numbers of the layers L4, L7, and L11 are increased or decreased, or an element is additionally provided in a layer.

Structure Example 2 of Stacked Elements

Figure 23A:
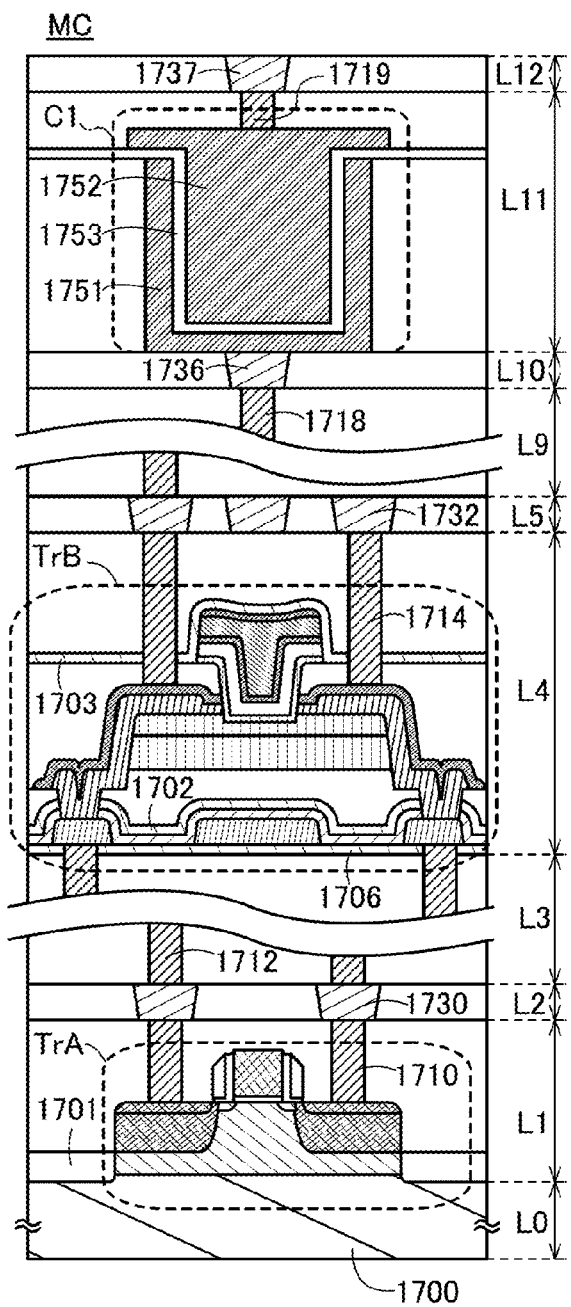
FIGS. 23A and 23B are cross-sectional views illustrating a structure example of a memory cell.
Figure 23B:
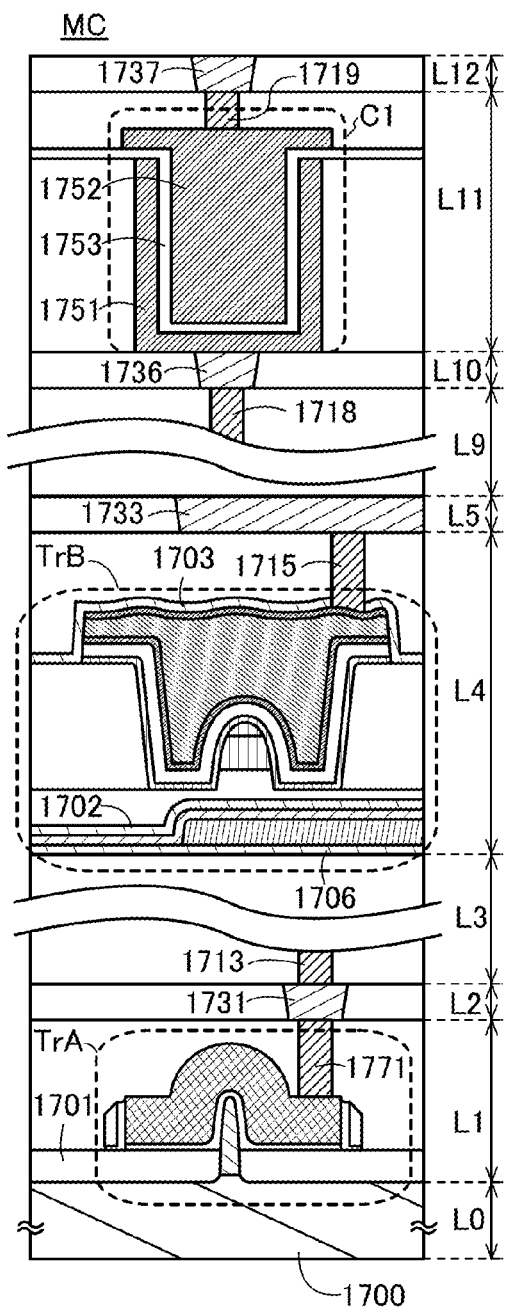

All the OS transistors in the memory cell MC may be formed in the same layer. An example in that case is illustrated in FIGS. 23A and 23B. As in FIGS. 22A and 22B, FIG. 23A is a cross-sectional view of a transistor included in the memory cell MC in the channel length direction, and FIG. 23B is a cross-sectional view of a transistor included in the memory cell MC in the channel width direction.

The cross-sectional views of FIGS. 23A and 23B are different from those of FIGS. 22A and 22B in that the layers L6 to L8 are omitted and the layer L9 is formed on the layer L5. For other details in FIGS. 23A and 23B, the description of FIGS. 22A and 22B is referred to.

In the case where an OS transistor is used as the transistor WTr described in Embodiment 1, the transistor WTr is preferably formed in the layer L4.

In the case where OS transistor are used as the transistor WTr, the transistor RTr, the transistors WTr[1] to WTr[n], and the transistors RTr[1] to RTr[n] described in Embodiment 2, they are preferably formed in the layer L4.

In the case where a Si transistor is used as the transistor RTr described in Embodiment 1, the transistor RTr is preferably formed in the layer L1.

Si transistors are used as the transistor RTr and the transistors RTr[1] to RTr[n] described in Embodiment 2, the transistor RTr and the transistors RTr[1] to RTr[n] are preferably formed in the layer L1.

Figure 27A:
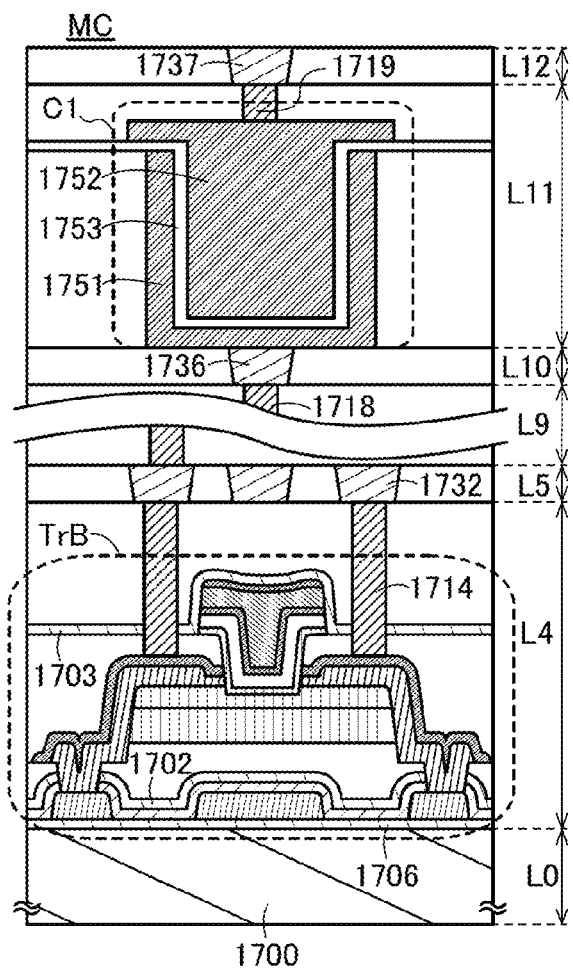
FIGS. 27A and 27B are cross-sectional views illustrating a structure example of a transistor.
Figure 27B:
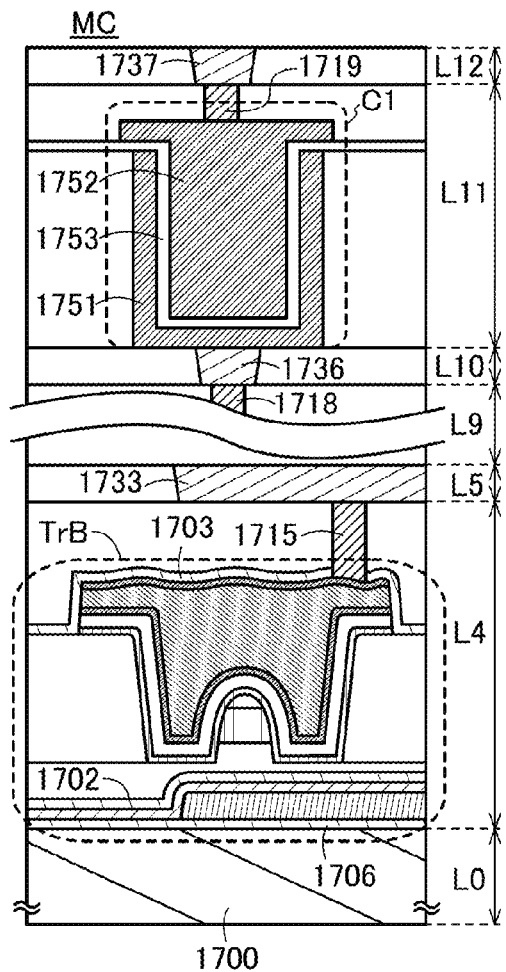

Note that in the case where no Si transistor is used as in the semiconductor device 120 described in Embodiment 2, the transistor TrB may be formed over the layer L0 as in a memory cell MC illustrated in FIGS. 27A and 27B.

The capacitor C1 described in Embodiment 1 is preferably formed in the layer L11.

The capacitor C and the capacitors C[1] to C[n] described in Embodiment 2 are preferably formed in the layer L11.

The capacitor C1 illustrated in FIGS. 23A and 23B is located over the transistors TrB and TrC; however, one embodiment of the present invention is not limited thereto. For example, a structure in which the transistor TrB is formed over the capacitor C1 may be employed (not illustrated).

The capacitor C1 illustrated in FIGS. 23A and 23B is a trench-type capacitor. When the capacitor C1 is a planar capacitor, the capacitor C1 can be formed in the same layer as the transistor TrB (not illustrated).

In the case where a driver circuit in the vicinity of the memory cell MC is formed using an OS transistor, the OS transistor may be formed in the layer L4.

In the case where a driver circuit in the vicinity of the memory cell MC is formed using a Si transistor, the Si transistor may be formed in the layer L1.

With the structure illustrated in FIGS. 23A and 23B, the manufacturing process of the memory cell MC can be simplified.

Note that in the case where the memory cell MC described in Embodiment 1 has the structure of FIGS. 23A and 23B, the number of transistors (TrA, TrB, and TrC) and the number of capacitors (C1) are sometimes different from those in FIGS. 23A and 23B. In that case, the structure of FIGS. 23A and 23B may be changed as appropriate; for example, the numbers of the layers L4 and L11 are increased or decreased, or an element is additionally provided in a layer.

Note that this embodiment can be combined with any of the other embodiments in this specification as appropriate.

Embodiment 6

Described in this embodiment are structures of an oxide semiconductor film capable of being used for the OS transistors described in the above embodiments.

Structure of Oxide Semiconductor

Structures of an oxide semiconductor are described below.

An oxide semiconductor is classified into a single crystal oxide semiconductor and a non-single-crystal oxide semiconductor. Examples of a non-single-crystal oxide semiconductor include a c-axis-aligned a-b-plane-anchored crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

CAAC-OS

First, a CAAC-OS is described.

A CAAC-OS is one of oxide semiconductors having a plurality of c-axis aligned crystal parts (also referred to as pellets).

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 28A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (ϕ scan) is performed with 2θ fixed at around 56° and with the sample rotated using a normal vector to the sample surface as an axis (ϕ axis), as shown in FIG. 28B, a peak is not clearly observed. In contrast, in the case where single crystal InGaZnO$_4$ is subjected to ϕ scan with 2θ fixed at around 56°, as shown in FIG. 28C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 28D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 28E shows a diffraction pattern obtained in such a manner that an electron beam with a probe diameter of 300 nm is incident on the same sample in a direction perpendicular to the sample surface. As shown in FIG. 28E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 28E is considered to be derived from the (010) plane, the (100) plane, and the like of the InGaZnO$_4$ crystal. The second ring in FIG. 28E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 29A:
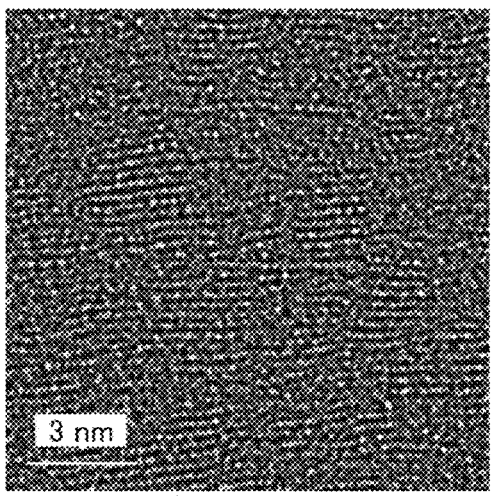
FIGS. 29A to 29E show a cross-sectional TEM image and plan-view TEM images of a CAAC-OS and images obtained through analysis thereof.

FIG. 29A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 29A shows pellets in which metal atoms are arranged in a layered manner. FIG. 29A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 29B:
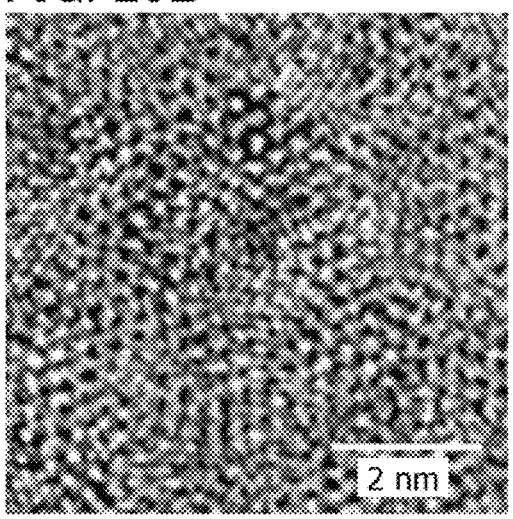
Figure 29C:
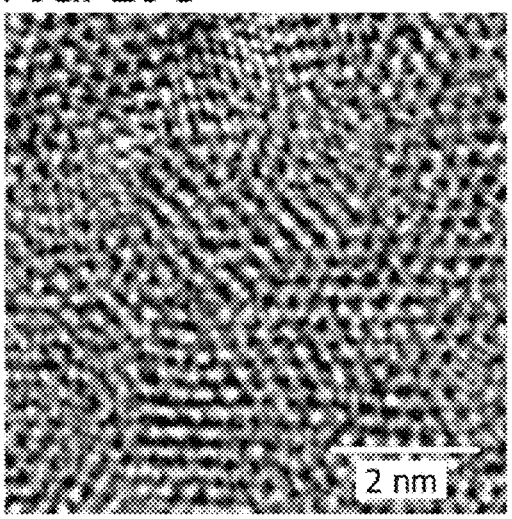
Figure 29D:
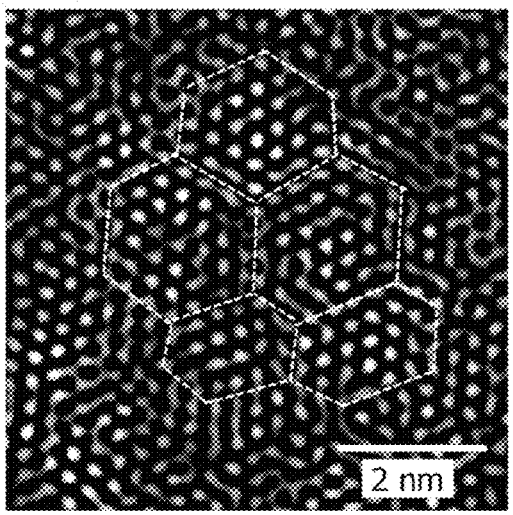
Figure 29E:
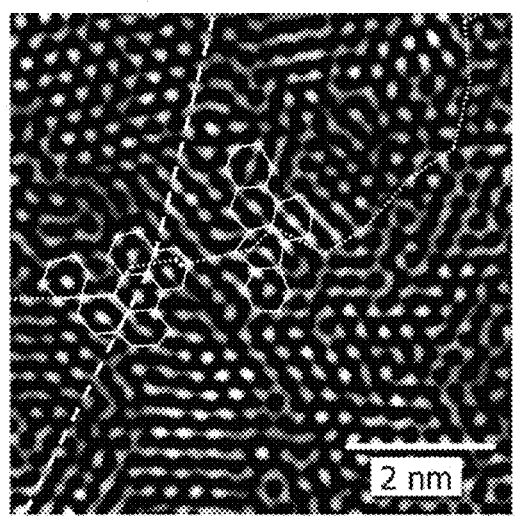

FIGS. 29B and 29C show Cs-corrected high-resolution TEM images of a plane of the CAAC-OS observed from a direction substantially perpendicular to the sample surface. FIGS. 29D and 29E are images obtained through image processing of FIGS. 29B and 29C. The method of image processing is as follows. The image in FIG. 29B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 29D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 29E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed in some cases. That is, a lattice arrangement is distorted so that formation of a crystal grain boundary is inhibited. This is probably because the CAAC-OS can tolerate distortion owing to a low density of interatomic distance in an a-b plane direction, an interatomic distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, impurities contained in the oxide semiconductor might serve as carrier traps or carrier generation sources. For example, oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{10}/cm^3$ and higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

nc-OS

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 30A:
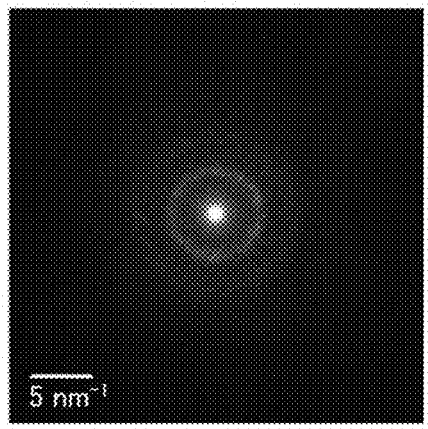
FIGS. 30A to 30D show electron diffraction patterns and a cross-sectional TEM image of an nc-OS.
Figure 30B:
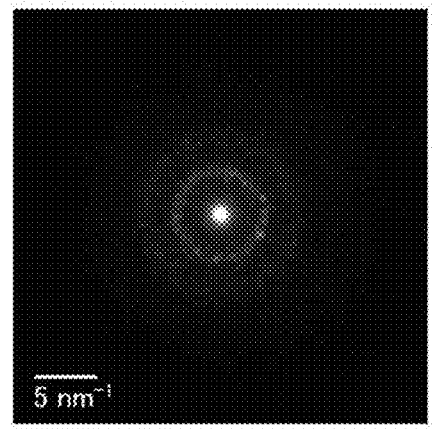

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 30A is observed. FIG. 30B shows a diffraction pattern obtained when an electron beam with a probe diameter of 1 nm is incident on the same sample. As shown in FIG. 30B, a plurality of spots are observed in a ring-like region. In other words, ordering in an nc-OS is not observed with an electron beam with a probe diameter of 50 nm but is observed with an electron beam with a probe diameter of 1 nm.

Figure 30C:
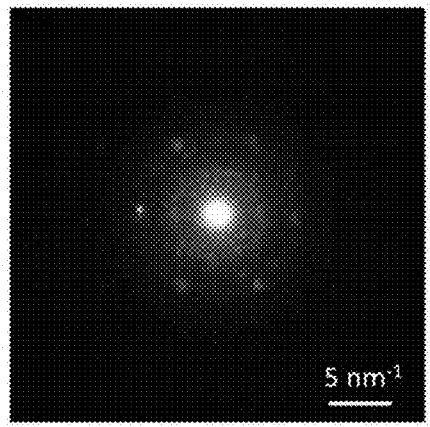

Furthermore, an electron diffraction pattern in which spots are arranged in an approximately regular hexagonal shape is observed in some cases as shown in FIG. 30C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 30D:
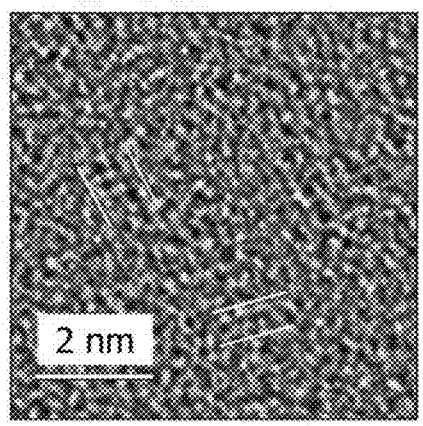

FIG. 30D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 30D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

a-like OS

An a-like OS has a structure intermediate between those of the nc-OS and the amorphous oxide semiconductor.

Figure 31A:
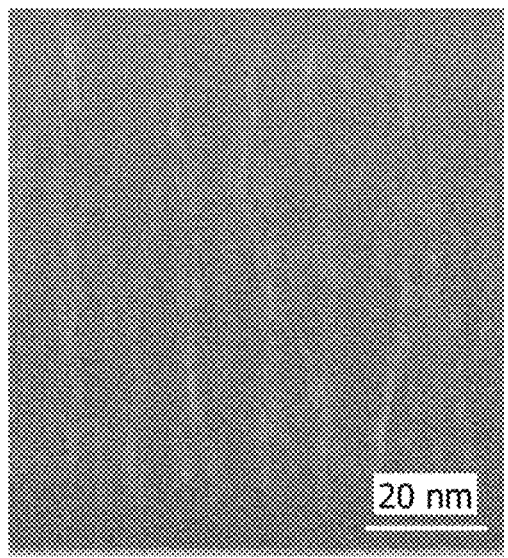
FIGS. 31A and 31B show cross-sectional TEM images of an a-like OS.
Figure 31B:
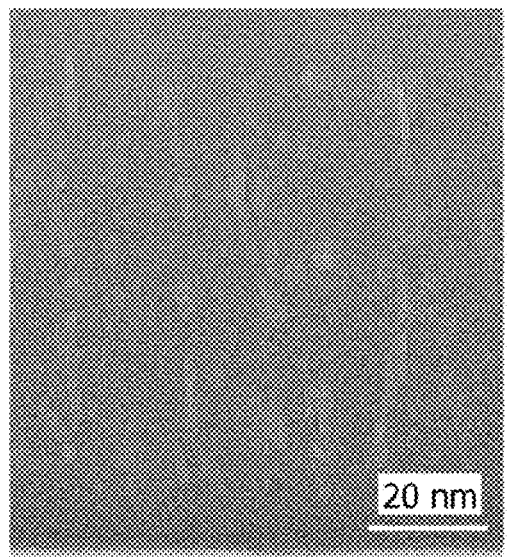

FIGS. 31A and 31B are high-resolution cross-sectional TEM images of an a-like OS. FIG. 31A is the high-resolution cross-sectional TEM image of the a-like OS at the start of the electron irradiation. FIG. 31B is the high-resolution cross-sectional TEM image of a-like OS after the electron (e) irradiation at $4.3\times10^8$ e$^-$/nm$^2$. FIGS. 31A and 31B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 32:
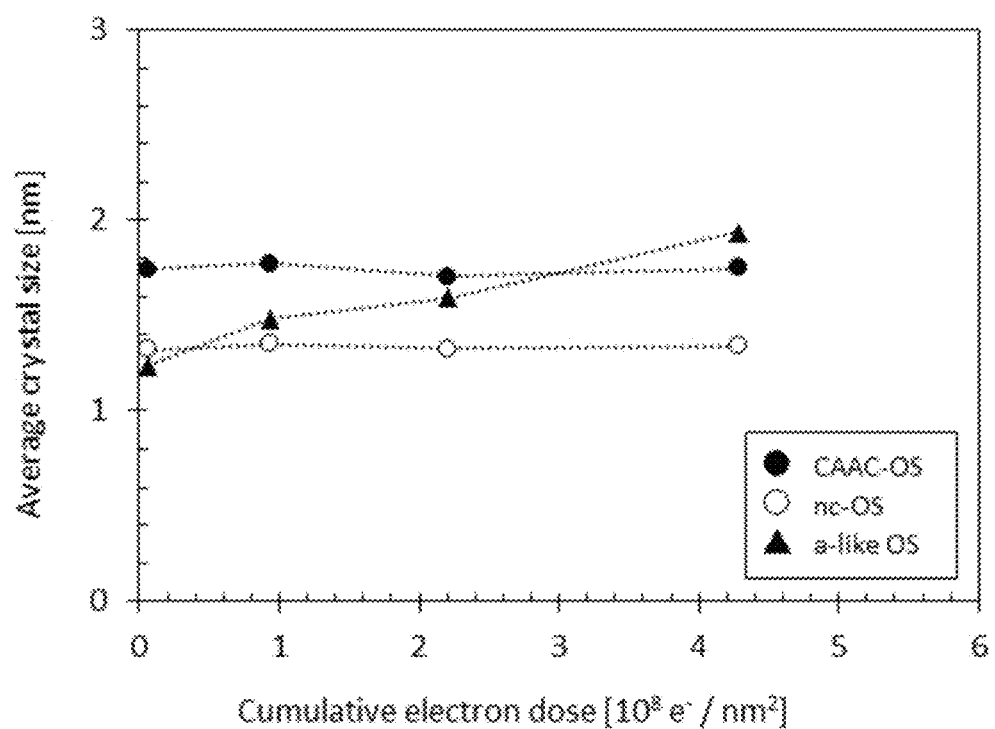
FIG. 32 shows a change in crystal part of an In—Ga—Zn oxide induced by electron irradiation.

FIG. 32 shows change in the average size of crystal parts (at 22 points to 30 points) in each sample. Note that the crystal part size corresponds to the length of a lattice fringe. FIG. 32 indicates that the crystal part size in the a-like OS increases with an increase in the cumulative electron dose in obtaining TEM images, for example. As shown in FIG. 32, a crystal part of approximately 1.2 nm (also referred to as an initial nucleus) at the start of TEM observation grows to a size of approximately 1.9 nm at a cumulative electron (e) dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e/nm$^2$. As shown in FIG. 32, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ e$^-$/(nm$^2 \cdot$s); and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

Note that this embodiment can be combined with any of the other embodiments in this specification as appropriate.

Embodiment 7

In this embodiment, examples in which the semiconductor device described in any of the above embodiments is used as a memory device in an electronic component and in an electronic device including the electronic component are described with reference to FIGS. 33A and 33B and FIGS. 34A to 34H.

Electronic Component

Figure 33A:
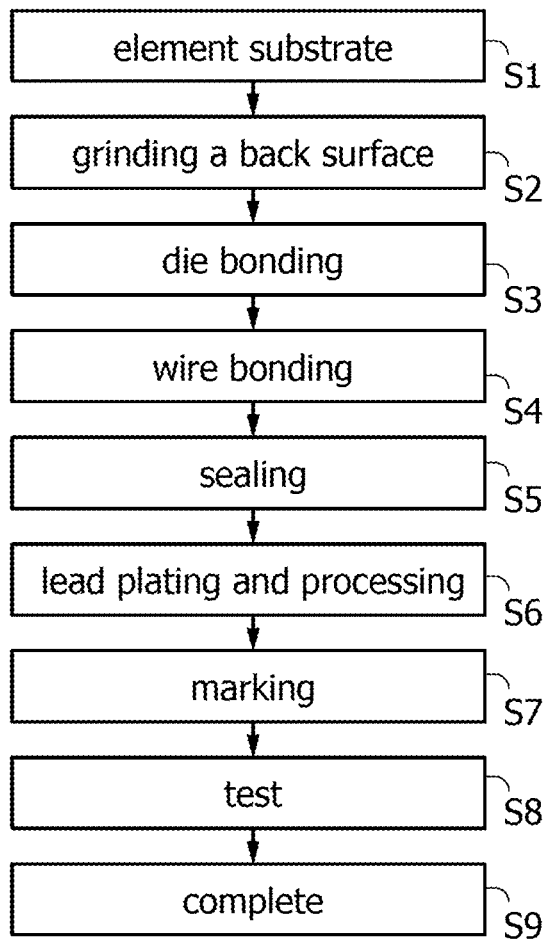
FIG. 33A is a flow chart showing a method for manufacturing an electronic component.

FIG. 33A shows an example in which the semiconductor device described in any of the above embodiments is used as a memory device in an electronic component. Note that the electronic component is also referred to as a semiconductor package or an IC package. This electronic component has various standards and names depending on the direction and the shape of terminals. Therefore, an example of the electronic component is described in this embodiment.

A semiconductor device including the transistors described in Embodiments 1 and 2 is completed through an assembly process (post-process) of integrating detachable components on a printed board.

The post-process can be completed through the steps in FIG. 33A. Specifically, after an element substrate obtained in the preceding process is completed (Step S1), a back surface of the substrate is ground (Step S2). The substrate is thinned in this step to reduce substrate warpage or the like caused in the preceding process and to reduce the size of the component.

After the back surface of the substrate is ground, a dicing step is performed to divide the substrate into a plurality of chips. Then, the divided chips are separately picked up, placed on a lead frame, and bonded thereto in a die bonding step (Step S3). In the die bonding step, the chip is bonded to the lead frame by an appropriate method depending on products, for example, bonding with a resin or a tape. Note that in the die bonding step, a chip may be placed on and bonded to an interposer.

Note that in this embodiment, when an element is formed on a surface of a substrate, the other surface is referred to as a back surface (a surface on which the element is not formed).

Next, wire bonding for electrically connecting a lead of the lead frame and an electrode on the chip through a metal wire is performed (Step S4). As the metal wire, a silver wire or a gold wire can be used. Ball bonding or wedge bonding can be used as the wire bonding.

The wire-bonded chip is subjected to a molding step of sealing the chip with an epoxy resin or the like (Step S5). Through the molding step, the inside of the electronic component is filled with a resin, whereby damage to a mounted circuit portion and wire caused by external mechanical force as well as deterioration of characteristics due to moisture or dust can be reduced.

Subsequently, the lead of the lead frame is plated. Then, the lead is cut and processed (Step S6). This plating process prevents rust of the lead and facilitates soldering at the time of mounting the chip on a printed board in a later step.

Next, printing (marking) is performed on a surface of the package (Step S7). After a final testing step (Step S8), the electronic component is completed (Step S9).

The above-described electronic component can include the semiconductor device described in any of the above embodiments. Thus, a highly reliable electronic component can be obtained.

Figure 33B:
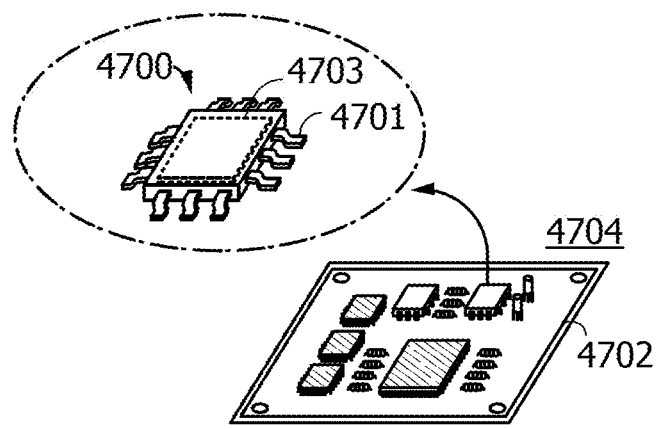
FIG. 33B is a schematic perspective view illustrating the electronic component.

FIG. 33B is a perspective schematic diagram illustrating a quad flat package (QFP) as an example of the completed electronic component. An electronic component 4700 in FIG. 33B includes a lead 4701 and a circuit unit 4703. The electronic component 4700 in FIG. 33B is mounted on a printed board 4702, for example. A plurality of electronic components 4700 which are combined and electrically connected to each other over the printed board 4702 can be mounted on an electronic device. A completed circuit board 4704 is provided in an electronic device or the like.

Electronic Device

Next, electronic devices including the aforementioned electronic component are described.

A semiconductor device of one embodiment of the present invention can be used for display devices, personal computers, or image reproducing devices provided with recording media (typically, devices that reproduce the content of recording media such as digital versatile discs (DVD) and have displays for displaying the reproduced images). Other examples of electronic devices that can include the semiconductor device of one embodiment of the present invention include cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices. FIGS. 34A to 34H illustrate specific examples of these electronic devices.

Figure 34A:
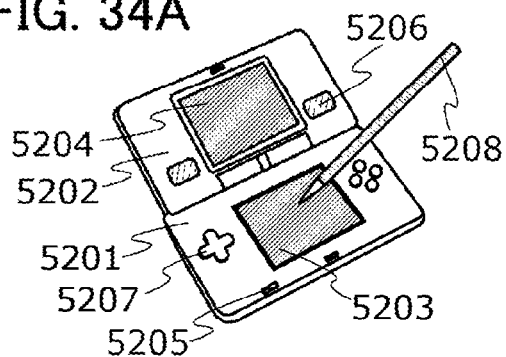
FIGS. 34A to 34H illustrate electronic devices.

FIG. 34A illustrates a portable game machine, which includes a housing 5201, a housing 5202, a display portion 5203, a display portion 5204, a microphone 5205, a speaker 5206, an operation key 5207, a stylus 5208, and the like. The semiconductor device of one embodiment of the present invention can be used for a variety of integrated circuits included in portable game machines. Although the portable game machine in FIG. 34A has the two display portions 5203 and 5204, the number of display portions included in a portable game machine is not limited to this.

Figure 34B:
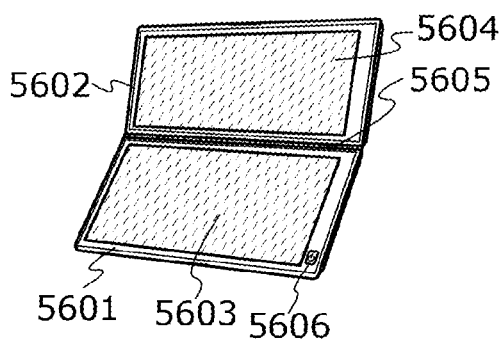

FIG. 34B illustrates a portable information terminal including a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 34C:
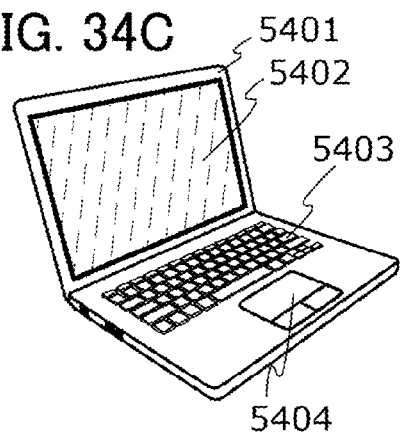

FIG. 34C illustrates a laptop including a housing 5401, a display portion 5402, a keyboard 5403, a pointing device 5404, and the like. The semiconductor device of one embodiment of the present invention can be used for a variety of integrated circuits included in notebook type personal computers.

Figure 34D:
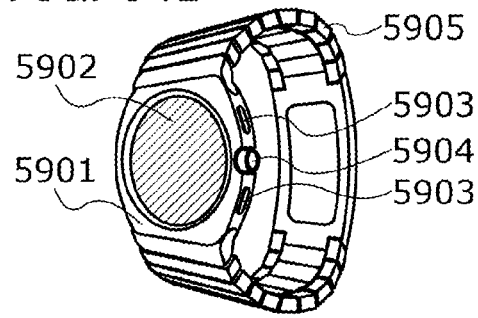

FIG. 34D is a smart watch which is one of wearable terminals. The smart watch includes a housing 5901, a display portion 5902, operation buttons 5903, an operator 5904, and a band 5905. The semiconductor device of one embodiment of the present invention can be used for a variety of integrated circuits included in the smart watch. A display device with a position input function may be used as a display portion 5902. Note that the position input function can be added by provision of a touch panel in a display device. Alternatively, the position input function can be added by providing a photoelectric conversion element called a photosensor in a pixel area of a display device. As operation buttons 5903, any one of a power switch for starting the smart watch, a button for operating an application of the smart watch, a volume control button, a switch for turning on or off the display portion 5902, and the like can be used. Although the smart watch in FIG. 34D includes two operation buttons 5903, the number of the operation buttons included in the smart watch is not limited to two. The operator 5904 functions as a crown performing time adjustment in the smart watch. The operator 5904 may be used as an input interface for operating an application of the smart watch as well as the crown for a time adjustment. Although the smart watch illustrated in FIG. 34D includes the operator 5904, one embodiment of the present invention is not limited thereto and the operator 5904 is not necessarily provided.

Figure 34E:
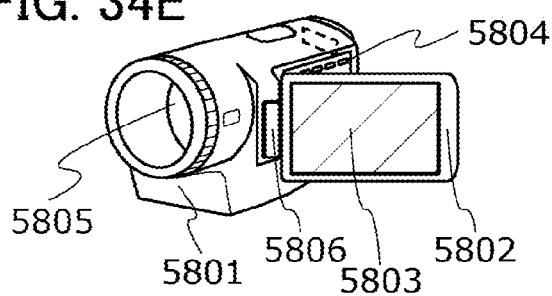

FIG. 34E illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 34F:
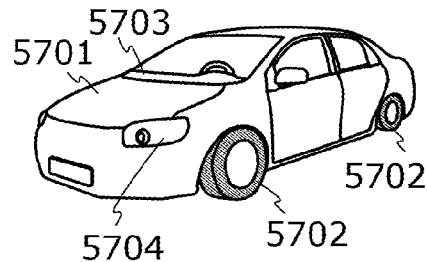

FIG. 34F illustrates a passenger car including a car body 5701, wheels 5702, a dashboard 5703, lights 5704, and the like. The semiconductor device of one embodiment of the present invention can be used for a variety of integrated circuits included in passenger cars.

Figure 34G:
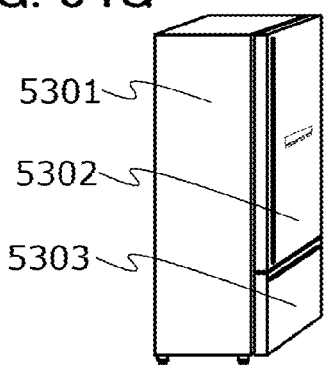

FIG. 34G illustrates an electric refrigerator-freezer including a housing 5301, a refrigerator door 5302, a freezer door 5303, and the like. The semiconductor device of one embodiment of the present invention can be used for a variety of integrated circuits included in the electric refrigerator-freezer.

Figure 34H:
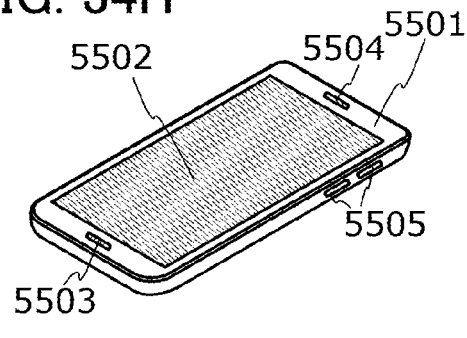
Figure 36A:
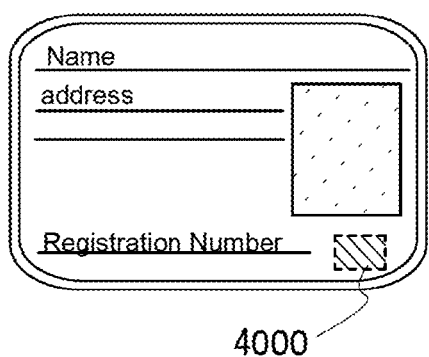
FIGS. 36A to 36F are perspective views each illustrating a usage example of an RFID tag.
Figure 36B:
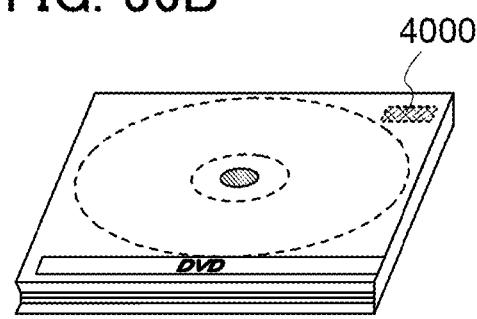
Figure 36C:
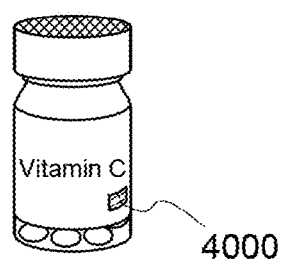
Figure 36D:
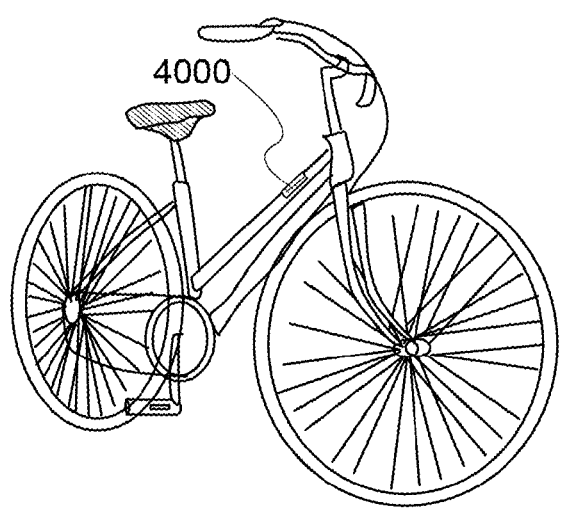
Figure 36E:
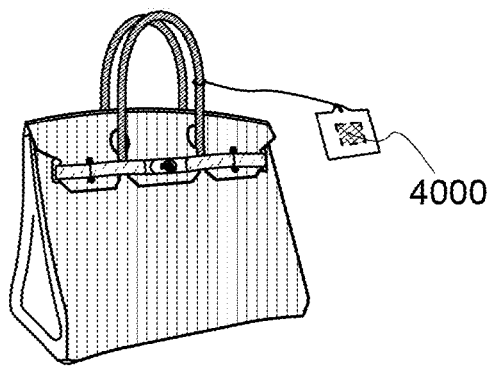
Figure 36F:
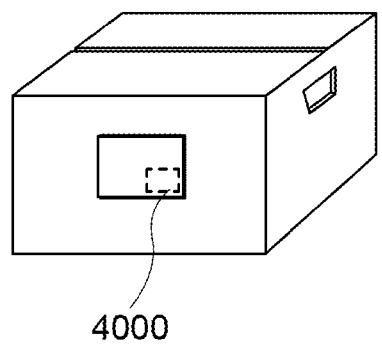

FIG. 34H is a mobile phone having a function of an information terminal. The mobile phone includes a housing 5501, a display portion 5502, a microphone 5503, a speaker 5504, and operation buttons 5505. A display device with a position input function may be used as the display portion 5502. Note that the position input function can be added by provision of a touch panel in a display device. Alternatively, the position input function can be added by providing a photoelectric conversion element called a photosensor in a pixel area of a display device. As operation buttons 5505, any one of a power switch for starting the mobile phone, a button for operating an application of the mobile phone, a volume control button, a switch for turning on or off the display portion 5502, and the like can be used. Although the mobile phone in FIG. 34H includes two operation buttons 5505, the number of the operation buttons included in the mobile phone is not limited to two. Although not illustrated, the mobile phone illustrated in FIG. 34H may be provided with a camera. Although not illustrated, the mobile phone illustrated in FIG. 34H may include a flashlight or a light-emitting device used for a lighting purpose. Although not illustrated, the mobile phone in FIG. 34H may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays) in the housing 5501. In particular, the direction of the mobile phone (the direction of the mobile phone with respect to the vertical direction) shown in FIG. 34H is determined by providing a sensing device which includes a sensor for sensing inclinations, such as a gyroscope or an acceleration sensor, and display on the screen of the display portion 5502 can be automatically changed in accordance with the direction of the mobile phone. In particular, in the case where a sensing device including a sensor obtaining biological information of fingerprints, veins, iris, voice prints, or the like is provided, a mobile phone having a function of biometric authentication can be obtained.

Next, an application example of a display device that can include the semiconductor device or memory device of one embodiment of the present invention is described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be used, for example.

For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescent (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light in accordance with a current), a plasma display panel (PDP), an electron emitter, a display element including a carbon nanotube, a liquid crystal element, electronic ink, an electrowetting element, an electrophoretic element, a display element including micro electro mechanical systems (MEMS), (e.g., a grating light valve (GLV), a digital micromirror device (DMD), a digital micro shutter (DMS)), MIRASOL (registered trademark), an interferometric modulator display (IMOD) element, a MEMS shutter display element, an optical-interference-type MEMS display element, a piezoelectric ceramic display), and quantum dots. In addition to that, the display element, the display device, the light-emitting element, or the light-emitting device may include a display medium whose contrast, luminance, reflectivity, transmittance, or the like is changed by an electrical or magnetic effect. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. Examples of display devices containing quantum dots in each pixel include a quantum dot display. Note that quantum dots may be provided not as display elements but as part of a backlight unit. The use of quantum dots enables display with high color purity. In the case of a transflective liquid crystal display or a reflective liquid crystal display, some of or all of pixel electrodes function as reflective electrodes. For example, some or all of pixel electrodes are formed to contain aluminum or silver. In such a case, a memory circuit such as an SRAM can be provided under the reflective electrodes. Thus, the power consumption can be further reduced. Note that in the case of using an LED chip, graphene or graphite may be provided under an electrode or a nitride semiconductor of the LED chip. Graphene or graphite may be a multilayer film in which a plurality of layers are stacked. As described above, the provision of graphene or graphite enables easy formation of a nitride semiconductor thereover, such as an n-type GaN semiconductor layer including crystals. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In a display element including microelectromechanical systems (MEMS), a dry agent may be provided in a space where a display element is sealed (e.g., between an element substrate over which the display element is placed and a counter substrate opposed to the element substrate). Providing a dry agent can prevent MEMS and the like from becoming difficult to move or deteriorating easily because of moisture or the like.

Note that this embodiment can be combined with any of the other embodiments in this specification as appropriate.

Embodiment 8

The memory device of one embodiment of the present invention can be used for removable memory devices such as memory cards (e.g., SD cards), universal serial bus (USB) memories, and solid state drives (SSD). In this embodiment, some structure examples of the removable storage device are described with reference to FIGS. 35A to 35E.

FIG. 35A is a schematic diagram of a USB memory. A USB memory 5100 includes a housing 5101, a cap 5102, a USB connector 5103, and a substrate 5104. The substrate 5104 is held in the housing 5101. The substrate 5104 is provided with a memory device and a circuit for driving the memory device. For example, the substrate 5104 is provided with a memory chip 5105 and a controller chip 5106. The memory cell array 2610, the row decoder 2621, the word line driver circuit 2622, the bit line driver circuit 2630, the column decoder 2631, the precharge circuit 2632, the sense amplifier 2633, the output circuit 2640, and the like which are described in the above embodiment are incorporated in the memory chip 5105. A processor, a work memory, an ECC circuit, and the like are incorporated in the controller chip 5106. Note that the circuit configurations of the memory chip 5105 and the controller chip 5106 are not limited to those described above, and can be changed depending on circumstances or conditions. For example, the row decoder 2621, the word line driver circuit 2622, the bit line driver circuit 2630, the column decoder 2631, the precharge circuit 2632, and the sense amplifier 2633 may be incorporated in the controller chip 5106, not in the memory chip 5105. The USB connector 5103 functions as an interface for connection to an external device.

FIG. 35B is a schematic external diagram of an SD card, and FIG. 35C is a schematic diagram illustrating the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, the substrate 5113 is provided with a memory chip 5114 and a controller chip 5115. The memory cell array 2610, the row decoder 2621, the word line driver circuit 2622, the bit line driver circuit 2630, the column decoder 2631, the precharge circuit 2632, the sense amplifier 2633, the output circuit 2640, and the like which are described in the above embodiment are incorporated in the memory chip 5114. A processor, a work memory, an ECC circuit, and the like are incorporated in the controller chip 5115. Note that the circuit configurations of the memory chip 5114 and the controller chip 5115 are not limited to those described above, and can be changed depending on circumstances or conditions. For example, the row decoder 2621, the word line driver circuit 2622, the bit line driver circuit 2630, the column decoder 2631, the precharge circuit 2632, and the sense amplifier 2633 may be incorporated in the controller chip 5115, not in the memory chip 5114.

When the memory chip 5114 is also provided on a back side of the substrate 5113, the capacity of the SD card 5110 can be increased. In addition, a wireless chip with a radio communication function may be provided on the substrate 5113. This structure enables wireless communication between an external device and the SD card 5110, making it possible to write/read data to/from the memory chip 5114.

FIG. 35D is a schematic external diagram of an SSD, and FIG. 35E is a schematic diagram illustrating the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the substrate 5153 is provided with a memory chip 5154, a memory chip 5155, and a controller chip 5156. The memory cell array 2610, the row decoder 2621, the word line driver circuit 2622, the bit line driver circuit 2630, the column decoder 2631, the precharge circuit 2632, the sense amplifier 2633, the output circuit 2640, and the like which are described in the above embodiment are incorporated in the memory chip 5154. When the memory chip 5154 is also provided on a back side of the substrate 5153, the capacity of the SSD 5150 can be increased. A work memory is incorporated in the memory chip 5155. For example, a DRAM chip may be used as the memory chip 5155. A processor, an ECC circuit, and the like are incorporated in the controller chip 5156. Note that the circuit configurations of the memory chip 5154, the memory chip 5155, and the controller chip 5115 are not limited to those described above, and can be changed depending on circumstances or conditions. For example, a memory functioning as a work memory may also be provided in the controller chip 5156.

Note that this embodiment can be combined with any of the other embodiments in this specification as appropriate.

Embodiment 9

In this embodiment, application examples of an RF tag that can include the memory device of one embodiment of the present invention will be described with reference to FIGS. 36A to 36F. The RF tag is widely used and can be provided for, for example, products such as bills, coins, securities, bearer bonds, documents (e.g., driver's licenses or resident's cards, see FIG. 36A), recording media (e.g., DVD or video tapes, see FIG. 36B), packaging containers (e.g., wrapping paper or bottles, see FIG. 36C), vehicles (e.g., bicycles, see FIG. 36D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 36E and 36F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Note that this embodiment can be combined with any of the other embodiments in this specification as appropriate.
(Notes on the Description in this Specification and the Like)

The following are notes on the description of the structures in the above embodiments.

Notes on One Embodiment of the Present Invention Described in Embodiments

One embodiment of the present invention can be constituted by appropriately combining the structure described in an embodiment with any of the structures described in the other embodiments. In addition, in the case where a plurality of structure examples are described in one embodiment, any of the structure examples can be combined as appropriate.

Note that what is described (or part thereof) in an embodiment can be applied to, combined with, or replaced with another content (or part thereof) in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Notes on Ordinal Numbers

In this specification and the like, ordinal numbers such as "first", "second", and "third" are used in order to avoid confusion among components. Thus, the terms do not limit the number or order of components. In the present specification and the like, a "first" component in one embodiment can be referred to as a "second" component in other embodiments or claims. Alternatively, in the present specification and the like, a "first" component in one embodiment can be omitted in other embodiments or claims.

Notes on the Description for Drawings

Embodiments are described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the description of the embodiments. Note that in the structures of the invention in Embodiments, the same portions or portions having similar functions are denoted by the same reference numerals in different drawings, and the description of such portions is not repeated.

In this specification and the like, the terms for explaining arrangement, such as "over" and "under", are used for convenience to describe the positional relation between components with reference to drawings. The positional relation between components is changed as appropriate in accordance with a direction in which each component is described. Therefore, the terms for explaining arrangement are not limited to those used in this specification and may be changed to other terms as appropriate depending on the situation.

The term "over" or "under" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is associated with a plurality of functions or a case in which a plurality of circuits are associated with one function. Therefore, the segmentation of blocks in a block diagram is not limited by any of the components described in the specification and can be differently determined as appropriate depending on situations.

In the drawings, the size, the layer thickness, or the region is exaggerated for description convenience in some cases; therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

In drawings such as a top view (also referred to as a plan view or a layout view) and a perspective view, some of components might not be illustrated for clarity of the drawings.

In the drawings, the same components, components having similar functions, components formed of the same material, or components formed at the same time are denoted by the same reference numerals in some cases, and the description thereof is not repeated in some cases.

Notes on Expressions that can be Rephrased

In this specification and the like, the expressions "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of "electrodes" or "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases, or can be replaced with a word not including the term "film" or "layer" depending on the case or circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring", "signal line", and "power source line" can be interchanged with each other depending on the case or circumstances. For example, the term "wiring" can be changed into the term such as "signal line" or "power source line" in some cases. The term such as "signal line" or "power source line" can be changed into the term "wiring" in some cases. The term such as "power source line" can be changed into the term such as "signal line" in some cases. The term such as "signal line" can be changed into the term such as "power source line" in some cases.

Notes on Definitions of Terms

The following are definitions of the terms mentioned in the above embodiments.

<<Semiconductor>>

In this specification, a "semiconductor" includes characteristics of an "insulator" in some cases when the conductivity is sufficiently low, for example. Furthermore, it is difficult to strictly distinguish a "semiconductor" and an "insulator" from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that a "semiconductor" includes characteristics of a "conductor" in some cases when the conductivity is sufficiently high, for example. Furthermore, it is difficult to strictly distinguish a "semiconductor" and a "conductor" from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components; specific examples are hydrogen (also included in water), lithium, sodium, silicon, boron, phosphorus, carbon, and nitrogen. In the case of an oxide semiconductor, oxygen vacancy may be formed by entry of impurities such as hydrogen. Further, in the case where the semiconductor is a silicon layer, examples of an impurity which changes the characteristics of the semiconductor include oxygen, Group 1 elements except hydrogen, Group 2 elements, Group 13 elements, and Group 15 elements.

<<Transistor>>

In this specification, a transistor is an element having at least three terminals of a gate, a drain, and a source. The transistor has a channel formation region between a drain (a drain terminal, a drain region, or a drain electrode) and a source (a source terminal, a source region, or a source electrode), and current can flow through the drain, the channel formation region, and the source. Note that in this specification and the like, a channel formation region refers to a region through which current mainly flows.

Furthermore, the functions of a source and a drain might be switched when transistors having different polarities are employed or a direction of current flow is changed in circuit operation, for example. Therefore, the terms "source" and "drain" can be switched in this specification and the like.

<<Switch>>

In this specification and the like, a switch is in a conductive state (on state) or in a non-conductive state (off state) to determine whether current flows therethrough or not. Alternatively, a switch has a function of selecting and changing a current path.

Examples of the switch include an electrical switch and a mechanical switch. That is, the switch is not limited to a certain element and any element can be used as long as it can control current.

Examples of the electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically disconnected. In the case where a transistor operates just as a switch, the polarity (conductivity type) of the transistor is not particularly limited to a certain type.

An example of the mechanical switch is a switch formed using a microelectromechanical systems (MEMS) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, the distance between a source (source region or source electrode) and a drain (drain region or drain electrode) in a region where a semiconductor (or a portion where current flows in a semiconductor when a transistor is on) and a gate electrode overlap with each other or a region where a channel is formed in a top view of the transistor.

Note that in one transistor, channel lengths in all regions do not necessarily have the same value. In other words, the channel length of one transistor is not fixed to one value in some cases. Therefore, in this specification, the channel length is any one of values, the maximum value, the minimum value, or the average value, in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

Note that in one transistor, channel widths in all regions do not necessarily have the same value. In other words, the channel width of one transistor is not fixed to one value in some cases. Therefore, in this specification, the channel width is any one of values, the maximum value, the minimum value, or the average value, in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

In a transistor having a three-dimensional structure, an effective channel width is difficult to measure in some cases. For example, estimation of the effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is the length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where the field-effect mobility, a current value per channel width, and the like of a transistor are obtained by calculation, a surrounded channel width may be used for the calculation. In that case, a value different from the one obtained by calculation using an effective channel width is obtained in some cases.

<<Connection>>

In this specification and the like, when it is described that X and Y are connected, the case where X and Y are electrically connected, the case where X and Y are functionally connected, and the case where X and Y are directly connected are included therein. Accordingly, without being limited to a predetermined connection relation, for example, a connection relation other than that shown in a drawing or text is possible.

Here, X, Y, and the like each denote an object (e.g., a device, an element, a circuit, a wiring, an electrode, a terminal, a conductive film, or a layer).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, even when another circuit is interposed between X and Y, X and Y are functionally connected if a signal output from X is transmitted to Y.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that X and Y are electrically connected, the description is the same as the case where it is explicitly only described that X and Y are connected.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

<<Trigonal and Rhombohedral>>

In this specification, trigonal and rhombohedral crystal systems are included in a hexagonal crystal system.

This application is based on Japanese Patent Application serial no. 2015-216214 filed with Japan Patent Office on Nov. 3, 2015, the entire contents of which are hereby incorporated by reference.

What is claimed is:

1. A driving method of a semiconductor device, the semiconductor device comprising:
    a first transistor;
    a second transistor;
    a capacitor; and
    a control circuit,
    wherein a first terminal of the first transistor is electrically connected to a first terminal of the capacitor,
    wherein a gate of the second transistor is electrically connected to the first terminal of the capacitor,
    wherein the control circuit is electrically connected to a second terminal of the capacitor,
    wherein first data of m bits is retained in the gate of the second transistor,
    wherein m is an integer of 1 or more,
    wherein the first data has a value of i,
    wherein i is an integer of 0 to $2^m-2$, and
    wherein j is an integer of 1 to $2^m-1-i$,
    the driving method comprising the steps of:
        supplying a first potential from the control circuit to the second terminal of the capacitor in order to add a value of j that corresponds to the first potential to the value of the first data, so that data retained in the gate of the second transistor is changed from the first data to second data; and
        supplying a second potential to a first terminal of the second transistor in order to output a third potential in accordance with a potential of the gate of the second transistor from the second terminal of the second transistor after supplying the first potential, so that the second data is outputted,
    wherein, when the second potential is supplied, the second data is retained in the potential of the gate of the second transistor.

2. The driving method according to claim 1, wherein the third potential is equal to the potential of the gate of the second transistor in supplying the second potential.

3. The semiconductor device configured to use the driving method according to claim 1,
    wherein a channel formation region of the first transistor comprises an oxide semiconductor, and
    wherein a channel formation region of the second transistor comprises silicon.

4. The semiconductor device configured to use the driving method according to claim 1,
    wherein a channel formation region of the first transistor comprises an oxide semiconductor, and
    wherein a channel formation region of the second transistor comprises an oxide semiconductor.

5. A memory device comprising:
    the semiconductor device according to claim 4; and
    a driver circuit.

6. An electronic device comprising:
    the memory device according to claim 5; and
    a housing.

7. A driving method of a semiconductor device, the semiconductor device comprising:
    a first transistor;
    a second transistor;
    a capacitor; and
    a control circuit,
    wherein a first terminal of the first transistor is electrically connected to a first terminal of the capacitor,
    wherein a gate of the second transistor is electrically connected to the first terminal of the capacitor,
    wherein the control circuit is electrically connected to a second terminal of the capacitor,
    wherein first data of m bits is retained in the gate of the second transistor,
    wherein m is an integer of 1 or more,
    wherein the first data has a value of i,
    wherein i is an integer of 0 to $2^m-1$, and
    wherein j is an integer of 1 to i,
    the driving method comprising the steps of:
        supplying a first potential from the control circuit to the second terminal of the capacitor in order to subtract a value of j that corresponds to the first potential from the value of the first data, so that data retained in the gate of the second transistor is changed from the first data to second data; and
        supplying a second potential to a first terminal of the second transistor in order to output a third potential in accordance with a potential of the gate of the second transistor from the second terminal of the second transistor after supplying the first potential, so that the second data is outputted,
    wherein, when the second potential is supplied, the second data is retained in the potential of the gate of the second transistor.

8. The driving method according to claim 7, wherein the third potential is equal to the potential of the gate of the second transistor in supplying the second potential.

9. The semiconductor device configured to use the driving method according to claim 7,
wherein a channel formation region of the first transistor comprises an oxide semiconductor, and
wherein a channel formation region of the second transistor comprises silicon.

10. The semiconductor device configured to use the driving method according to claim 7,
wherein a channel formation region of the first transistor comprises an oxide semiconductor, and
wherein a channel formation region of the second transistor comprises an oxide semiconductor.

11. A memory device comprising:
the semiconductor device according to claim 10; and
a driver circuit.

12. An electronic device comprising:
the memory device according to claim 11; and
a housing.

13. A driving method of a semiconductor device,
the semiconductor device comprising:
a first transistor;
a second transistor; and
a capacitor;
wherein one of a source or a drain of the first transistor is electrically connected to a first terminal of the capacitor,
wherein a gate of the second transistor is electrically connected to the first terminal of the capacitor,
the driving method comprising the steps of:
in writing, supplying a first potential to a gate of the first transistor while supplying a second potential to a second terminal of the capacitor and supplying a third potential to one of a source or a drain of the second transistor; and
in reading, supplying a fourth potential to the one of the source and the drain of the second transistor while supplying a fifth potential to the second terminal of the capacitor and supplying a sixth potential to the gate of the first transistor,
wherein the first potential is higher than the sixth potential, and
wherein the fourth potential is higher than the third potential.

14. The driving method according to claim 13, wherein the gate of the second transistor is directly connected to the first terminal of the capacitor.

15. The driving method according to claim 13, wherein the first transistor comprises an oxide semiconductor.

16. The driving method according to claim 13, wherein the other one of the source and the drain of the first transistor is electrically connected to the other one of the source and the drain of the second transistor.

17. The driving method according to claim 13, wherein a capacitive coupling coefficient in the semiconductor device is 1.

18. The driving method according to claim 13,
wherein the semiconductor device further comprises a control circuit, and
wherein the control circuit is configured to supply the second potential and the fifth potential to the second terminal of the capacitor.

19. The driving method according to claim 13, wherein the fifth potential is higher than the second potential.

20. The driving method according to claim 13, wherein the second transistor is off after the writing.

21. The driving method according to claim 13, wherein the second potential is a reference potential.

22. The driving method according to claim 13, wherein the second potential is 0 V.

* * * * *